United States Patent
Perng et al.

(10) Patent No.: US 11,923,251 B2
(45) Date of Patent: *Mar. 5, 2024

(54) METHODS OF CUTTING METAL GATES AND STRUCTURES FORMED THEREOF

(71) Applicant: Taiwan Semiconductor Manufacturing Co., Ltd., Hsinchu (TW)

(72) Inventors: Tsu-Hsiu Perng, Zhubei (TW); Kai-Chieh Yang, Kaohsiung (TW); Zhi-Chang Lin, Zhubei (TW); Teng-Chun Tsai, Hsinchu (TW); Wei-Hao Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 125 days.

This patent is subject to a terminal disclaimer.

(21) Appl. No.: 17/314,804

(22) Filed: May 7, 2021

(65) Prior Publication Data

US 2021/0280473 A1 Sep. 9, 2021

Related U.S. Application Data

(60) Continuation of application No. 17/113,431, filed on Dec. 7, 2020, which is a continuation of application
(Continued)

(51) Int. Cl.
*H01L 21/8238* (2006.01)
*C23C 16/04* (2006.01)
(Continued)

(52) U.S. Cl.
CPC .... *H01L 21/823842* (2013.01); *C23C 16/042* (2013.01); *H01L 21/28079* (2013.01);
(Continued)

(58) Field of Classification Search
CPC .......... H01L 29/66545; H01L 29/6653; H01L 29/66553; H01L 29/6656; H01L 21/76829; H01L 21/823468; H01L 21/823864
See application file for complete search history.

(56) References Cited

U.S. PATENT DOCUMENTS 9,064,932 B1 6/2015 Pham et al.
9,412,616 B1 8/2016 Xie et al.
(Continued)

FOREIGN PATENT DOCUMENTS

KR 20160056693 A 5/2016
KR 20160086737 A 7/2016

*Primary Examiner* — Victoria K. Hall
(74) *Attorney, Agent, or Firm* — Slater Matsil, LLP

(57) ABSTRACT

A method includes forming a gate stack, which includes a gate dielectric and a metal gate electrode over the gate dielectric. An inter-layer dielectric is formed on opposite sides of the gate stack. The gate stack and the inter-layer dielectric are planarized. The method further includes forming an inhibitor film on the gate stack, with at least a portion of the inter-layer dielectric exposed, selectively depositing a dielectric hard mask on the inter-layer dielectric, with the inhibitor film preventing the dielectric hard mask from being formed thereon, and etching to remove a portion of the gate stack, with the dielectric hard mask acting as a portion of a corresponding etching mask.

20 Claims, 55 Drawing Sheets

Related U.S. Application Data

No. 16/590,950, filed on Oct. 2, 2019, now Pat. No. 10,861,752, which is a continuation of application No. 16/205,822, filed on Nov. 30, 2018, now Pat. No. 11,152,267, which is a division of application No. 15/859,893, filed on Jan. 2, 2018, now Pat. No. 10,490,458.

(60) Provisional application No. 62/565,660, filed on Sep. 29, 2017.

(51) Int. Cl.
   H01L 21/28 (2006.01)
   H01L 21/768 (2006.01)
   H01L 29/49 (2006.01)
   H01L 29/51 (2006.01)
   H01L 29/66 (2006.01)
   H01L 29/78 (2006.01)

(52) U.S. Cl.
   CPC .. H01L 21/28176 (2013.01); H01L 21/28202 (2013.01); H01L 21/76829 (2013.01); H01L 21/823821 (2013.01); H01L 29/4941 (2013.01); H01L 29/4958 (2013.01); H01L 29/517 (2013.01); H01L 29/66545 (2013.01); H01L 29/6656 (2013.01); H01L 29/785 (2013.01)

(56) References Cited

U.S. PATENT DOCUMENTS

| | | |
|---|---|---|
| 9,520,482 B1 | 12/2016 | Chang et al. |
| 9,536,980 B1 | 1/2017 | Huang et al. |
| 9,553,088 B1 | 1/2017 | Basker et al. |
| 9,564,369 B1 | 2/2017 | Kim et al. |
| 9,653,583 B1 | 5/2017 | Zhao et al. |
| 9,859,389 B1 | 1/2018 | Cheng et al. |
| 9,929,242 B2 | 3/2018 | Chang et al. |
| 10,014,304 B2 | 7/2018 | Park et al. |
| 10,062,784 B1 | 8/2018 | Lee et al. |
| 10,186,457 B2 | 1/2019 | Myung et al. |
| 10,269,933 B2* | 4/2019 | Ching ............... H01L 29/785 |
| 10,431,673 B2 | 10/2019 | Kim |
| 10,490,458 B2* | 11/2019 | Perng ............... H01L 29/785 |
| 10,497,608 B2 | 12/2019 | Shin et al. |
| 10,685,889 B2* | 6/2020 | Zhou ............... H01L 21/823842 |
| 10,861,752 B2* | 12/2020 | Perng ............... C23C 16/042 |
| 11,152,267 B2* | 10/2021 | Perng ............... H01L 21/823821 |
| 11,545,400 B2* | 1/2023 | Perng ............... C23C 16/042 |
| 2012/0119307 A1 | 5/2012 | Li et al. |
| 2012/0126295 A1 | 5/2012 | Edge et al. |
| 2012/0264281 A1 | 10/2012 | Chen et al. |
| 2013/0078783 A1 | 3/2013 | Nieh et al. |
| 2013/0234254 A1 | 9/2013 | Ng et al. |
| 2013/0307079 A1 | 11/2013 | Jagannathan et al. |
| 2015/0024518 A1 | 1/2015 | Chang et al. |
| 2015/0079790 A1 | 3/2015 | Nishimura et al. |
| 2015/0108589 A1 | 4/2015 | Cheng et al. |
| 2015/0171177 A1* | 6/2015 | Cheng ............... H01L 29/66545 257/288 |
| 2015/0187946 A1* | 7/2015 | Park ............... H01L 21/28114 257/288 |
| 2015/0214341 A1 | 7/2015 | Shin et al. |
| 2015/0348965 A1 | 12/2015 | Chang et al. |
| 2016/0111336 A1* | 4/2016 | Chang ............... H01L 27/0886 438/430 |
| 2016/0111543 A1* | 4/2016 | Fang ............... H01L 29/6656 257/401 |
| 2016/0133632 A1* | 5/2016 | Park ............... H01L 29/66545 257/369 |
| 2016/0133721 A1* | 5/2016 | Cai ............... H01L 21/32053 257/506 |
| 2016/0163694 A1 | 6/2016 | Baek et al. |
| 2016/0204215 A1* | 7/2016 | Chang ............... H01L 29/42376 438/283 |
| 2016/0240650 A1 | 8/2016 | Chang et al. |
| 2016/0351568 A1* | 12/2016 | Chang ............... H01L 29/267 |
| 2016/0365426 A1 | 12/2016 | Ching et al. |
| 2017/0103916 A1* | 4/2017 | Jeon ............... H01L 29/1608 |
| 2017/0117223 A1* | 4/2017 | Azmat ............... H01L 29/0653 |
| 2017/0125305 A1* | 5/2017 | Zhou ............... H01L 21/823821 |
| 2017/0141210 A1 | 5/2017 | Yang |
| 2017/0141211 A1 | 5/2017 | Xie et al. |
| 2017/0148682 A1 | 5/2017 | Basker et al. |
| 2017/0162394 A1 | 6/2017 | Li et al. |
| 2017/0200802 A1 | 7/2017 | Myung et al. |
| 2017/0213771 A1 | 7/2017 | Kim et al. |
| 2017/0309493 A1 | 10/2017 | Ogihara et al. |
| 2018/0069000 A1 | 3/2018 | Bergendahl et al. |
| 2018/0102364 A1* | 4/2018 | Rastogi ............... H01L 29/4966 |
| 2018/0182859 A1 | 6/2018 | Lee et al. |
| 2018/0197970 A1* | 7/2018 | Pan ............... H01L 29/7851 |
| 2018/0218991 A1 | 8/2018 | Farooq et al. |
| 2018/0315652 A1 | 11/2018 | Tsai et al. |
| 2018/0315853 A1 | 11/2018 | Yu et al. |
| 2018/0323255 A1 | 11/2018 | Cheng et al. |
| 2018/0342420 A1 | 11/2018 | You et al. |
| 2018/0350800 A1 | 12/2018 | Chang et al. |
| 2018/0350947 A1 | 12/2018 | Liao et al. |
| 2019/0013314 A1 | 1/2019 | Choi et al. |
| 2019/0051730 A1 | 2/2019 | Min |
| 2019/0131430 A1 | 5/2019 | Xie et al. |
| 2019/0139831 A1 | 5/2019 | Zhu |
| 2019/0164751 A1 | 5/2019 | Chi et al. |
| 2019/0164752 A1 | 5/2019 | Chi et al. |
| 2019/0304976 A1 | 10/2019 | Zhu et al. |
| 2019/0318961 A1 | 10/2019 | Min et al. |
| 2019/0326311 A1 | 10/2019 | Chakihara |
| 2020/0012643 A1 | 1/2020 | Cuddihy |
| 2020/0135901 A1 | 1/2020 | Page et al. |
| 2020/0043796 A1 | 2/2020 | Yeong et al. |
| 2020/0044070 A1 | 2/2020 | Wang et al. |
| 2020/0127117 A1 | 4/2020 | Yu et al. |
| 2020/0135858 A1 | 4/2020 | Chiu et al. |
| 2020/0135912 A1 | 4/2020 | Tsai et al. |

* cited by examiner

METHODS OF CUTTING METAL GATES AND STRUCTURES FORMED THEREOF

PRIORITY CLAIM AND CROSS-REFERENCE

This application is a continuation of U.S. patent application Ser. No. 17/113,431, entitled "Methods of Cutting Metal Gates and Structures Formed Thereof," filed on Dec. 7, 2020, now U.S. Pat. No. 11,545,400 issued Jan. 3, 2023, which is a continuation of U.S. patent application Ser. No. 16/590,950, entitled "Methods of Cutting Metal Gates and Structures Formed Thereof," filed Oct. 2, 2019, now U.S. Pat. No. 10,861,752 issued Dec. 8, 2020, which application is a continuation of U.S. patent application Ser. No. 16/205,822, entitled "Methods of Cutting Metal Gates and Structures Formed Thereof," filed Nov. 30, 2018, which is a divisional of U.S. patent application Ser. No. 15/859,893, entitled "Methods of Cutting Metal Gates and Structures Formed Thereof," filed Jan. 2, 2018, now U.S. Pat. No. 10,490,458, issued Nov. 26, 2019, which application claims the benefit of the following U.S. Provisional Application No. 62/565,660, filed on Sep. 29, 2017, and entitled "Methods of Cutting Metal Gates and Structures Formed Thereof," which applications are hereby incorporated herein by reference.

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

In the formation of the metal gate electrodes, a long dummy gate is formed first, which is then etched, so that the portions of the long dummy gate are separated from each other. A dielectric material is then filled into the opening left by the etched portion of the long dummy gate. The dielectric material is then polished, leaving a portion of the dielectric material between the remaining portions of the dummy gate. The separated portions of the dummy gate are then replaced with metal gates. This process may be referred to as cut-poly process since the dummy gate may be formed of polysilicon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through FIGS. 18A and 18B illustrate the cross-sectional views and perspective views of intermediate stages in the formation of Fin Field-Effect Transistors (FinFETs) in accordance with some embodiments.

FIGS. 19 through FIGS. 27A and 27B illustrate the cross-sectional views and perspective views of intermediate stages in the formation of FinFETs in accordance with some embodiments.

FIGS. 36 through FIGS. 43A and 43B illustrate the cross-sectional views and perspective views of intermediate stages in the formation of FinFETs in accordance with some embodiments.

DETAILED DESCRIPTION

Figure 1:
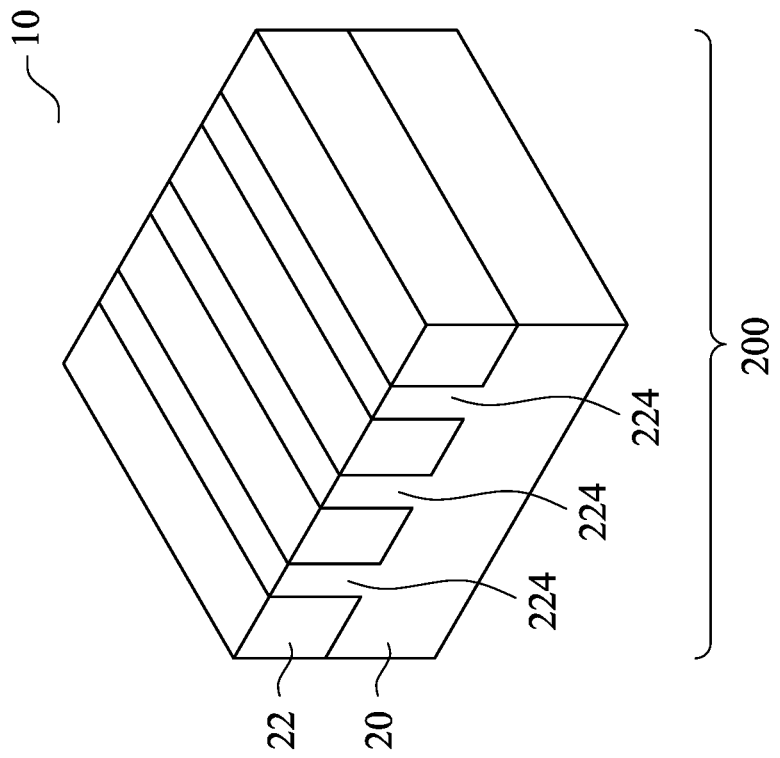
Figure 1:
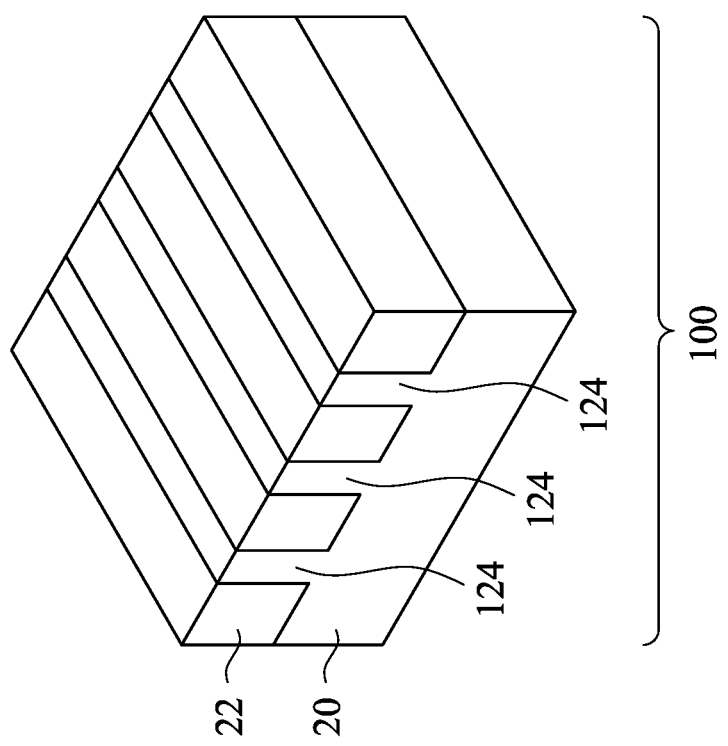

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Planar transistors may also be formed adopting the embodiments of the present disclosure.

Figure 45:
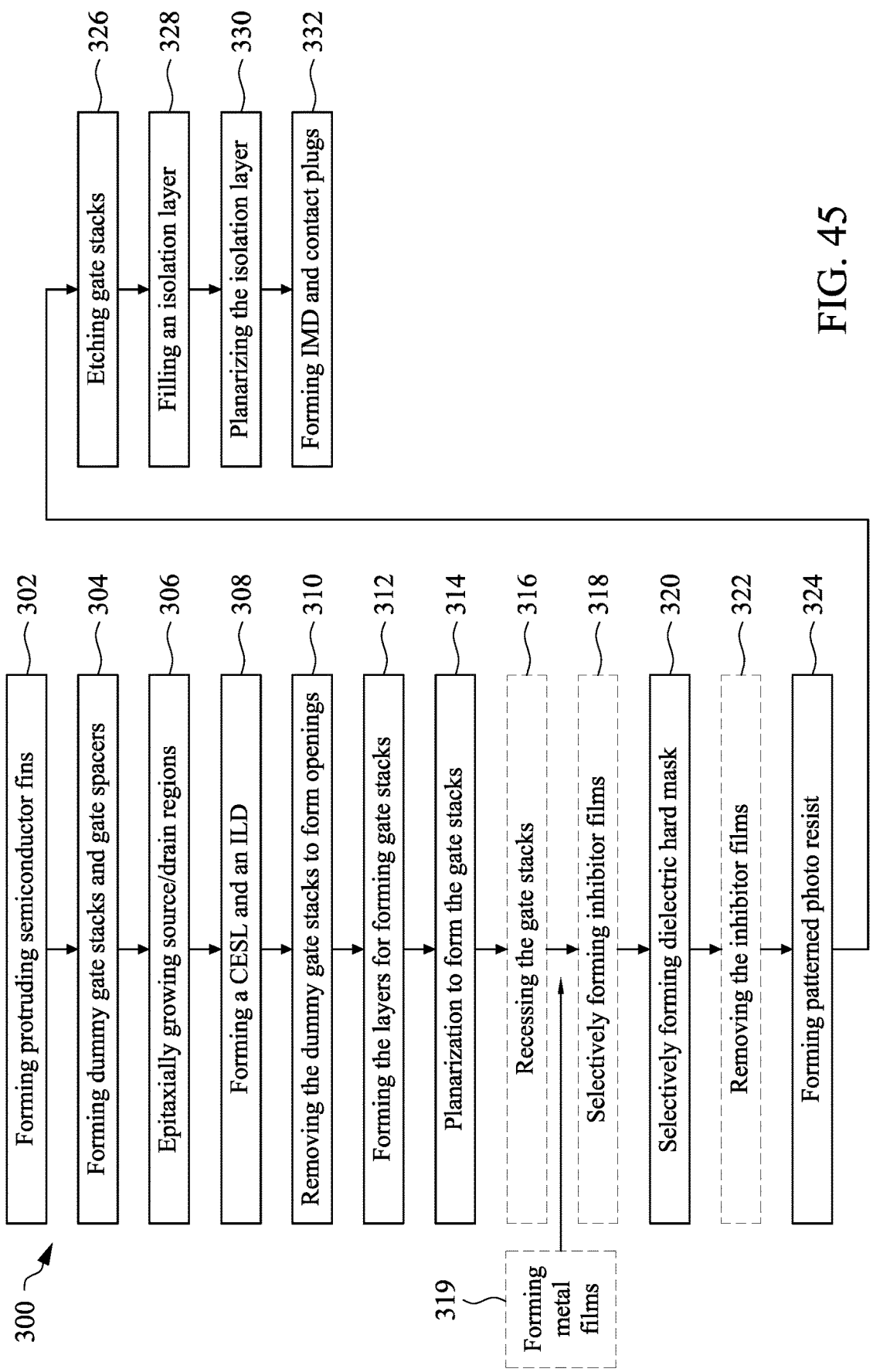
FIG. 45 illustrates a flow chart of processes for forming FinFETs in accordance with some embodiments.

FIGS. 1 through FIGS. 27A and 27B illustrate the perspective views and cross-sectional views of intermediate stages in the formation of FinFETs in accordance with some embodiments of the present disclosure. The steps shown in FIGS. 1 through FIGS. 27A and 27B are also reflected schematically in the process flow 300 shown in FIG. 45. The formed transistors include a p-type transistor (such as a p-type FinFET) and an n-type transistor (such as an n-type FinFET) in accordance with some exemplary embodiments. The steps marked with dashed boxes in FIG. 45 indicate these steps may be performed or skipped in accordance with some embodiments.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. In accordance with some embodiments of the present disclosure, substrate 20 includes a bulk silicon substrate and an epitaxy silicon germanium (SiGe) layer or a germanium layer (without silicon therein) over the bulk silicon substrate. Substrate 20 may be doped with a p-type or an n-type impurity. Isolation regions 22 such as Shallow Trench Isolation (STI) regions may be formed to extend into substrate 20. The portions of substrate 20 between neighboring STI regions 22 are referred to as semiconductor strips 124 and 224, which are in device regions 100 and 200, respectively. Device region 100 is a p-type transistor region, in which a p-type transistor such as a p-type FinFET is to be formed. Device region 200 is an n-type transistor region, in which an n-type transistor such as an n-type FinFET is to be formed.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, and the dielectric material may be formed using Flowable Chemical Vapor Deposition (FCVD), spin-on coating, or the like.

Figure 2:
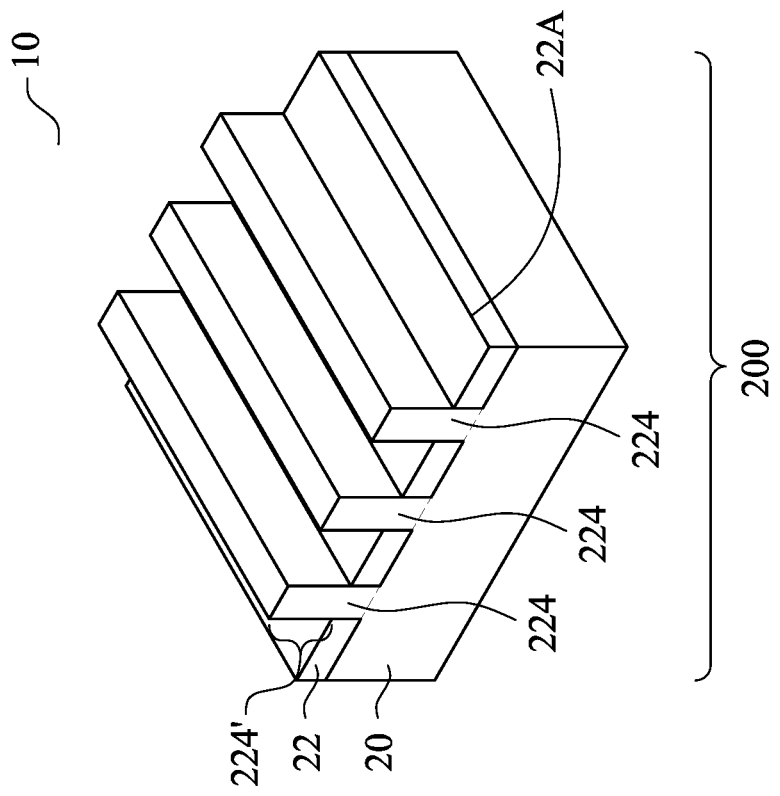
Figure 2:
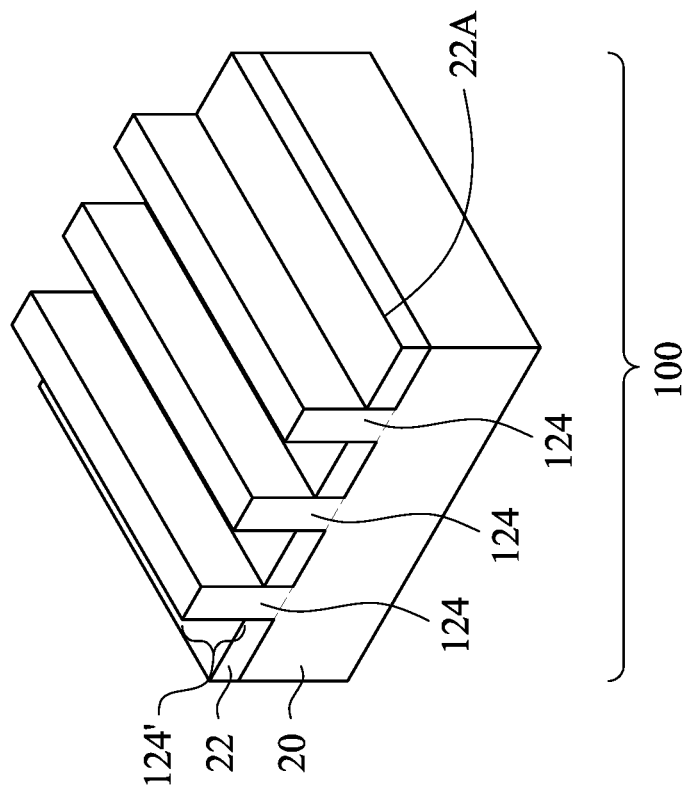

Referring to FIG. 2, STI regions 22 are recessed, so that the top portions of semiconductor strips 124 and 224 protrude higher than the top surfaces 22A of the neighboring STI regions 22 to form protruding fins 124' and 224'. The respective step is illustrated as step 302 in the process flow shown in FIG. 45. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

In above-illustrated exemplary embodiments, the defining of the patterns of the fins may be achieved by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 124' and 224' may also be replaced with materials different from that of substrate 20. For example, protruding fins 124' may be formed of Si, SiP, SiC, SiPC, or a III-V compound semiconductor such as InP, GaAs, AlAs, InAs, InAlAs, InGaAs, or the like. Protruding fins 224' may be formed of Si, SiGe, SiGeB, Ge, or a III-V compound semiconductor such as InSb, GaSb, InGaSb, or the like.

Figure 3A:
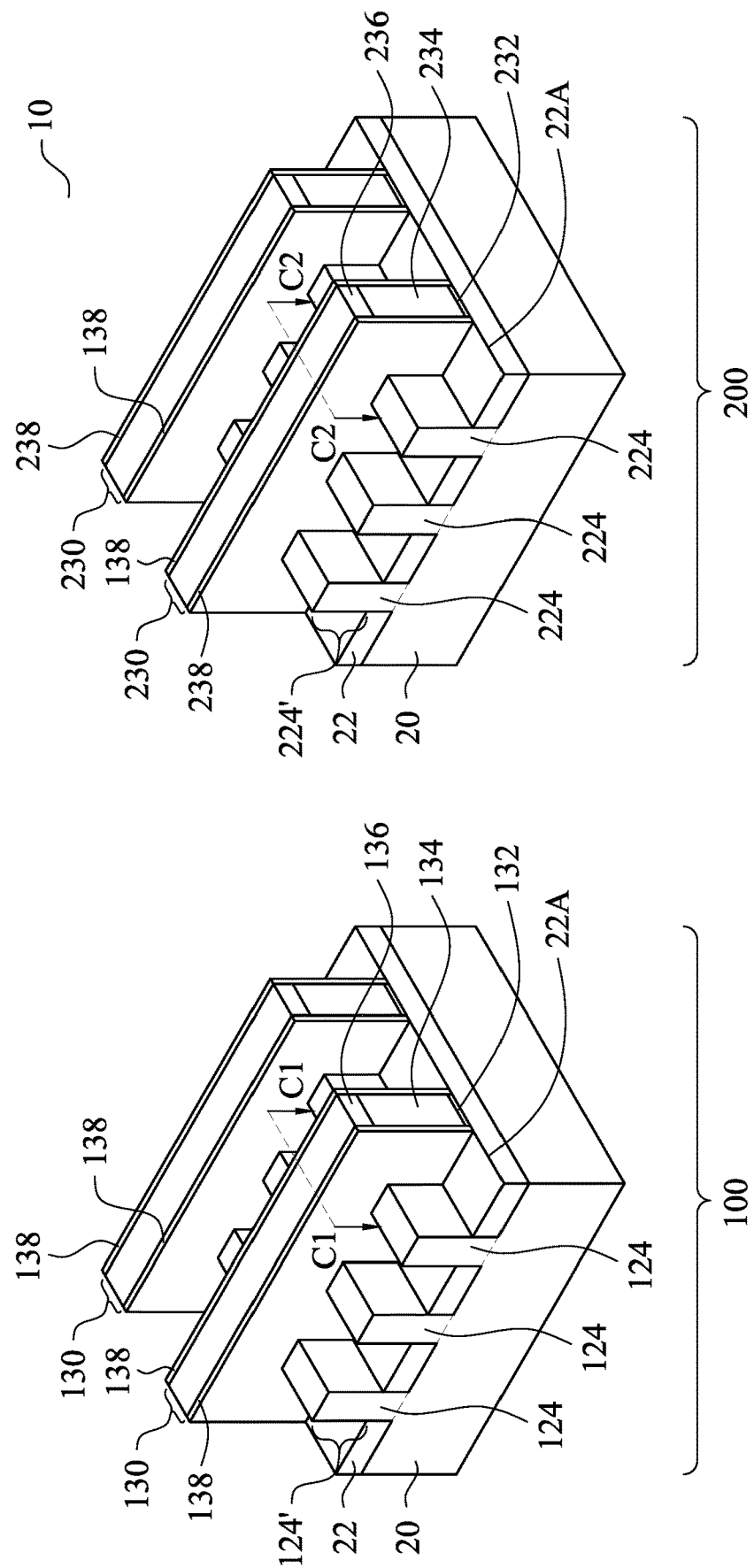

Referring to FIG. 3A, dummy gate stacks 130 and 230 are formed on the top surfaces and the sidewalls of protruding fins 124' and 224', respectively. The respective step is illustrated as step 304 in the process flow shown in FIG. 45. Dummy gate stacks 130 may include gate dielectrics 132 and dummy gate electrodes 134 over dummy gate dielectrics 132. Dummy gate stacks 230 may include gate dielectrics 232 and dummy gate electrodes 234 over dummy gate dielectrics 232. Dummy gate electrodes 134 and 234 may be formed, for example, using polysilicon, and other materials may also be used. Each of dummy gate stacks 130 and 230 may also include hard mask layers 136 and 236. Hard mask layers 136 and 236 may be formed of SiN, SiO, SiC, SiOC, SiON, SiCN, SiOCN, TiN, AlON, $Al_2O_3$, or the like. The thickness of hard mask layers 136 and 236 may be in the range between about 10 nm and about 60 nm. Each of dummy gate stacks 130 and 230 crosses over a single one or a plurality of protruding fins 124' and 224', respectively. Dummy gate stacks 130 and 230 may also have lengthwise directions perpendicular to the lengthwise directions of the respective protruding fins 124' and 224', respectively.

Figure 3B:
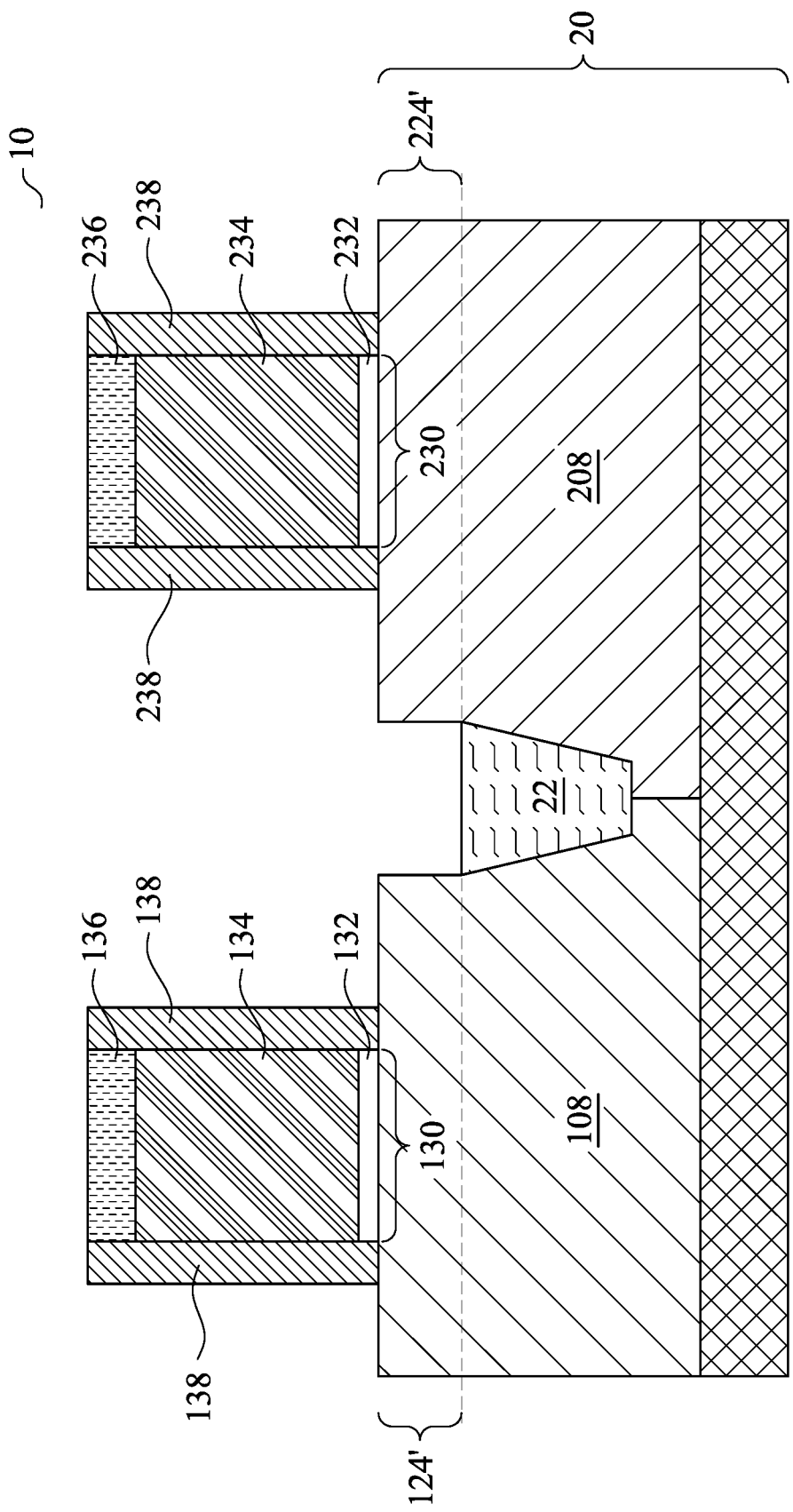

FIG. 3B illustrates a cross-sectional view of device regions 100 and 200 in accordance with some embodiments. The cross-sectional view combines the cross-sectional view obtained from the vertical plane containing line C1-C1 in FIG. 3A and the cross-sectional view obtained from the vertical plane containing line C2-C2 in FIG. 3A, with an STI region 22 separating device regions 100 and 200 in FIG. 3B. Protruding fins 124' and 224' are illustrated schematically. Also, n-well region 108 and p-well region 208 are formed to extend into protruding fins 124' and 224', respectively. N-well region 108 and p-well region 208 may also extend into the bulk portion of semiconductor substrate 20 lower than STI regions 22. Unless specified otherwise, the cross-sectional views in subsequent figures (except FIGS. 9B and 15) may also be obtained from planes same as the vertical planes as shown in FIG. 3A, which planes contain lines C1-C1 and C2-C2, respectively.

Next, as also shown in FIGS. 3A and 3B, gate spacers 138 and 238 are formed on the sidewalls of dummy gate stacks 130 and 230, respectively. In the meantime, fin spacers (not shown) may also be formed on the sidewalls of protruding fins 124' and 224'. In accordance with some embodiments of the present disclosure, gate spacers 138 and 238 are formed of an oxygen-containing dielectric material(s) such as silicon oxynitride (SiON), silicon oxy-carbo-nitride (SiOCN), silicon oxide (SiO$_2$), silicon oxycarbide (SiOC), or the like. Non-oxygen-containing materials such as silicon nitride (SiN) and/or silicon carbide (SiC) may also be used, depending on the formation method of the subsequently formed inhibitor film. Gate spacers 138 and 238 may include air-gaps, or may formed as including pores, and may have a single-layer structure or a multi-layer structure including a plurality of dielectric layers.

Figure 4A:
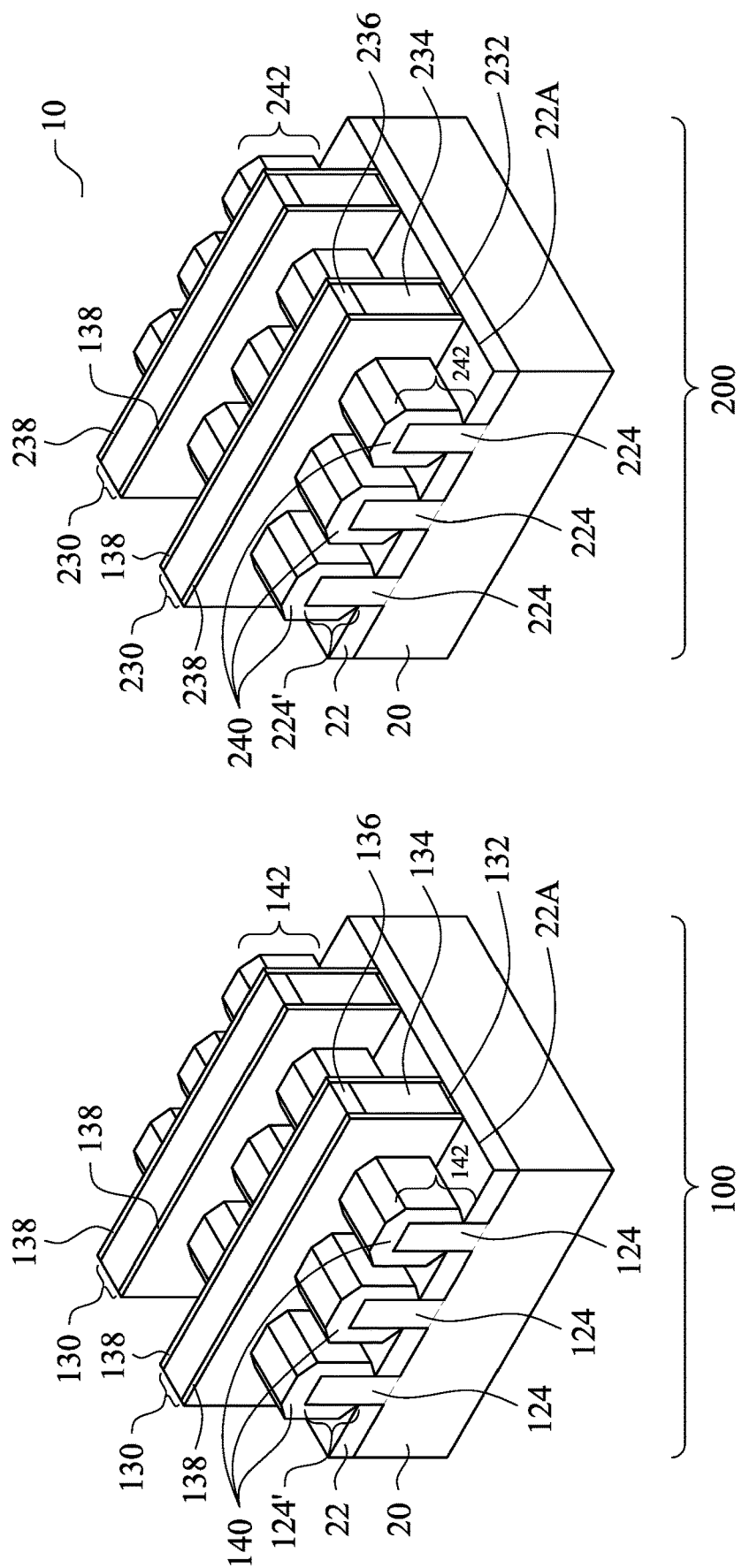
Figure 4B:
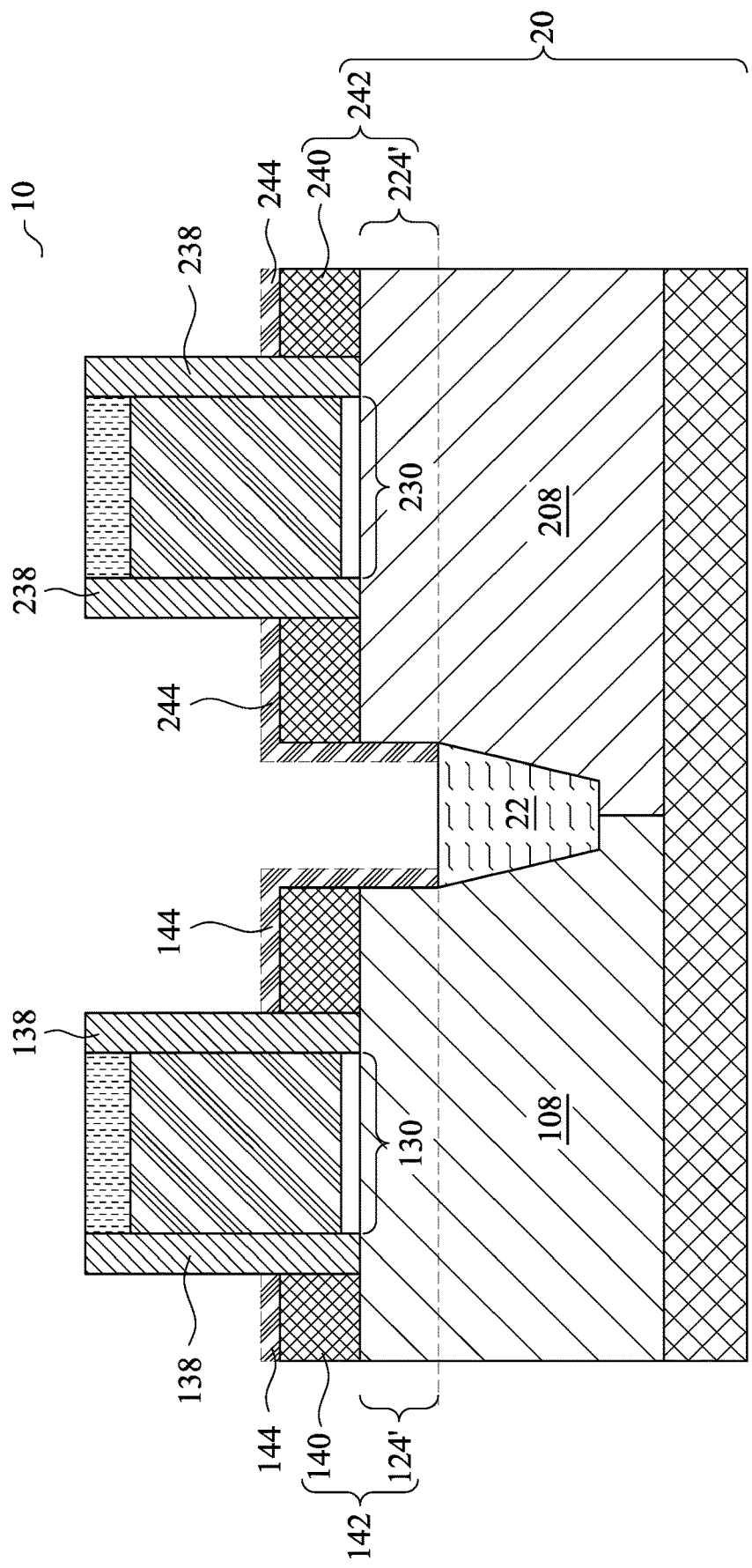

FIGS. 4A and 4B illustrate the formation of source/drain regions 142 and 242 in device regions 100 and 200, respectively. In accordance with some embodiments of the present disclosure, epitaxy regions 140 and 240 are grown on protruding fins 124' and 224', respectively, forming cladding source/drain regions. The respective step is illustrated as step 306 in the process flow shown in FIG. 45. Epitaxy regions 140 and 240 may be doped with a p-type impurity and an n-type impurity, respectively, which may be in-situ doped with the during the epitaxy. In accordance with some embodiments of the present disclosure, epitaxy regions 140 includes Si, SiGe, SiGeB, Ge or a III-V compound semiconductor such as InSb, GaSb, InGaSb, or the like. Epitaxy regions 240 may include Si, SiP, SiC, SiPC, or a III-V compound semiconductor such as InP, GaAs, AlAs, InAs, InAlAs, InGaAs, or the like. The thickness of epitaxy regions 140 and 240 may be in the range between about 3 nm and about 30 nm.

After the epitaxy step, epitaxy regions 140 and protruding fin 124' may be further implanted with a p-type impurity to form source and drain regions 142. Epitaxy regions 240 and protruding fins 224' may be further implanted with an n-type impurity to form source and drain regions 242. In accordance with alternative embodiments of the present disclosure, the implantation steps are skipped, for example, when epitaxy regions 140 and 240 have been in-situ doped with the p-type and n-type impurities, respectively.

In accordance with some embodiments of the present disclosure, instead of forming cladding source/drain regions, an etching step (referred to as source/drain recessing hereinafter) is performed to etch the portions of protruding fins 124' and 224' that are not covered by dummy gate stack 130/230 and gate spacers 138/238. The etching may be anisotropic, and hence the portions of fins 124' and 224' directly underlying dummy gate stacks 130 and 230 and gate spacers 138 and 238 are protected, and are not etched. Recesses (not shown) are accordingly formed between STI regions 22. Epitaxy source/drain regions are then grown from the recesses.

Figure 5A:
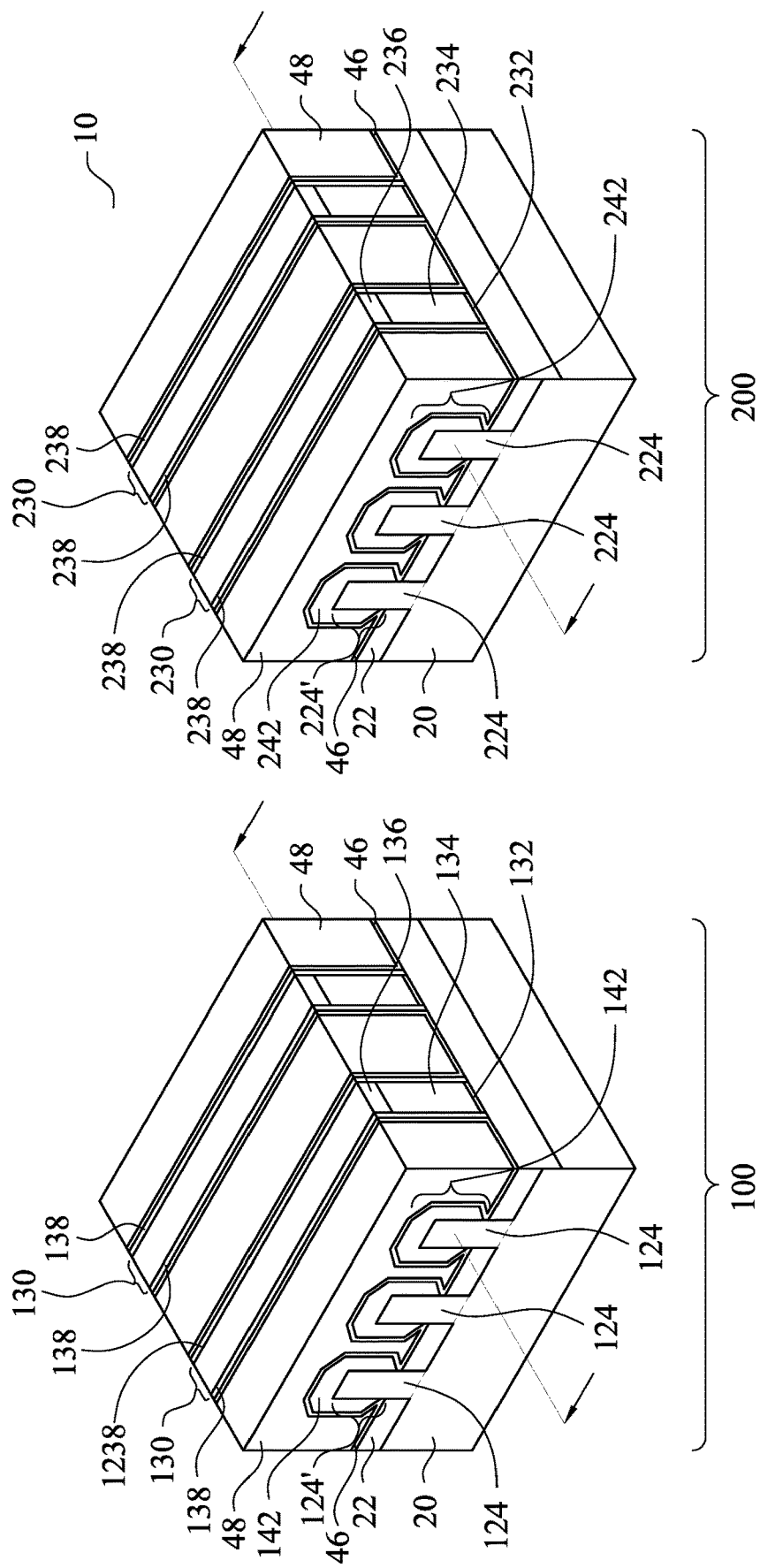
Figure 5B:
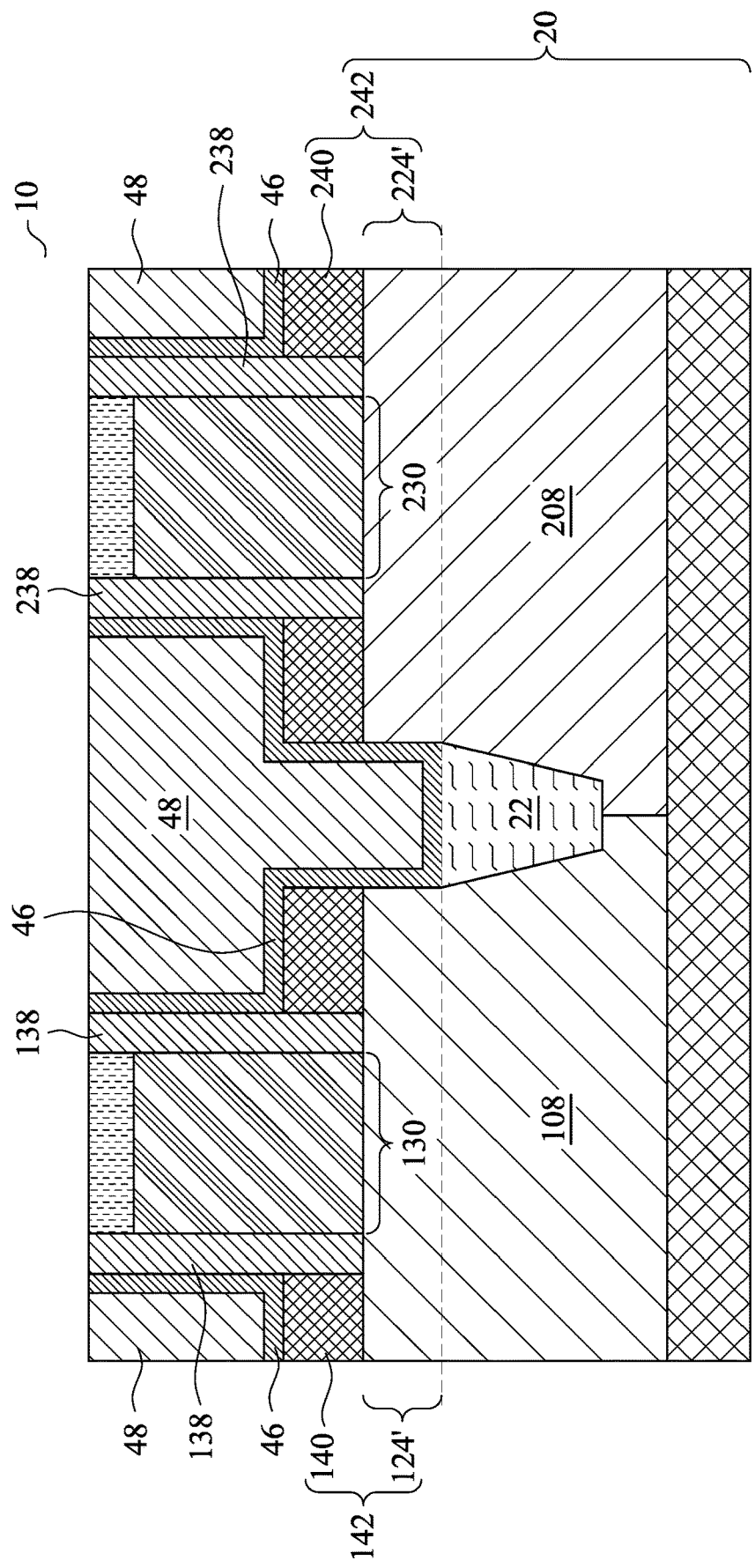

FIG. 4B also schematically illustrates source/drain silicide regions 144 and 244 respectively, which may be formed by depositing a blanket metal layer, performing an anneal to react the blanket metal layer with source/drain regions 142 and 242, and removing the un-reacted portions of the metal layer. The metal for forming source/drain silicide regions 144 and 244 may include Ti, Co, Ni, NiCo, Pt, NiPt, Ir, PtIr, Er, Yb, Pd, Rh, Nb, or the like. In accordance with alternative embodiments, source/drain silicide regions are formed after the formation of replacement metal gates, and are formed through contact openings, which penetrate through Inter-Layer Dielectric (ILD) 48 and CESL 46 as shown in FIGS. 5A and 5B. Accordingly, in FIG. 4B, source/drain silicide regions 144 and 244 are illustrated using dashed lines to indicate they may or may not be formed at this time. In subsequent drawings, source/drain silicide regions 144 and 244 are not illustrated.

Contact Etch Stop Layer (CESL) 46 and Inter-Layer Dielectric (ILD) 48 are then formed, as shown in FIGS. 5A and 5B, which illustrate a perspective view and a cross-sectional view, respectively. The respective step is illustrated as step 308 in the process flow shown in FIG. 45. CESL 46 and ILD 48 may extend to a level lower than bottom surfaces of epitaxy regions 140 and 240. CESL 46 may be formed of SiN, SiCN, SiOC, SiON, SiCN, SiOCN, or the like. In accordance with some embodiments of the present disclosure, CESL 46 may include or may be free from oxygen therein. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide (SiO) based or silicon-oxycarbide (SiOC) based such as Tetra Ethyl Ortho Silicate (TEOS) oxide, Plasma-Enhanced CVD (PECVD) oxide (SiO2), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of ILD 48, dummy gate stacks 130 and 230, and gate spacers 138 and 238 with each other.

Figure 6:
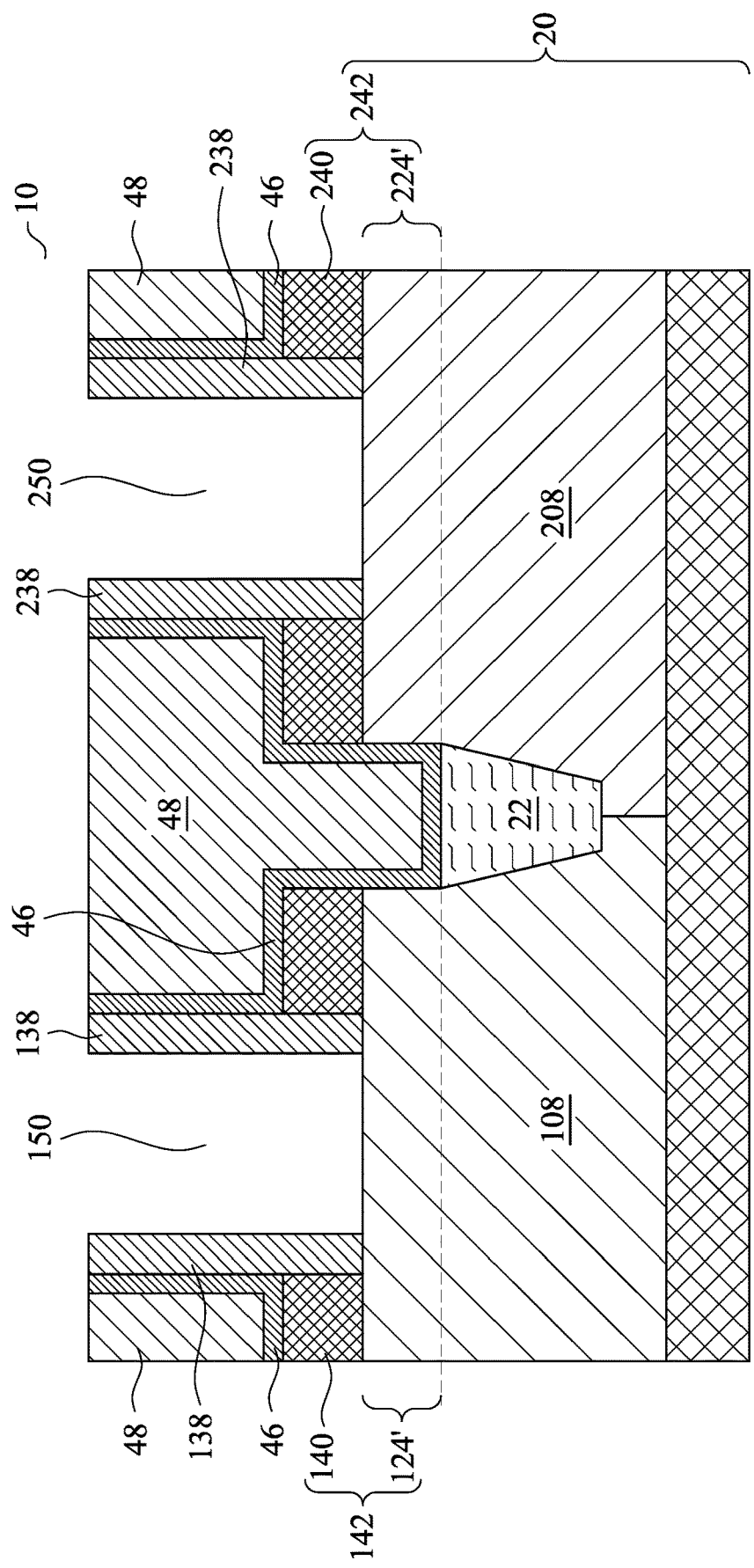

Next, dummy gate stacks 130 and 230, which include hard mask layers 136 and 236, dummy gate electrodes 134 and 234, and dummy gate dielectrics 132 and 232, are removed, forming openings 150 and 250, respectively, as shown in FIG. 6. The respective step is illustrated as step 310 in the process flow shown in FIG. 45. The surfaces of protruding fins 124' and 224' are exposed. FIG. 6 illustrates the exposure of the top surfaces of protruding fins 124' and 224'. The sidewalls surfaces of protruding fins 124' and 224' are also exposed to openings 150 and 250. Next, a cleaning step is performed to clean the surfaces of protruding fins 124' and 224' to remove native oxide. The cleaning may be performed, for example, using diluted HF solution.

Figure 7:
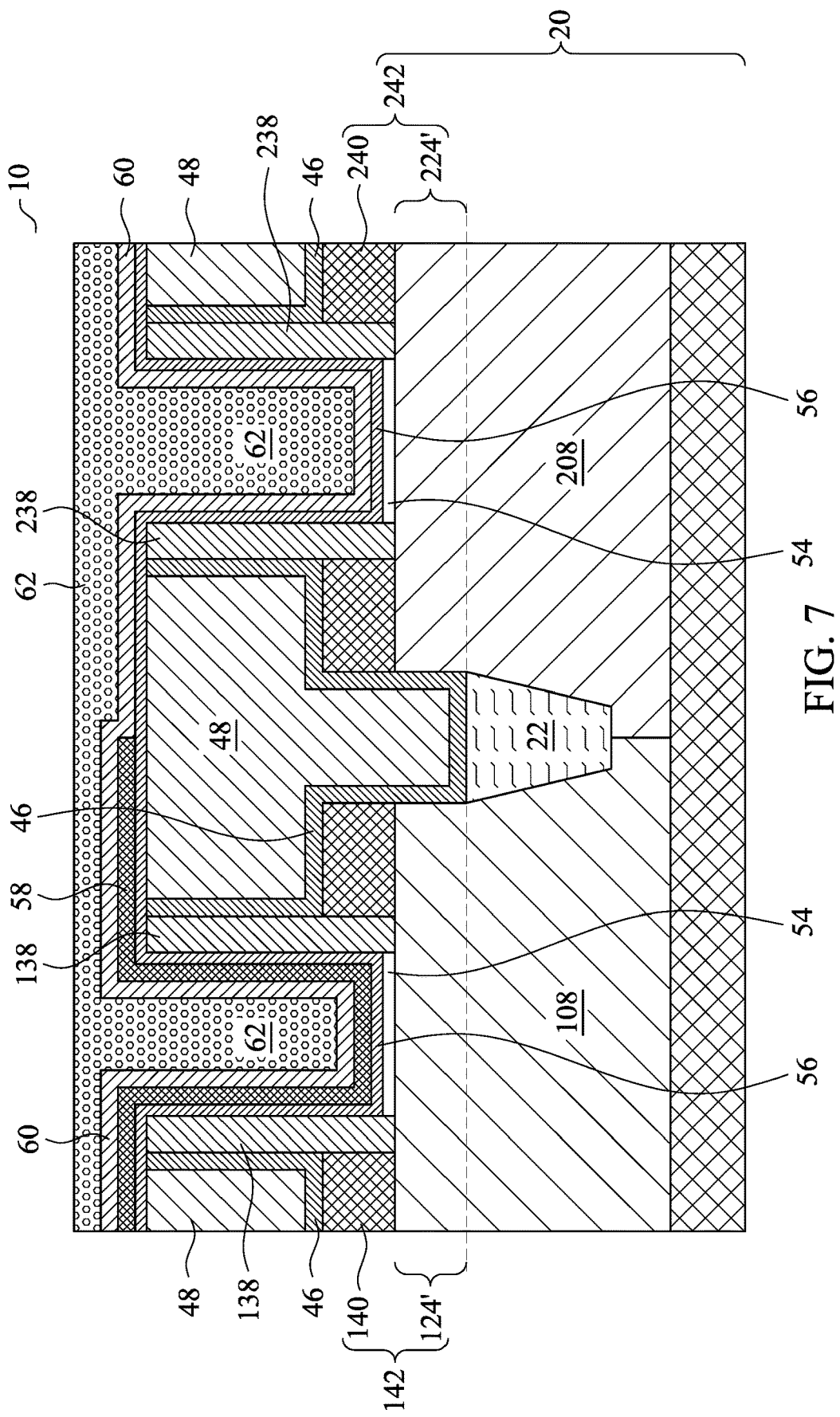

FIG. 7 illustrates a plurality of layers for forming replacement gates. The respective step is illustrated as step 312 in the process flow shown in FIG. 45.

Interfacial Layer (IL) 54, which includes silicon oxide such as SiO$_2$, is formed. In accordance with some embodiments of the present disclosure, IL 54 is a chemical oxide layer formed by treating wafer 10 in a mixture of NH$_4$OH and H$_2$O$_2$ (and/or H$_2$O), a mixture of HCl and H$_2$O$_2$ (and/or H$_2$O), a mixture of H$_2$SO$_4$ and H$_2$O$_2$, or the like. Through the chemical treatment, silicon oxide is formed on the surfaces of protruding fins 124' and 224' due to the reaction of the surface material of protruding fins 124' and 224' with the chemical solution. The thickness of IL 54 may be in the range between about 0.2 nm and about 2 nm. In accordance with some embodiments of the present disclosure, the treatment using the chemical solution is performed ex-situ with the subsequent formation of high-k gate dielectric.

Next, high-k gate dielectric 56 is formed. In accordance with some embodiments of the present disclosure, high-k gate dielectric 56 includes high-k dielectric materials such as HfO$_2$, ZrO$_2$, HfZrOx, HfSiOx, HfSiON, ZrSiOx, HfZrSiOx, Al$_2$O$_3$, HfAlOx, HfAlN, ZrAlOx, La$_2$O$_3$, TiO$_2$, Yb$_2$O$_3$, or the like. High-k gate dielectric 56 may be a single layer or a composite layer including more than one layer. In accordance with some exemplary embodiments, the formation is performed using a process gas including HfCl$_4$ and O$_3$.

Stacked layers 58 and 60 are deposited. Each of the stacked layers 58 and 60 may include a plurality of sub-layers. The sub-layers in stacked layers 58 and 60 are not shown separately, while the sub-layers may be distinguishable from each other. The deposition may be performed using conformal deposition methods such as ALD or CVD, so that the thicknesses of the vertical portions and the thicknesses of the horizontal portions of stacked layers 58 and 60 (and each of sub-layers) are substantially equal to each other. Stacked layers 58 and 60 include some portions over ILD 48.

Each of stacked layers 58 and 60 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the respective gate, and includes at least one layer, or a plurality of layers formed of different materials. The material of the work-function layer is selected according to whether the respective FinFET is an n-type FinFET or a p-type FinFET. For example, for the p-type FinFET formed in device region 100, the work-function layer in stacked layer 58 may include Ti, Al, TiAl, TiAlN, Ta, TaN, TiAlC, TaAlCSi, TaAlC, TiSiN, or the like. An exemplary stacked work function layer in layer 58 includes a TaN layer, a TiN layer over the TaN layer, and a TiAl layer over the TiN layer. For the n-type FinFET formed in device region 200, the work-function layer in stacked layer 60 may include TiN, TaN, TiAl, W, Ta, Ni, Pt, or the like. An exemplary stacked work function layer in layer 60 includes a TaN layer and a TiAl layer over the TaN layer. After the deposition of the work-function layer(s), a barrier layer, which may be another TiN layer, is formed, which layer is included in stacked layer 60 in an exemplary embodiment.

In the exemplary embodiment as shown in FIG. 7, the formation process of stacked layers include blanket depositing stacked layers 58, which includes work function metals for p-type transistors, patterning stacked layers 58 to remove the portions in device region 200, and then blanket depositing stacked layers 60, so that stacked layers 60 have portions overlapping stacked layers 58. The work function of the transistor in device region 100 is mainly determined by stacked layers 58, and the work function of the transistor in device region 200 is mainly determined by stacked layers 60.

Next, as also shown in FIG. 7, metallic material 62 is deposited, which may be formed of tungsten, cobalt, copper, ruthenium, aluminum, or the like. Metallic material 62 fully fills remaining openings 150 and 250 (FIG. 5).

Figure 8:
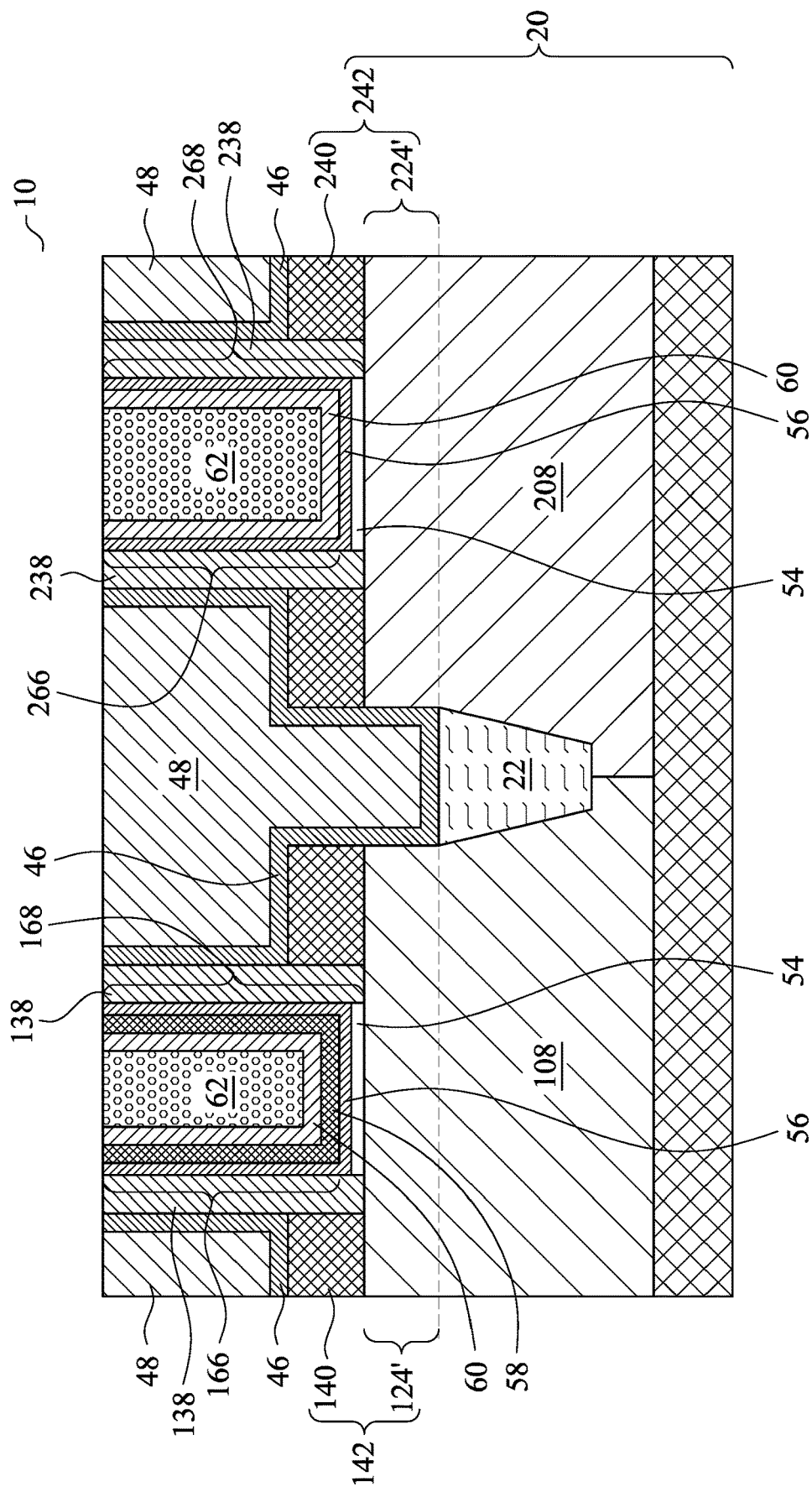

In a subsequent step as shown in FIG. 8, a planarization step such as CMP or mechanical grinding is performed, so that the portions of layers 58, 60, and 62 over ILD 48 are removed. As a result, replacement metal gate electrodes 166 and 266 are formed, which include the remaining portions of layers 58, 60, and 62. The respective step is illustrated as step 314 in the process flow shown in FIG. 45. Replacement metal gate electrodes 166 and 266 in combination with the underlying IL 54 and high-k gate dielectric 56 are referred to as replacement gate stacks 168 and 268, respectively.

Figure 9:
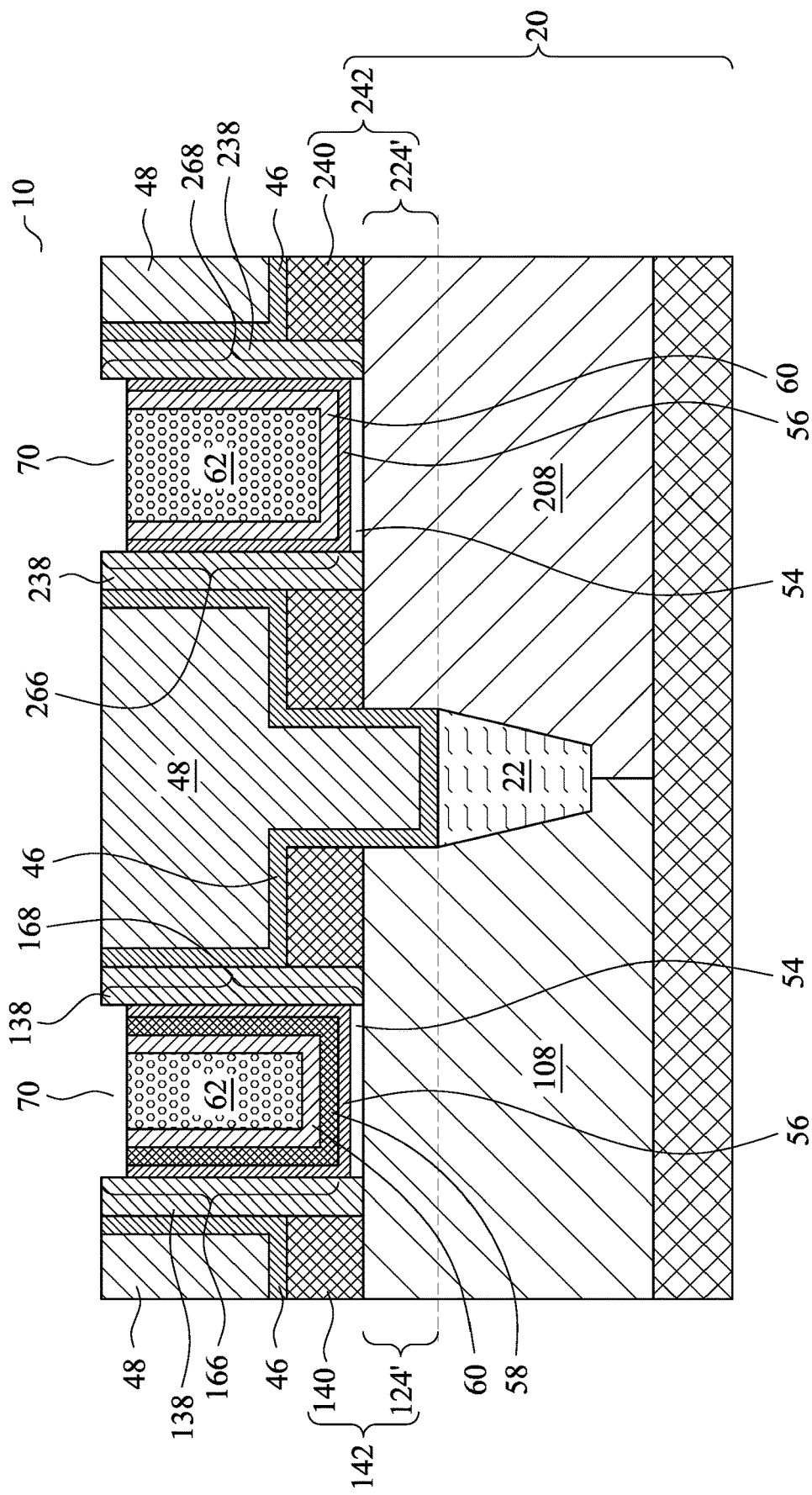

FIG. 9 illustrate the recessing of gate stacks 168 and 268, which is performed through etching gate electrodes 166 and 266 and the high-k dielectric layers 56. The respective step is illustrated as step 316 in the process flow shown in FIG. 45. Recesses 70 are thus formed. In accordance with some embodiments of the present disclosure, recesses 70 have depths in the range between about 0.5 μm and about 10 μm.

Figure 10:
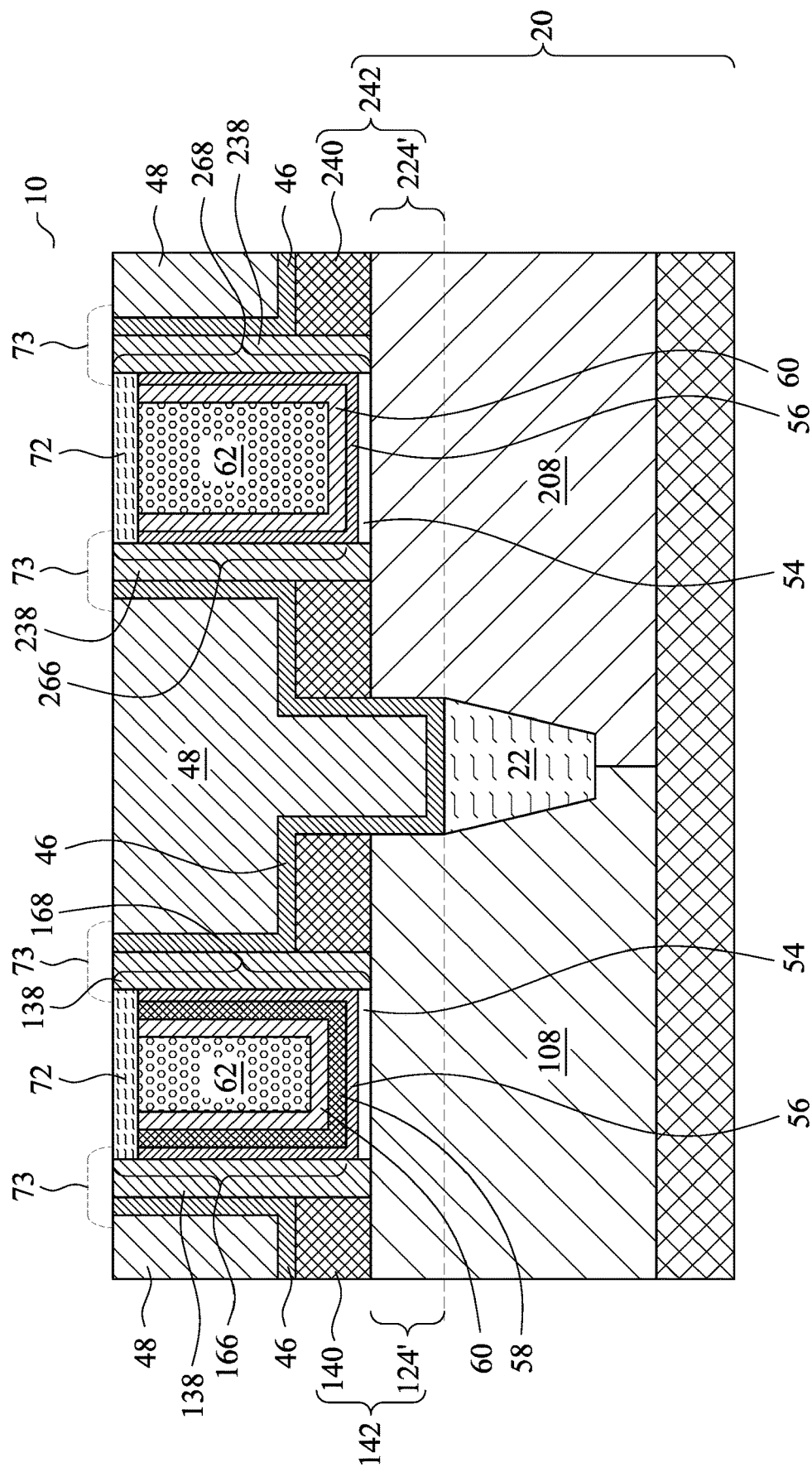

FIG. 10 illustrates the selective formation of inhibitor films 72. The respective step is illustrated as step 318 in the process flow shown in FIG. 45. In accordance with some embodiments of the present disclosure, inhibitor films 72 are formed through selective deposition. The deposition methods may include Plasma Enhanced Chemical Vapor Deposition (PECVD), Chemical Vapor Deposition (CVD), or the like. Inhibitor films 72 may include plasma-polymerized fluorocarbon. The plasma-polymerized fluorocarbon includes carbon and fluorine. In accordance with some embodiments, the precursor for forming inhibitor films 72 include a mixture of $CF_4$ and $C_4H_8$, and the resulting inhibitor films 72 are formed of a polymer using plasma. The carbon percentage in inhibitor films 72 may be in the range between about 30 percent and about 80 percent. Since the materials of gate spacers 138 and 238, CESL 46, and ILD 48 are different from that of gate stacks 168 and 268, the deposition is selective, and inhibitor films 72 are grown from gate stacks 168 and 268, and not from ILD 48. Inhibitor films 72 may, or may not, have extended portions grown on high-k dielectrics 56, gate spacers 138 and 238 and CESL 46. For example, when gate spacers 138 and 238 are formed of silicon oxide, and CESL 46 is formed of silicon oxide and/or silicon nitride, inhibitor films 72 are also grown on gate spacers 138 and 238 and CESL 46. The dashed lines 73 schematically illustrate the corresponding extended portions of inhibitor films 72. The thickness of inhibitor films 72 may be greater than about 10 nm, and may be in the range between about 10 nm and about 100 nm. The top surfaces of inhibitor films 72 may be lower than, level with, or higher than the top surfaces of ILD 48.

Figure 11:
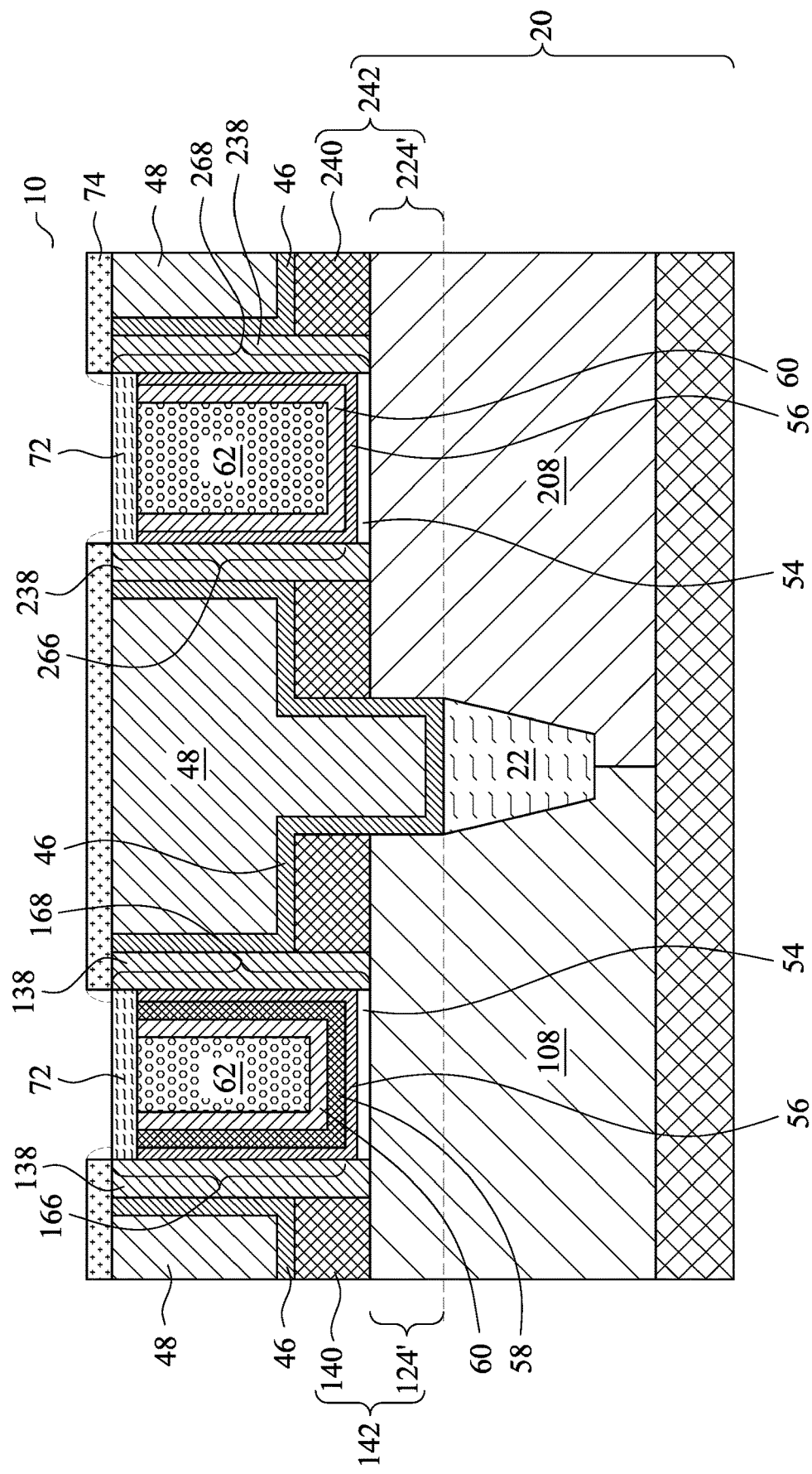

FIG. 11 illustrates the formation of dielectric hard mask 74, which is selectively grown on the exposed surfaces that are not protected by inhibitor films 72. The respective step is illustrated as step 320 in the process flow shown in FIG. 45. In accordance with some embodiments of the present disclosure, dielectric hard mask 74 is formed of a metal oxide. For example, dielectric hard mask 74 may be formed of $ZrO_2$, $HfO_2$, $Y_2O_3$, HfZrOx, hafnium silicate (HfSiOx), zirconium silicate (ZrSiOx), yttrium silicates (YSiOx), HfZrSiOx, $Al_2O_3$, HfAlOx, ZrAlOx, $La_2O_3$, lanthanum silicate (LaSiOx), ZnO, $TiO_2$, or combinations thereof. The deposition method may include Atomic Layer Deposition (ALD), PECVD, CVD, or the like. Inhibitor films 72 prohibit the growth of dielectric hard mask 74 thereon. However, due to the lateral growth of dielectric hard mask 74, dielectric hard mask 74 may have some small edge portions overlapping the edges of inhibitor films 72 slightly, which is also shown by dashed lines. Dielectric hard mask 74 may have a thickness in the range between about 3 nm and about 30 nm, for example.

Figure 12:
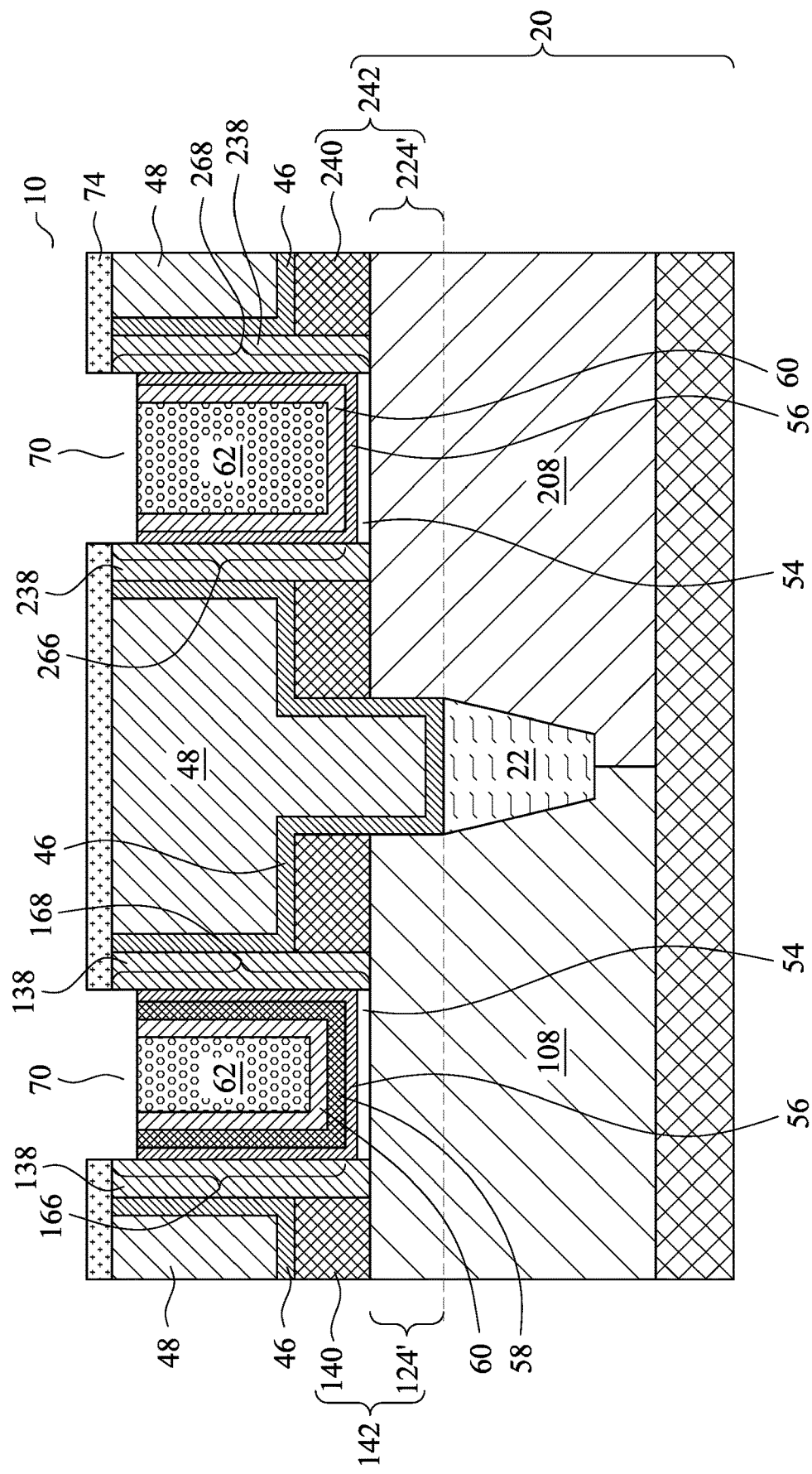
Figure 16:
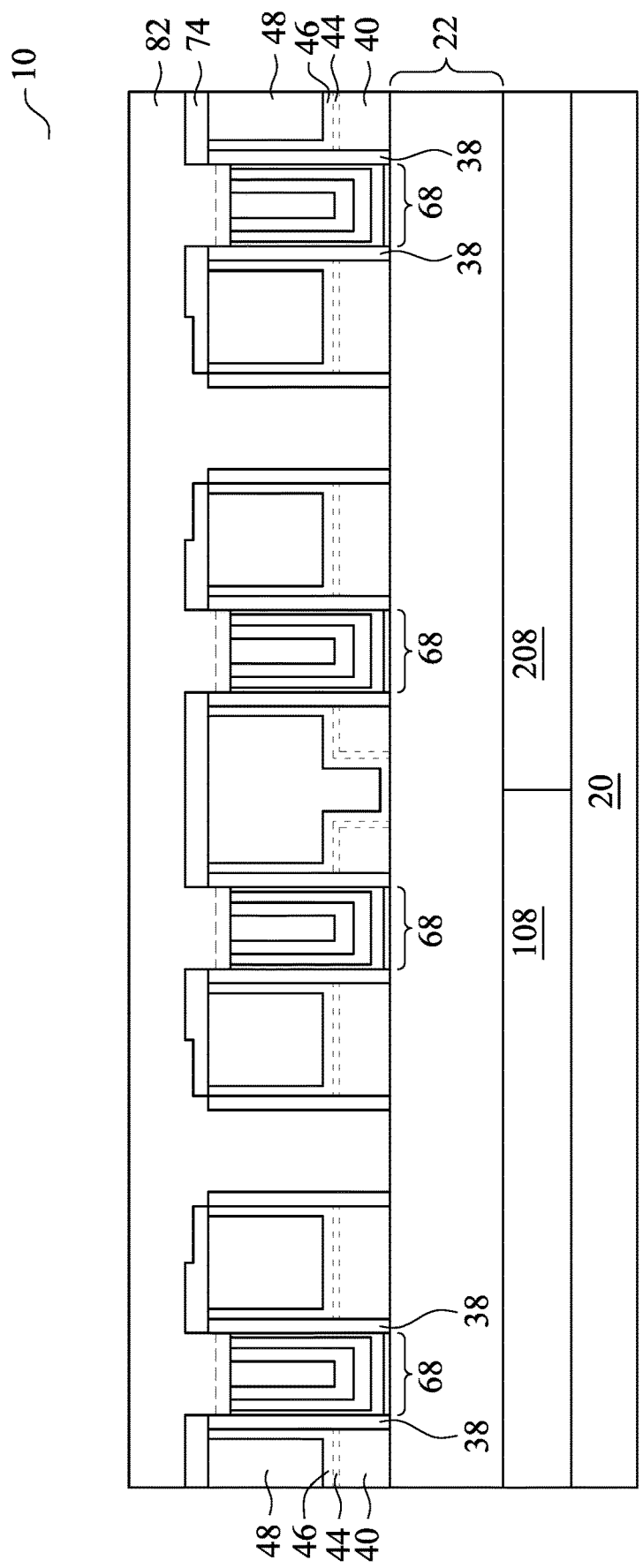

Inhibitor films 72 are then removed in accordance with some embodiments of the present disclosure, as shown FIG. 12. The respective step is illustrated as step 322 in the process flow shown in FIG. 45. In accordance with alternative embodiments, inhibitor films 72 are not removed at this stage. Rather, it is removed before the isolation layer 82 as shown in FIG. 16 is deposited. In accordance with yet other embodiments, inhibitor films 72 are not removed, and will remain in the final structure, with gate contact plugs 86 (FIG. 18A) penetrating through inhibitor films 72. In accordance with some embodiments of the present disclosure, inhibitor films 72 are removed through plasma ashing using $O_2$ or a mixture of $H_2$ and $N_2$ as process gases.

Figure 13A:
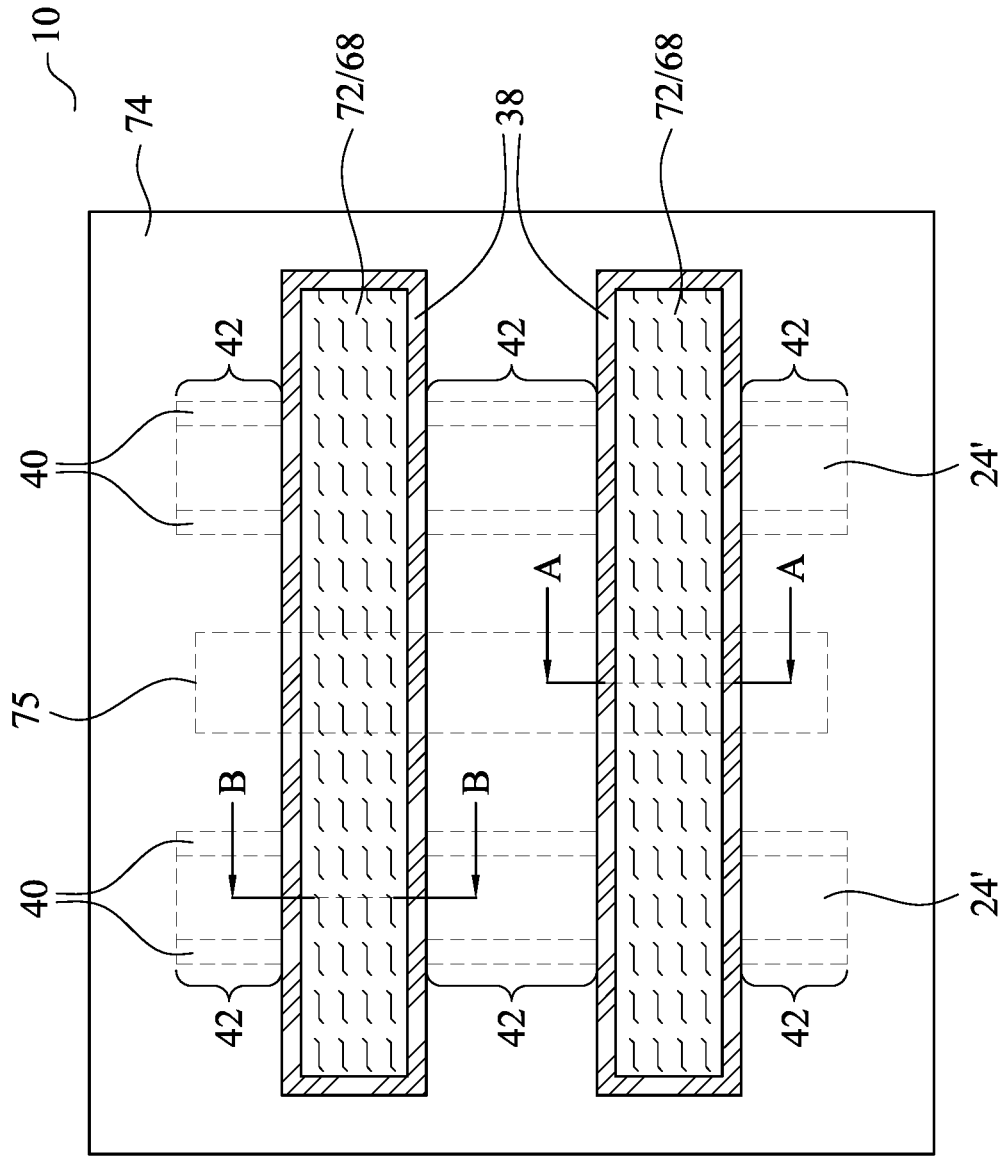
Figure 13B:
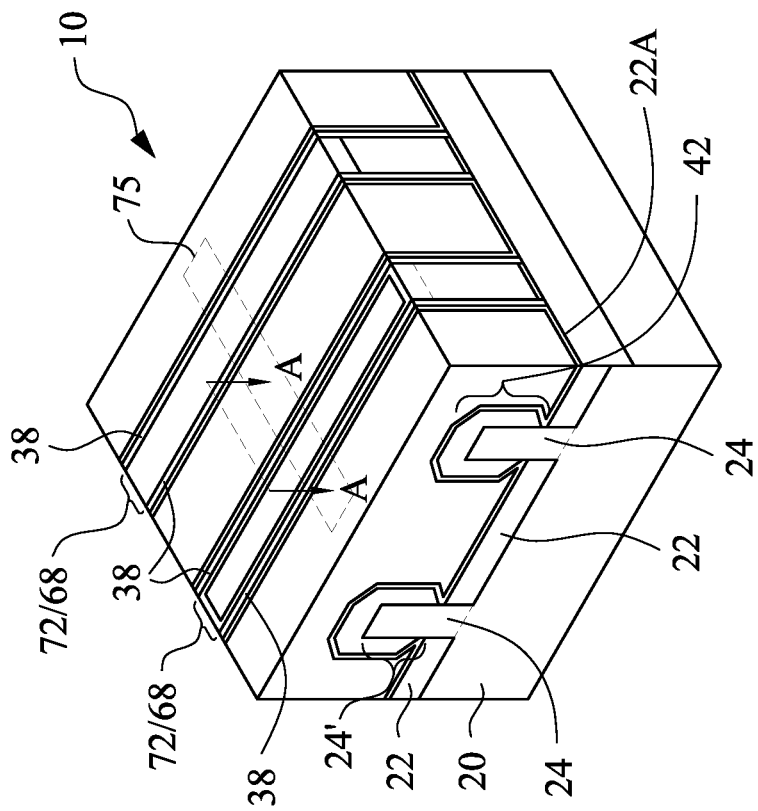

In subsequent steps, a cut-metal-gate process is performed, so that long metal gates 166 and 266 are cut into a plurality of electrically disconnected portions, and each may be used as a metal gate of one or more FinFET. For example, FIG. 13A illustrates two gate stacks 68, with each representing either 168 or 268 as in FIG. 12. Inhibitor films 72 are formed overlapping gate stacks 68. Dielectric hard mask 74 may cover all illustrated regions in FIG. 13A except the regions in which inhibitor films 72 are formed. Two protruding fins 24' (with each being either 124' or 224' in FIG. 12) are crossed over by gate stacks 68. Protruding fins 24' are the top portions of semiconductor strips 24 (with each being either 124 or 224 in FIG. 5A). Epitaxy regions 40 (which may be 140 or 240 in FIG. 12), gate spacers 38 (which may be 138 or 238 in FIG. 12), and source/drain regions 42 (which may be 142 or 242 in FIG. 12) are also illustrated. In accordance with some embodiments of the present disclosure, the portions of gate stacks 68 inside dashed region 75 are to be removed, and are replaced with a dielectric material. The portions of gate stacks 68 on the left side and the right side of region 75 are not removed, and will form the gate stacks of a FinFET(s) on the left side and a FinFET(s) on the right side of region 75. FIG. 13B illustrates a perspective view of the structure shown in FIG. 13A, wherein region 75 is illustrated, and the portions of gate electrodes 68 in region 75 will be removed in subsequent cut-metal-gate process.

Figure 14:
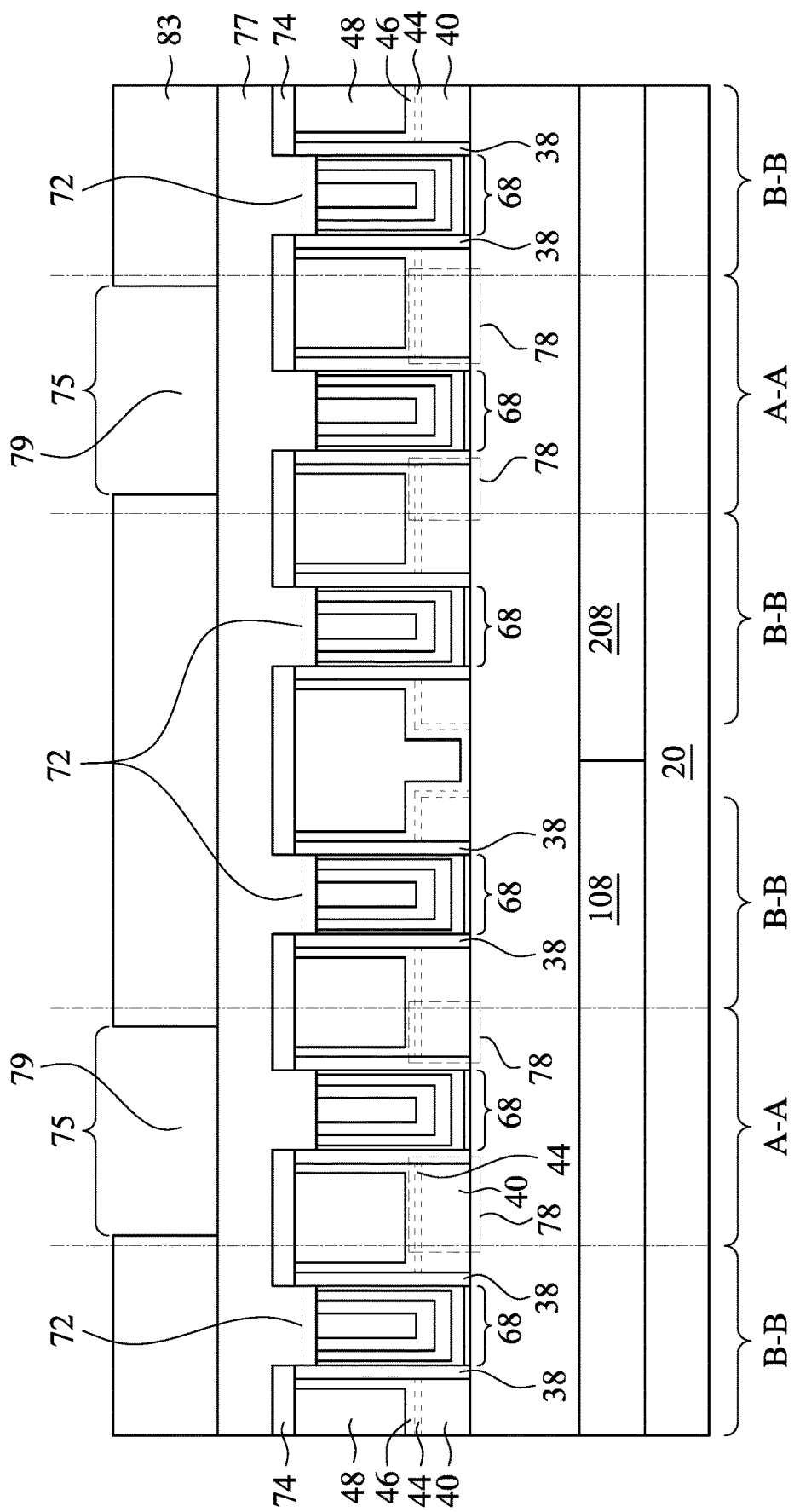

FIG. 14 illustrates the formation of Bottom Anti-Reflective Coating (BARC) 77 and photo resist 83 on the structure formed in preceding steps. The respective step is illustrated as step 324 in the process flow shown in FIG. 45. It is noted that the cross-sectional view shown in FIG. 14 is not obtained from a single plane in FIG. 13A. Rather, it combines the views from several regions in FIG. 13A. For example, the regions marked as A-A in FIG. 14 may be obtained from the plane containing line A-A in FIG. 13A, and the portions marked as B-B in FIG. 14 may be obtained from the plane containing line B-B in FIG. 13A. Furthermore, although n-well region 108 and p-well region 208 are illustrated as appearing in regions A-A, STI regions 22 (which are shown as being dashed) may be in regions A-A rather than having well regions. Also, epitaxy regions 40 and silicide regions 44 (representing regions 144 and/or 244) may exist in regions 78 when regions 78 are in regions B-B in accordance with some embodiments of the present disclosure, as illustrated, and well regions 108 and 208 extend up to the epitaxy regions 40. On the other hand, no epitaxy regions 40 and silicide regions 44 are in regions 78 when regions 78 are in regions A-A), and CESL 46 may extend down to contact STI region 22. It is noted that the discussion of dashed regions 78 and the dashed STI regions 22 as shown in FIG. 14 may also apply to all subsequently illustrated figures that combine regions A-A and B-B, and the respective discussion is not repeated herein.

As shown in FIG. 14, photo resist 83 is patterned to form opening 79. Referring to FIGS. 13A and 13B, opening 79 may be at the same position, and has the same size, as region 75, while the regions surrounding region 75 are covered by photo resist 83.

Figure 15:
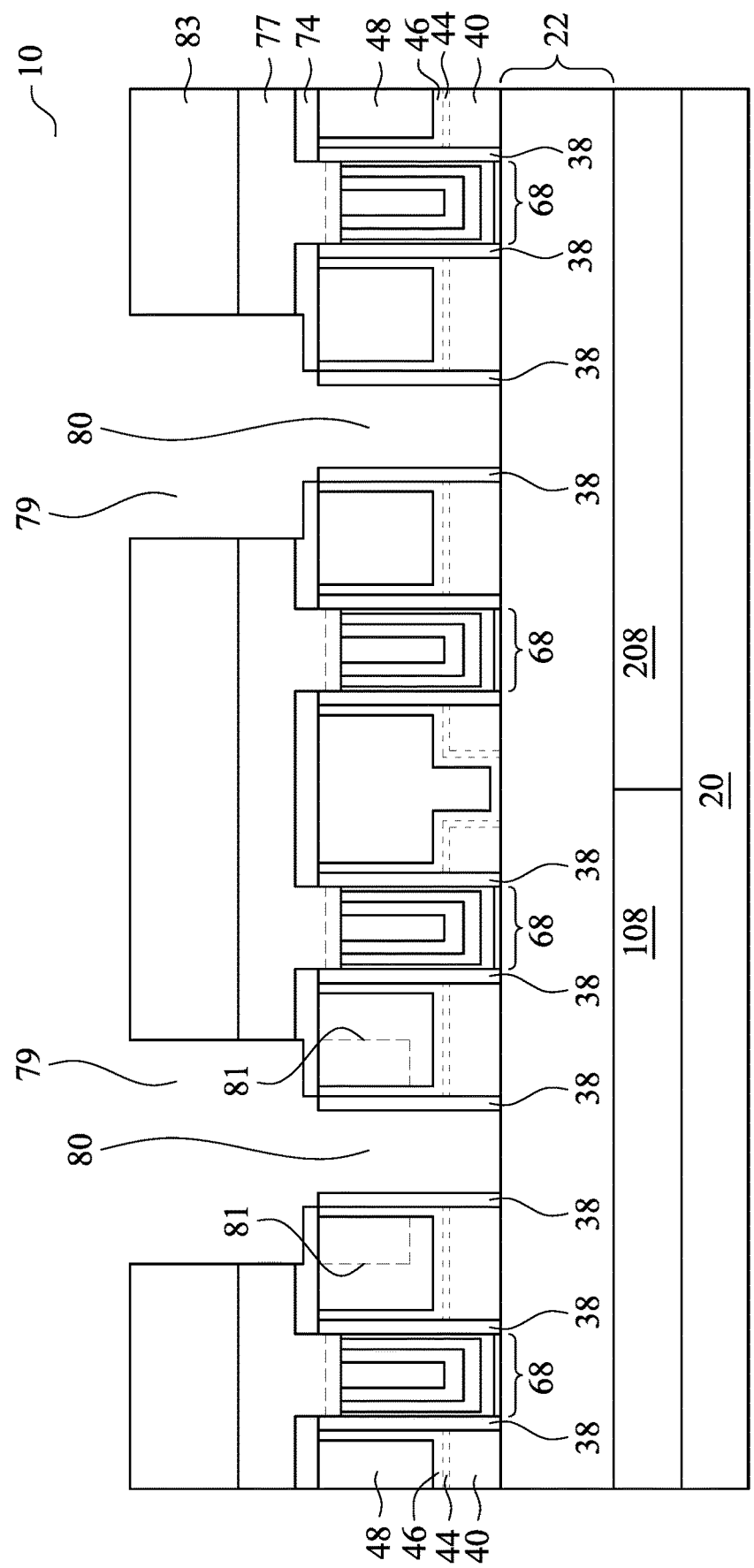

Next, the portions of gate stacks 68 exposed to openings 79 are etched, forming openings 80 extending between gate spacers 38. The resulting structure is shown in FIG. 15. The respective step is illustrated as step 326 in the process flow shown in FIG. 45, and the respective process is referred to as a cut-metal-gate process. In accordance with some embodiments of the present disclosure, the etching comprises dry etching using chlorine-containing or fluorine-containing gases, which may include $Cl_2$, $NF_3$, $SiCl_4$, $BCl_3$, $O_2$, $N_2$, $H_2$, Ar, or the mixtures of some of these gases.

In a subsequent step, photo resist 83 and BARC 77 are removed. If inhibitor films 72 remain over gate stacks 68 at this time, inhibitor films 72 may be removed, or may be left unremoved. In the cut-metal-gate process, dielectric hard masks 74 protects the underlying ILD 48, so that the opening does not extend into ILD. As a comparison, if dielectric hard masks 74 are not formed, openings 81 may adversely extend into ILD 48.

Referring to FIG. 16, isolation layer 82 is deposited to fill openings 80 as shown in FIG. 15, which shows a cross-section A-A in FIG. 13A. It is appreciated that epitaxy regions 40 and source/drain silicide regions 44 are in cross-section B-B (FIG. 13), and are not in the illustrated cross-section A-A. Accordingly, epitaxy regions 40 and source/drain silicide regions 44 are illustrated as being dashed. The respective step is illustrated as step 328 in the process flow shown in FIG. 45. In accordance with some embodiments of the present disclosure, isolation layer 82 is formed of SiO, SiN, SiC, SiCN, SiOC, SiON, SiOCN, or the like. The deposition method may include PECVD, ALD, CVD, or the like. Isolation layer 82 is deposited to a level higher than the top surface of dielectric hard mask 74.

Figure 17A:
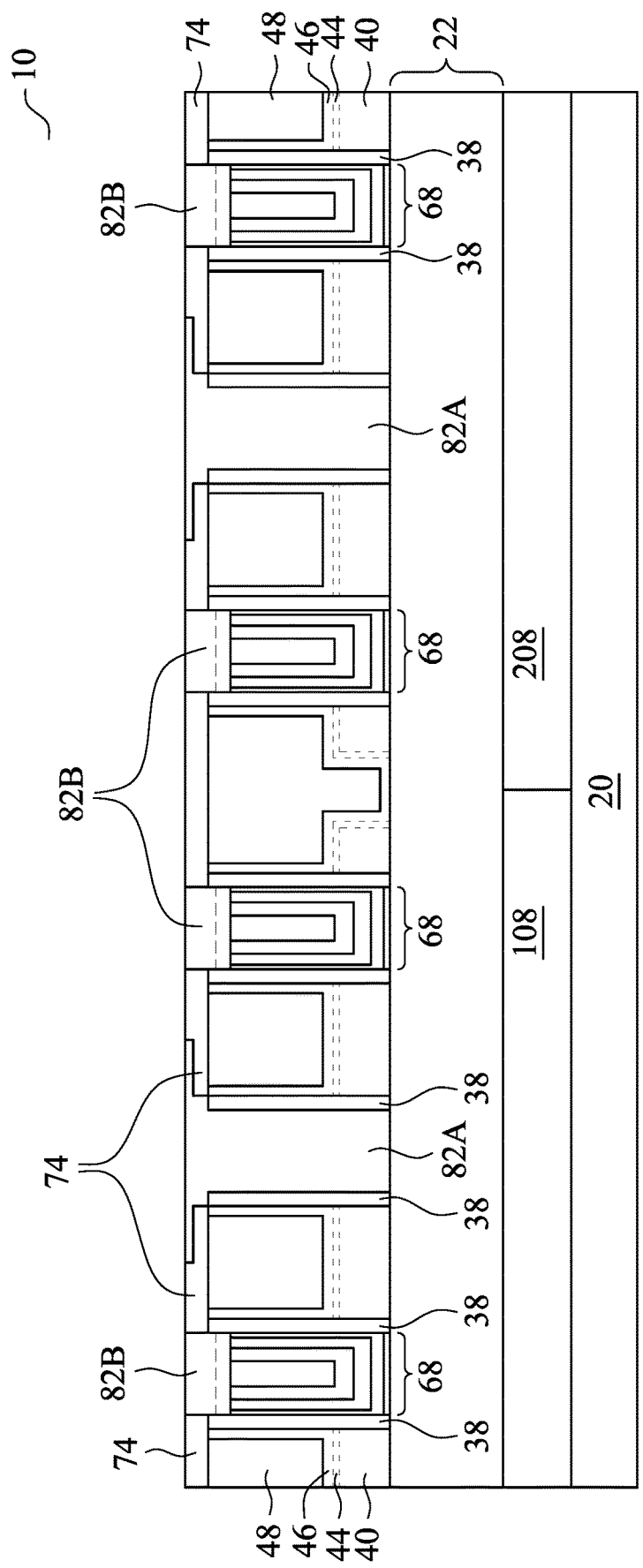
Figure 44:
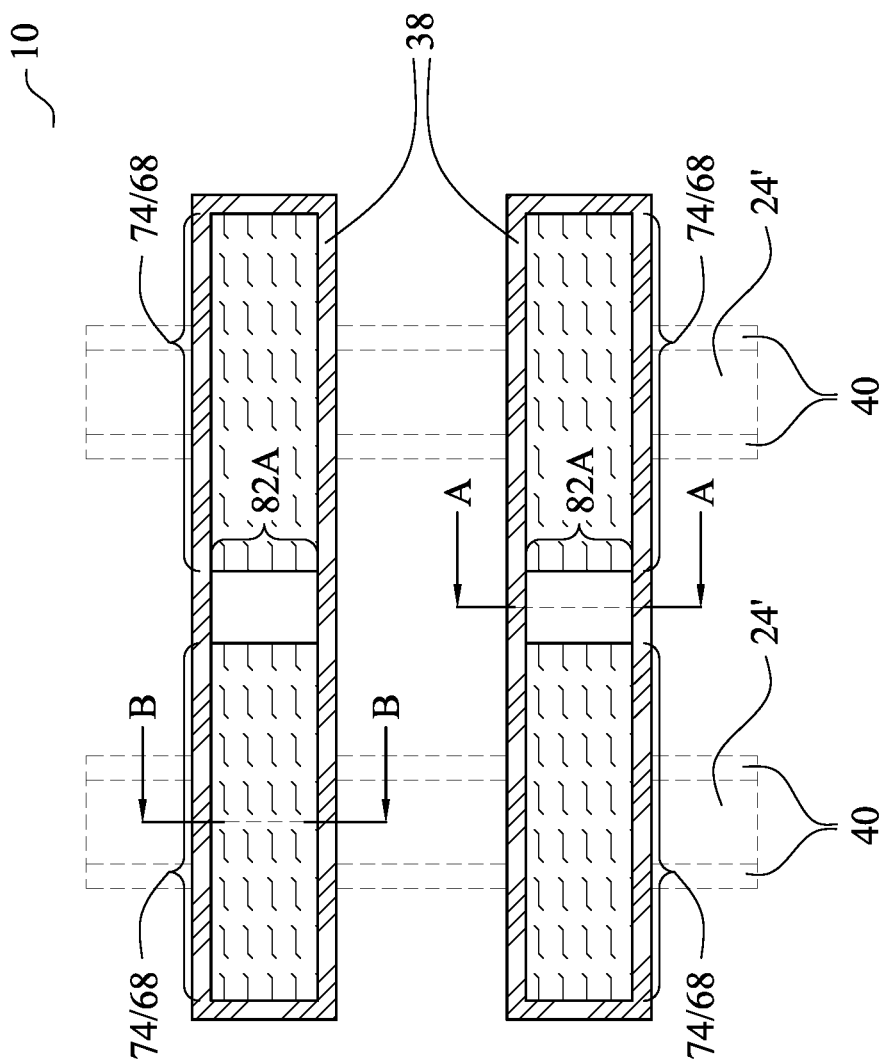
FIG. 44 shows a top view of FinFETs with isolation regions formed through cut-metal-gate processes in accordance with some embodiments.

Referring to FIG. 17A, a planarization process such as a Chemical Mechanical Polish (CMP) process is performed. The respective step is illustrated as step 330 in the process flow shown in FIG. 45. The slurry used for the CMP may include silica or ceria, or may be an alumina-abrasive-based slurry. Dielectric hard mask 74 is used as a CMP stop layer. The resulting structure includes isolation regions 82A and gate hard masks 82B. FIG. 44 illustrates a top view showing how isolation regions 82A separate gate stacks into smaller portions.

Referring back to FIG. 17A, dielectric hard mask 74 may cover the portions of replacement gate stacks 68 on the opposite sides of isolation regions 82A. Dielectric hard mask 74 may, or may not, extend on gate spacers 38, and may or may not further extend on CESL 46 (not shown in FIG. 44). Gate hard masks 82B extend between gate spacers 38, and may have a thickness in the range between about 20 nm and about 200 nm.

Figure 18A:
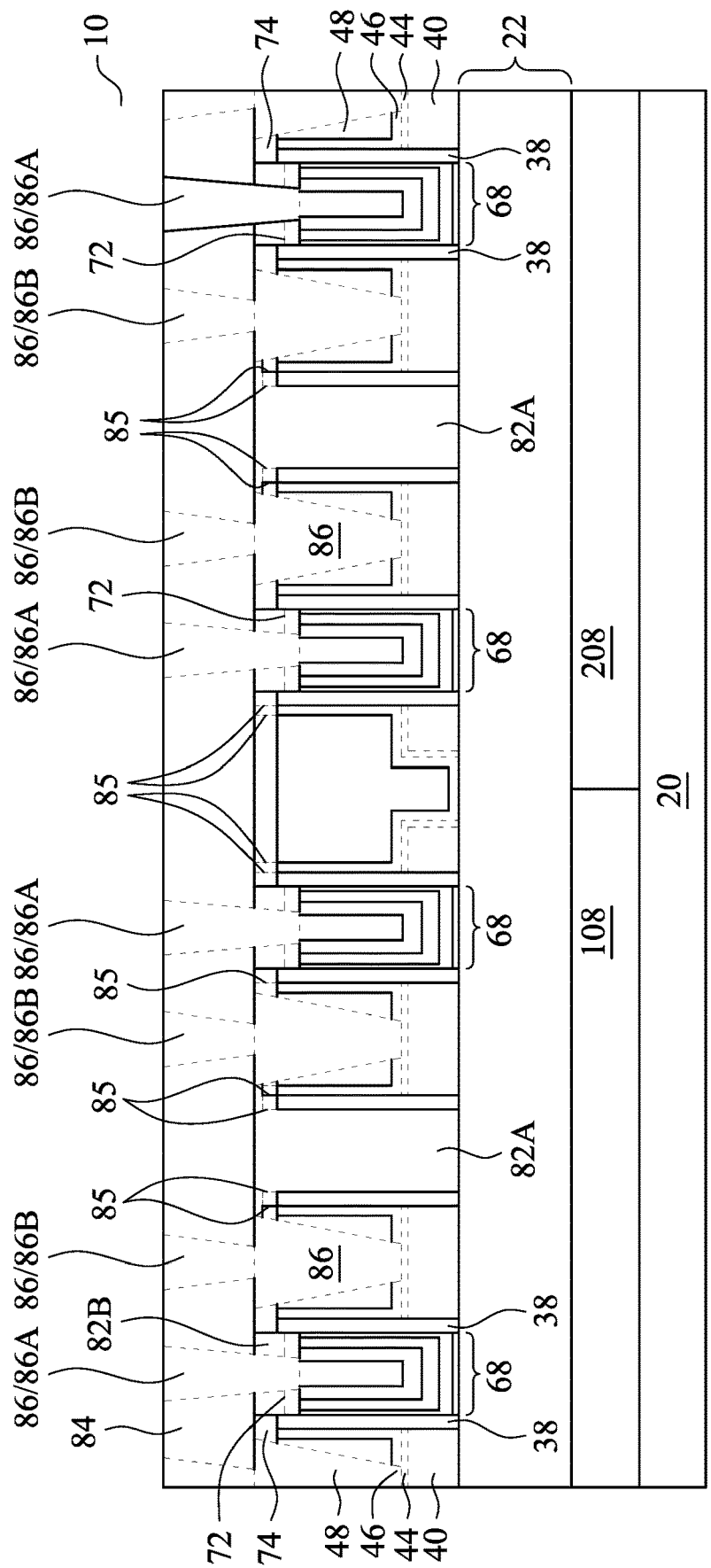

FIG. 18A illustrates the formation of Inter-Metal Dielectric (IMD) 84 and contact plugs 86 in accordance with some embodiments. The respective step is illustrated as step 332 in the process flow shown in FIG. 45. IMD 84 may have a thickness in the range between about 10 nm and about 50 nm, and may be formed of SiO, SiN, SiC, SiCN, SiOC, SiON, or SiOCN. Contact plugs 86 include gate contact plugs 86A and source/drain contact plugs 86B. It is appreciated that source/drain contact plugs 86B are in cross-section B-B (FIG. 13), and are not in the illustrated cross-section A-A. Accordingly, source/drain contact plugs 86B are illustrated as being dashed. Contact plugs 86 may be formed of W, Co, Ru, or Cu, and may or may not include a conductive barrier layer formed of titanium nitride, tantalum nitride, or the like. If inhibitor films 72 remain at this stage, gate contact plugs 76 will penetrate through inhibitor films 72.

Figure 27A:
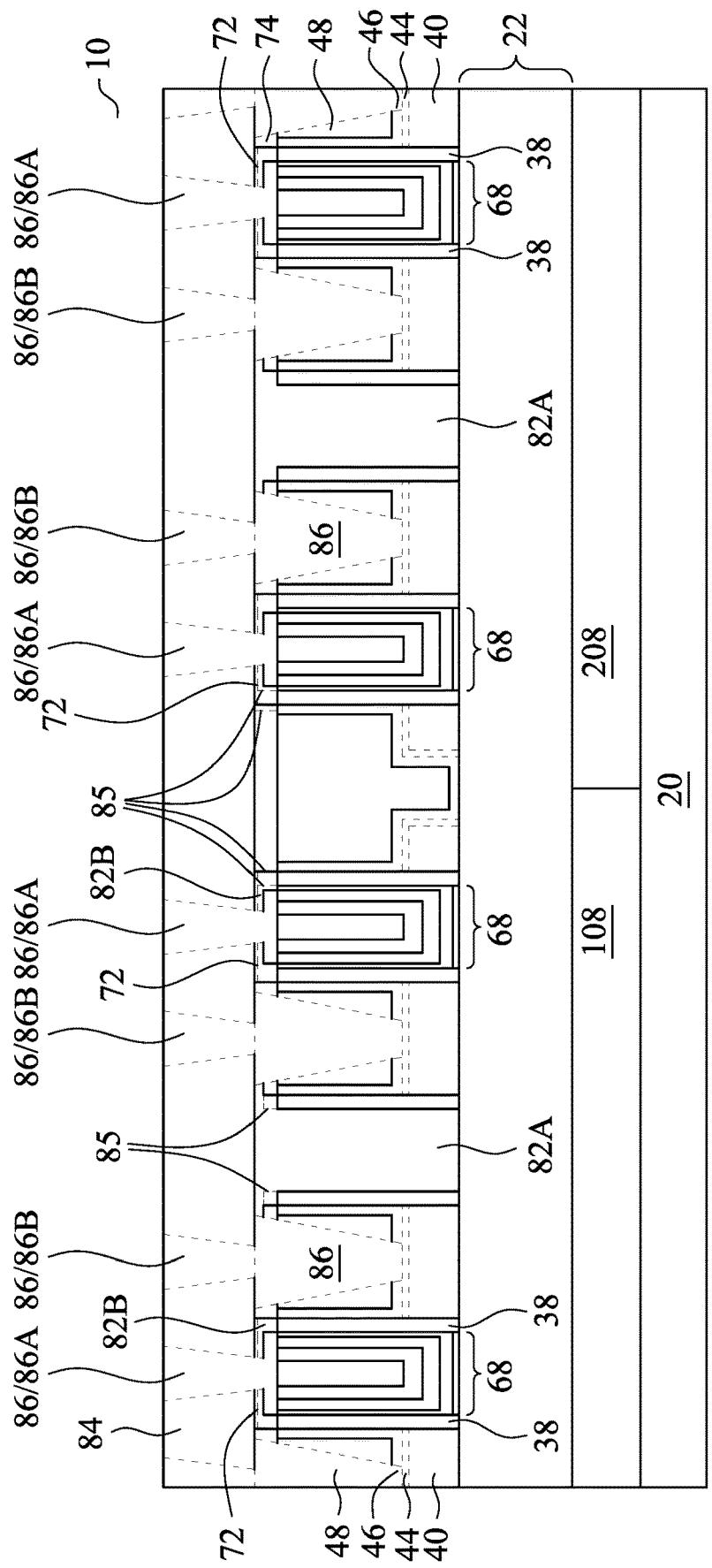
Figure 35:
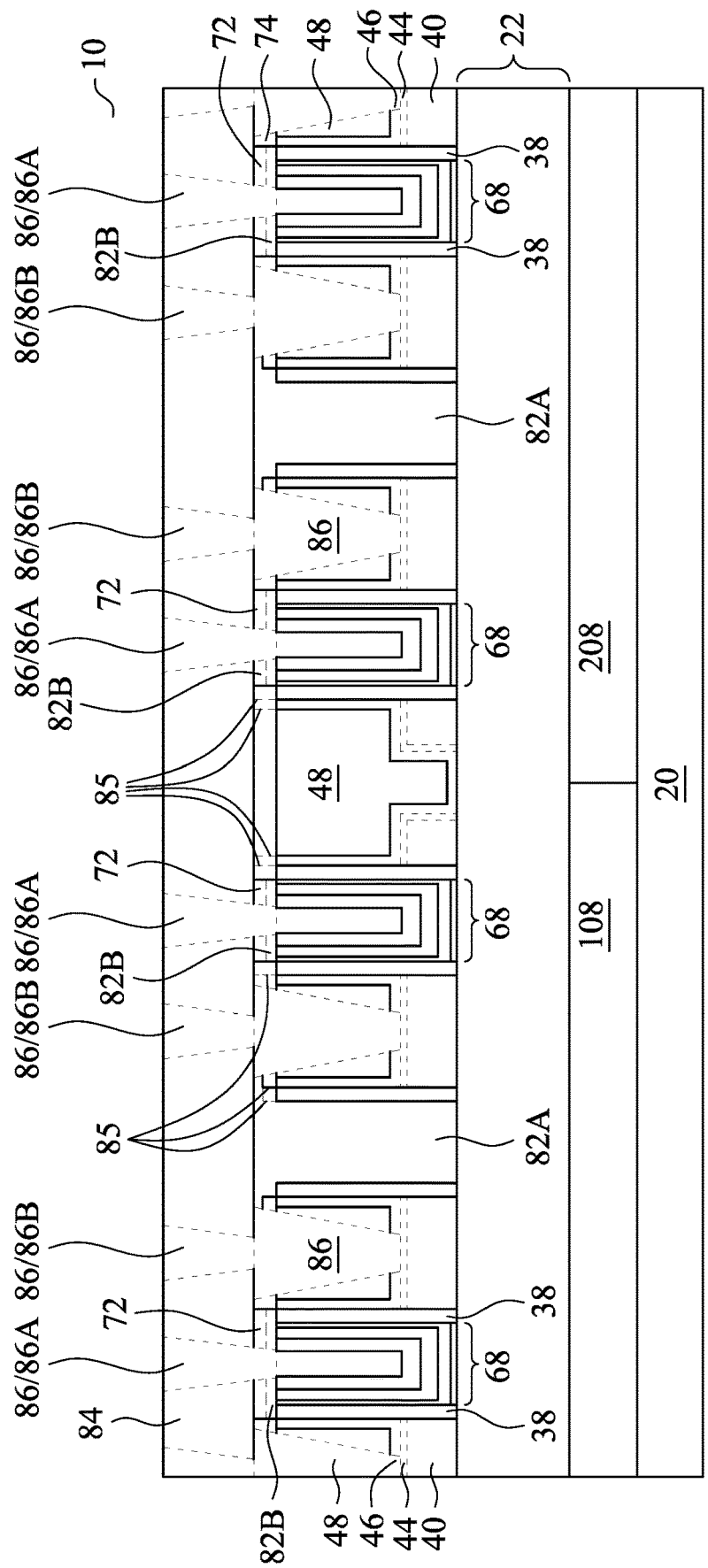
Figure 43A:
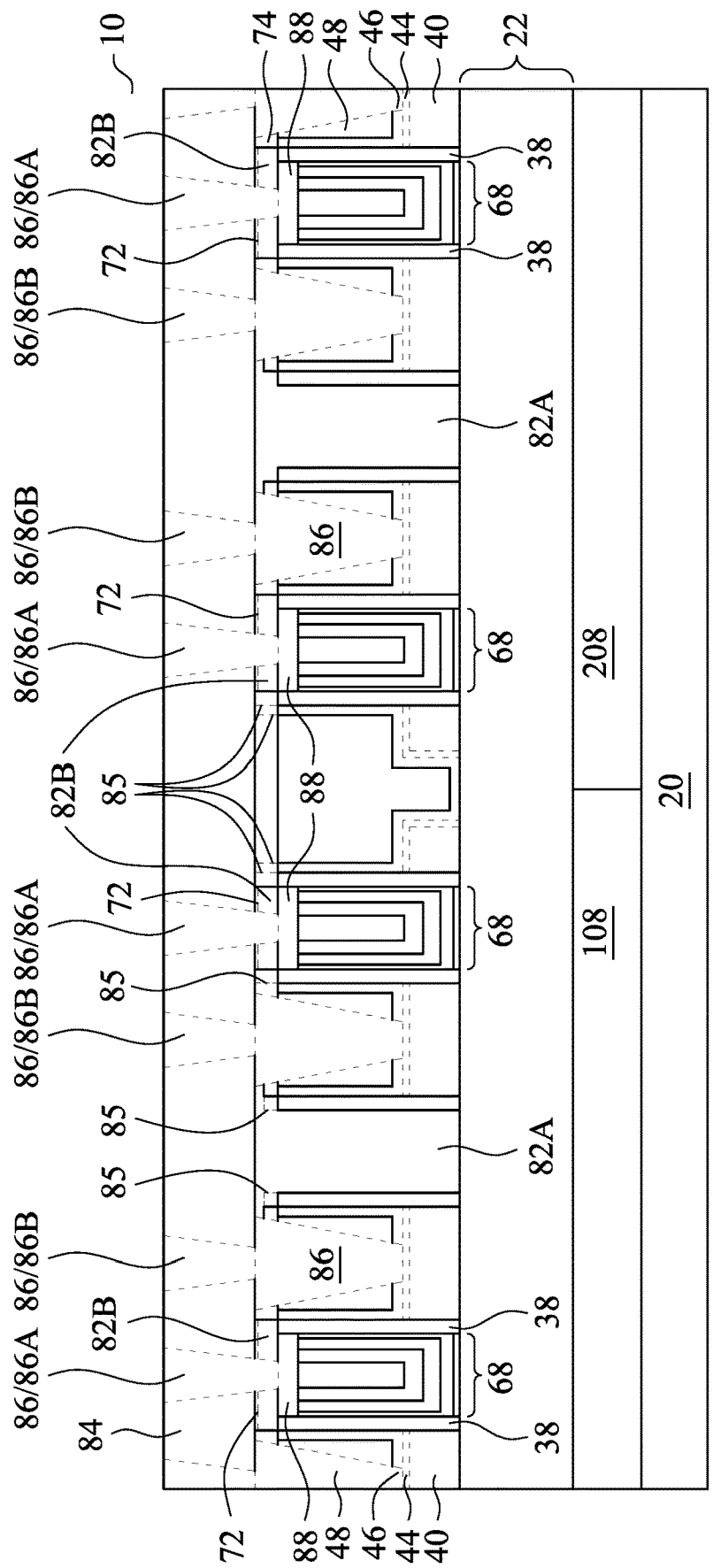

Since dielectric hard mask 74 may or may not extend directly over CESL 46 and/or gate spacers 38, FIG. 18A illustrates dashed lines 85 to show the likely positions of the edges of dielectric hard mask 74 in accordance with various embodiments. It is appreciated that if dielectric hard mask 74 does not extend on CESL 46 and/or gate spacers 38, gate hard masks 82B will extend on CESL 46 and/or gate spacers 38. Furthermore, dashed lines 85 are also shown in FIGS. 27A, 35, and 43A to indicate the possible positions of the edges of dielectric hard mask 74 in accordance with some other embodiments.

Figure 17B:
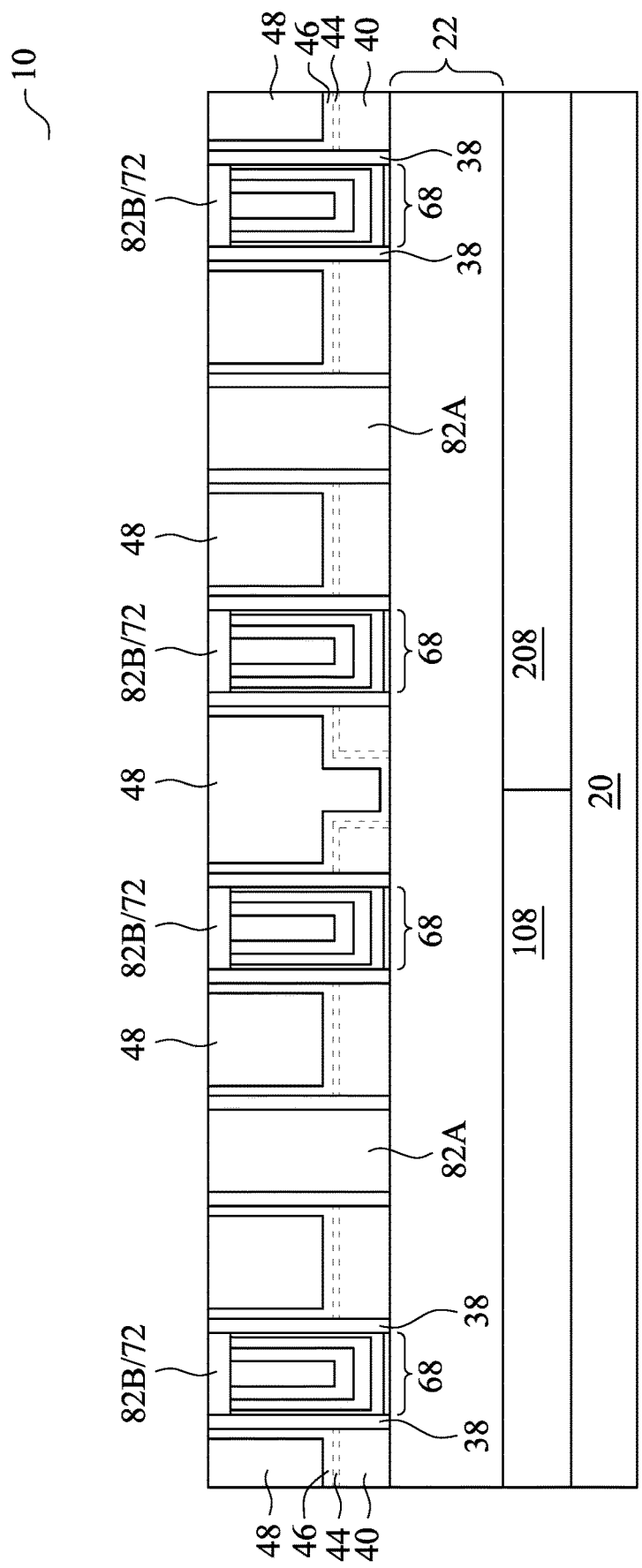
Figure 18B:
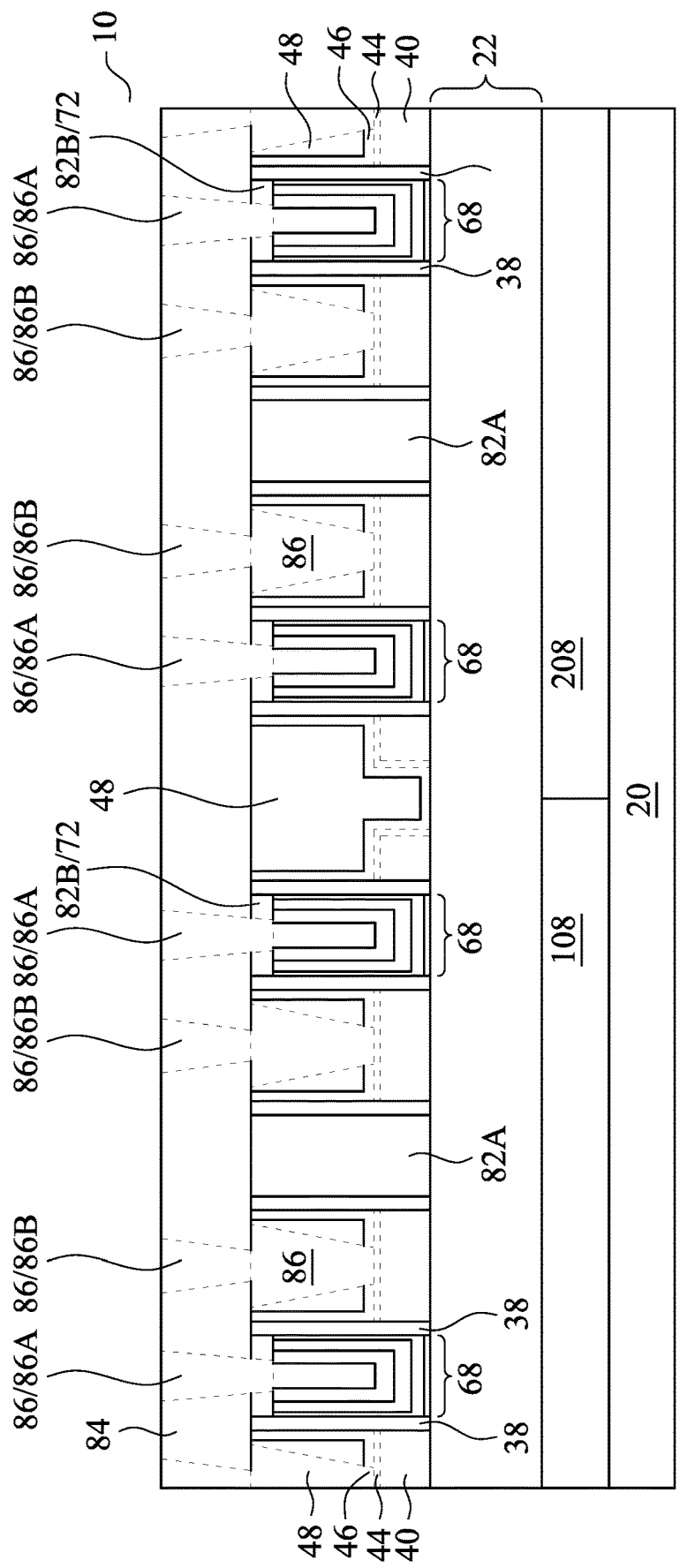
Figure 19:
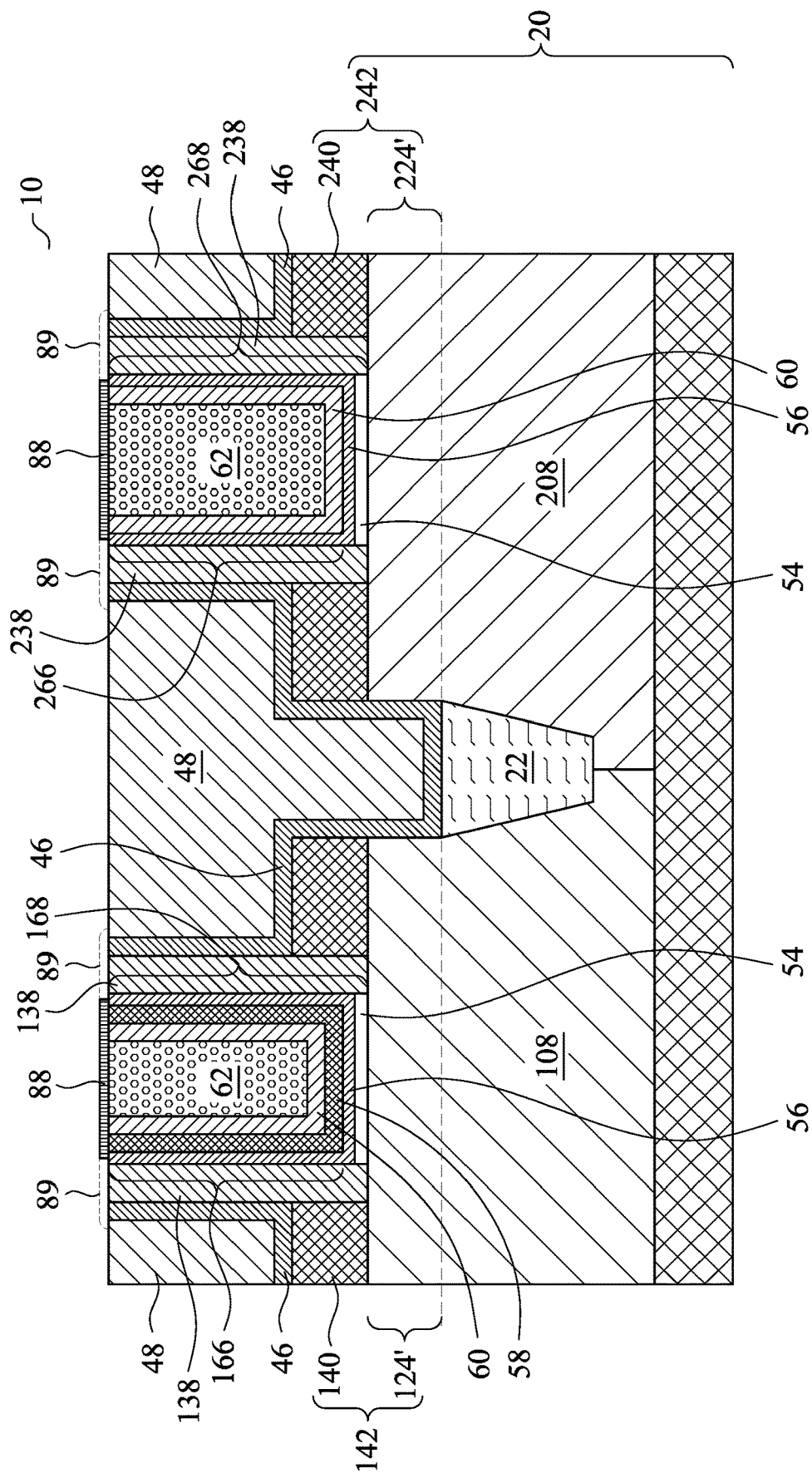

FIG. 17B illustrates the planarization process in accordance with alternative embodiments. Dielectric hard mask 74 as shown in FIG. 16 is fully removed in the planarization process, and ILD 48 is exposed. Accordingly, no dielectric hard mask 74 is left. FIG. 18B illustrates the respective IMD 84 and contact plugs 86. The illustrated regions directly over gates 68 may include gate hard masks 82B, inhibitor films 72, or composite layers including inhibitor films 72 and gate hard masks 82B over inhibitor films 72.

FIGS. 19 through 27A and 27B illustrate the cross-sectional views of intermediate stages including the cut-metal-gate process in accordance with some embodiments of the present disclosure. These embodiments are similar to the previously discussed embodiments, except metal layers are formed before the formation of inhibitor films, and metal gates are not recessed. Unless specified otherwise, the materials and the formation methods of the components in these embodiments are essentially the same as the like components, which are denoted by like reference numerals in the embodiments shown in FIGS. 1 through 18A and 18B. The details regarding the formation process and the materials of the components shown in FIGS. 19 through 27A and 27B (also FIGS. 29-35 and FIGS. 36 through 43A and 43B) may thus be found in the discussion of the embodiments shown in FIGS. 1 through 18A and 18B.

The initial steps of these embodiments are essentially the same as shown in FIGS. 1 through 8. Next, referring to FIG. 19, metal layers 88 are selectively deposited on gate electrodes 166 and 266 and high-k dielectric layers 56. The respective step is illustrated as step 319 in the process flow shown in FIG. 45. Metal layers 88 may, or may not, laterally extend on gate spacers 138 and 238 and CESL 46. Dashed lines 89 represent the extended portions of metal layers 88. Metal layers 88 may be formed using a selective deposition method such as electro-less plating. The formation may also be achieved through Atomic Layer Deposition (ALD), with the deposition recipe adjusted to achieve the selective deposition. Through the selective deposition, metal layers 88 are formed on gate electrodes 166 and 266, and possibly on high-k dielectric layers 56, gate spacers 138 and 238 and CESL 46, and not on ILD 48. In accordance with other embodiments, metal layers 88 are formed through a deposition process followed by an etching step. Metal layers 88 have the function of defining the locations and the sizes of the subsequently formed inhibitor films 72, and the deposition of inhibitor films 72 are easier. Also, by forming metal layers 88, the sizes of the subsequently formed inhibitor film 72 is laterally expanded.

Figure 20:
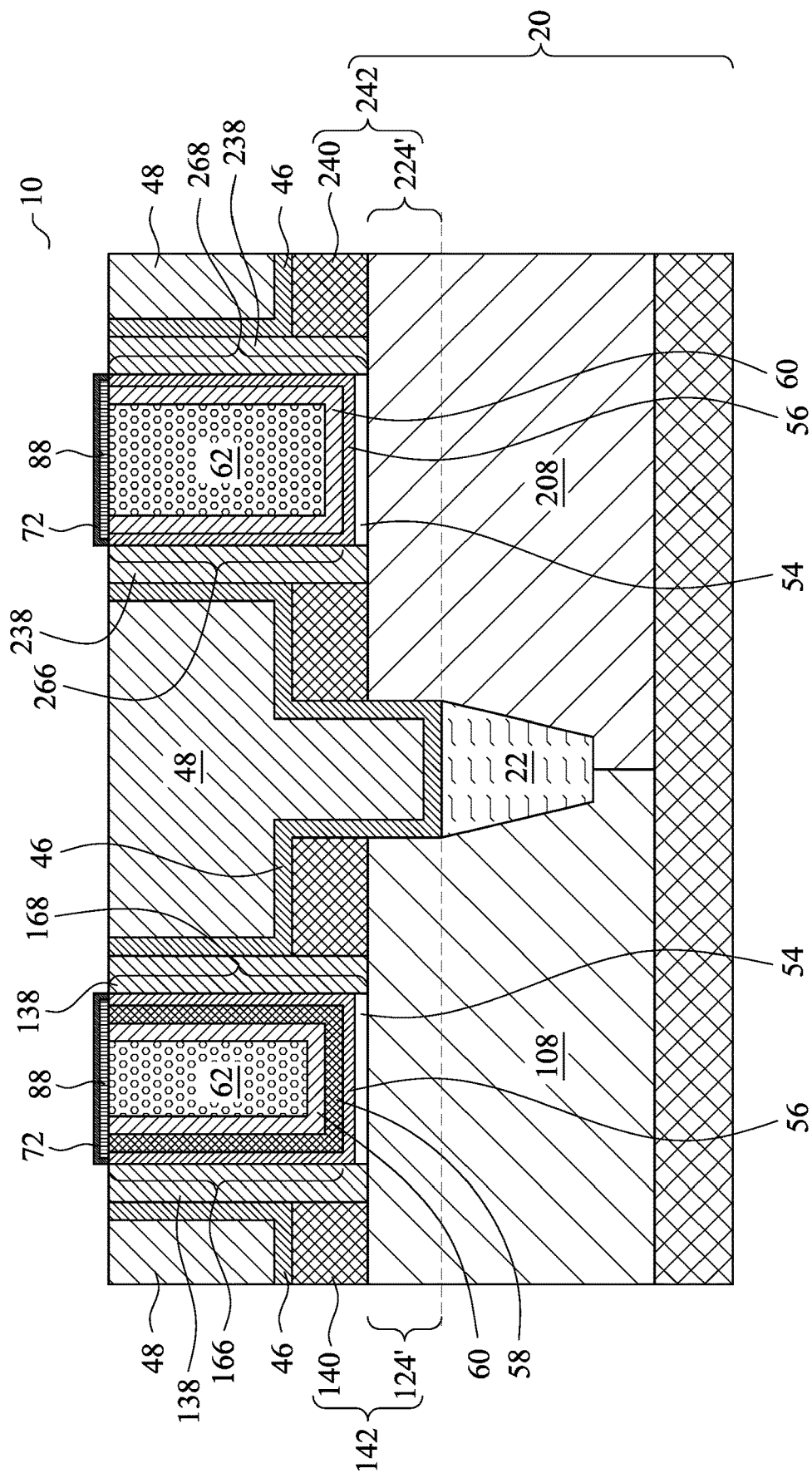

Referring to FIG. 20, inhibitor films 72 are formed on the top surfaces and sidewalls of metal layers 88. The available materials and the formation methods of inhibitor films 72 may be similar to what are discussed referring to FIG. 10, and are not discussed herein.

Figure 21:
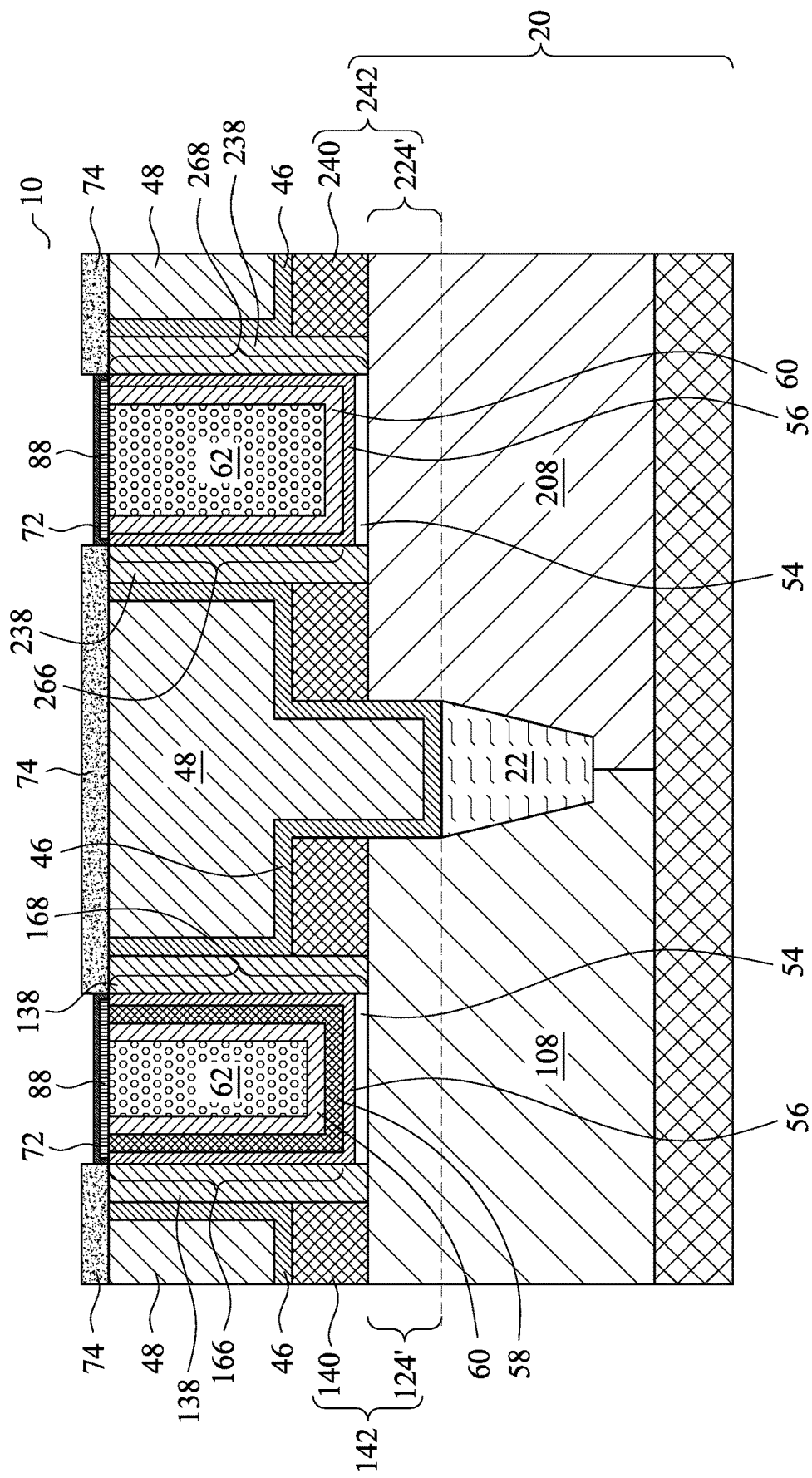

FIG. 21 illustrates the formation of dielectric hard mask 74, and the details have been discussed in the embodiments referring to FIG. 11. Inhibitor films 72 again prevent dielectric hard mask 74 from growing thereon. Accordingly, dielectric hard mask 74 is formed on ILD 48, and may or may not be formed on CESL 46 and gate spacers 138 and 238.

Figure 22:
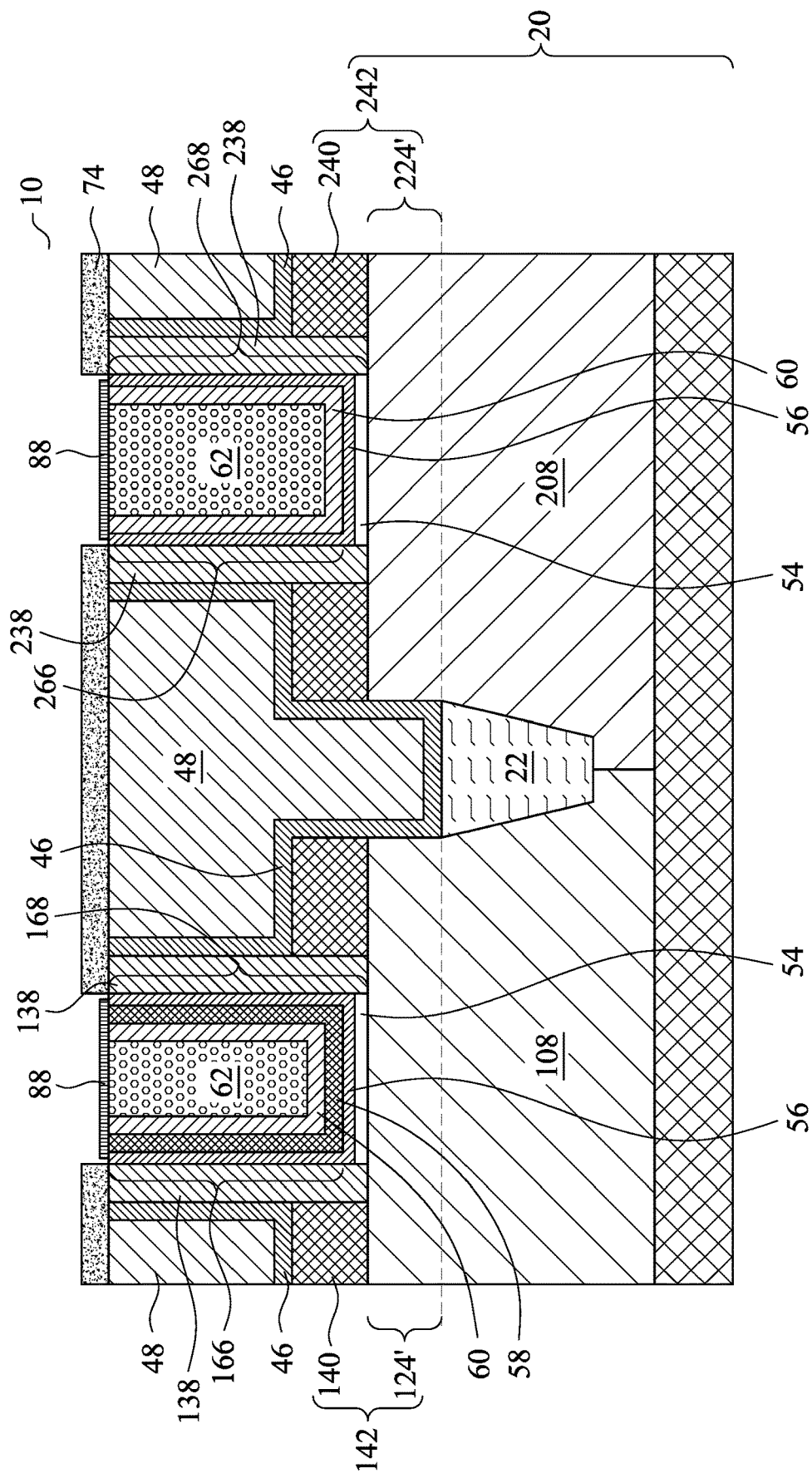
Figure 23:
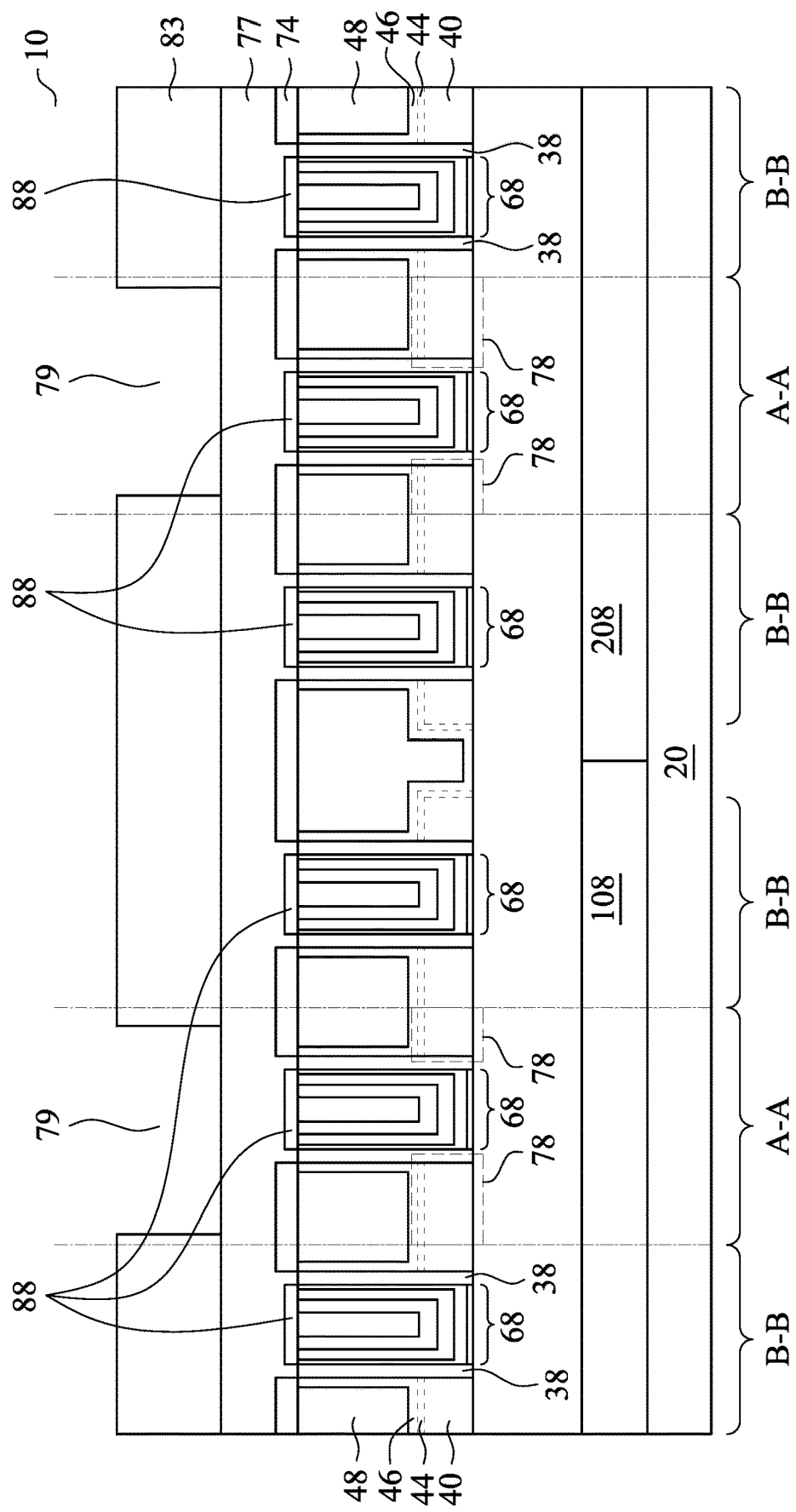

FIG. 22 illustrates the removal of inhibitor films 72 in accordance with some embodiments of the present disclosure. In accordance with alternative embodiments, inhibitor films 72 are not removed. Next, as shown in FIG. 23, BARC 77 and the patterned photo resist 83 are formed. The details regarding regions 78 and the regions marked as A-A and B-B are similar to what are discussed referring to FIG. 14, and are not repeated herein. The portions of gate stacks 68 that are to be cut are exposed to openings 79 in photo resist 83.

Figure 24:
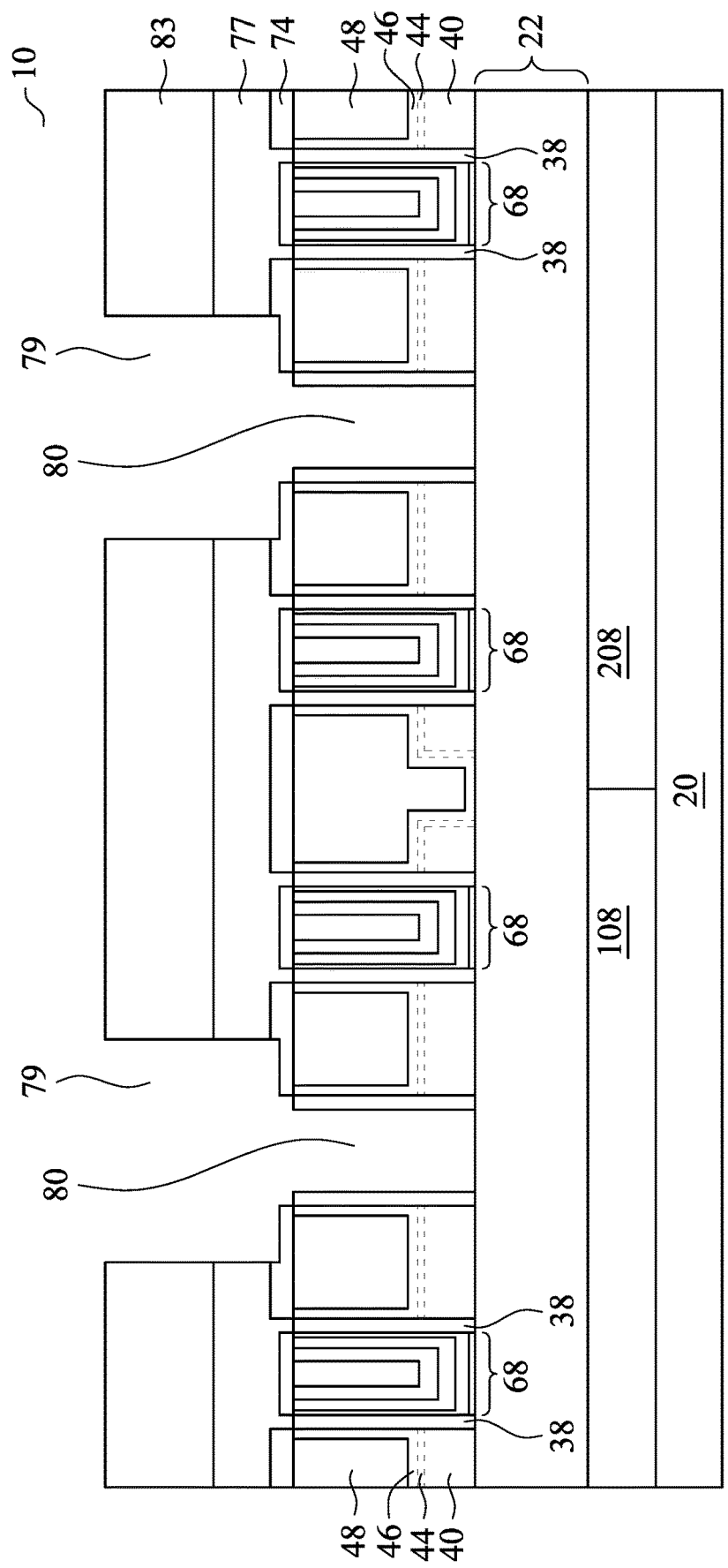
Figure 25:
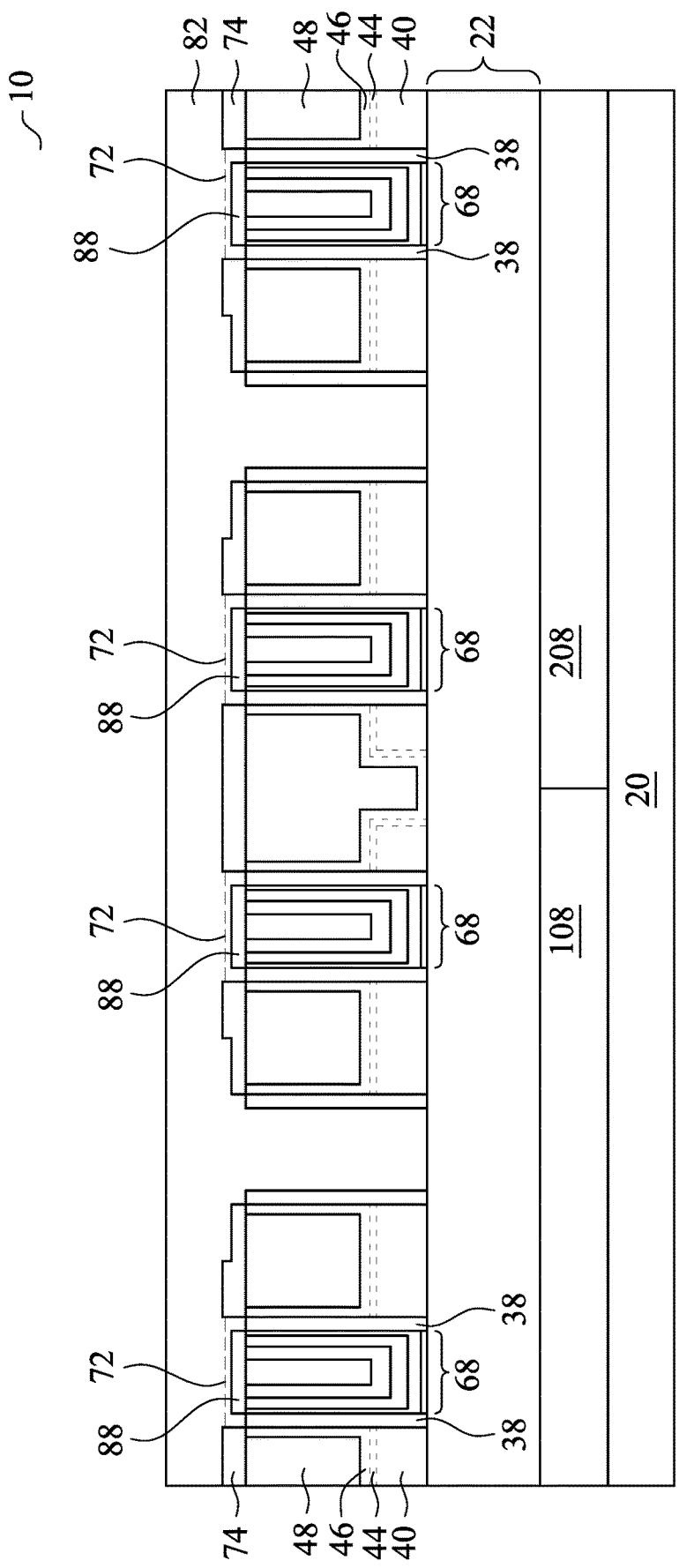

Next, the exposed portions of gate stacks 68 are etched, forming openings 80, as shown in FIG. 24. BARC 77 and the patterned photo resist 83 are then removed. FIG. 25 illustrates the filling of openings with isolation layer 82. In accordance with some embodiments of the present disclosure, isolation layer 82 is in contact with metal layers 88. In accordance with some embodiments in which inhibitor films 72 are not removed, as shown by dashed lines, isolation layer 82 is in contact with the top surfaces of inhibitor films 72.

Figure 26A:
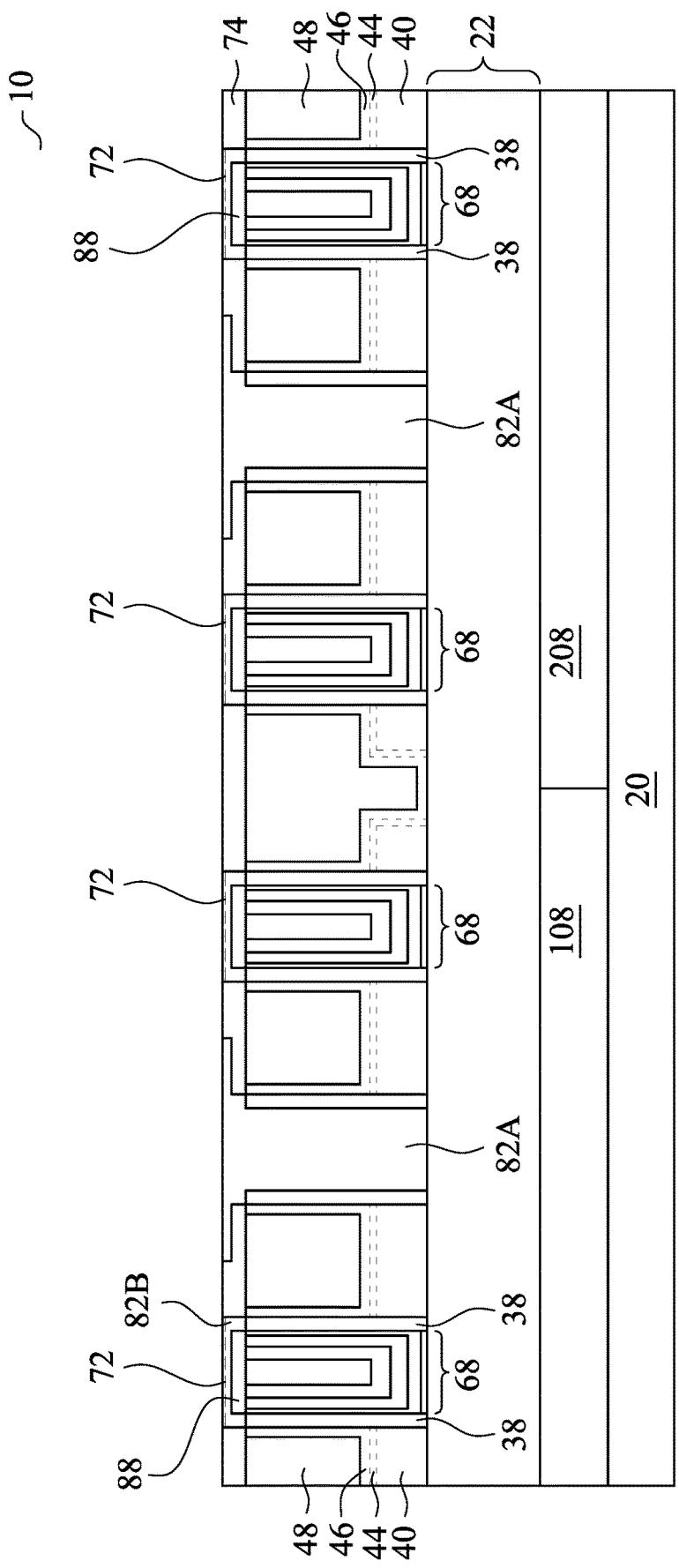

FIG. 26A illustrates the planarization of isolation layer 82, which stops on dielectric hard mask 74. Isolation regions 82A and gate hard masks 82B are thus formed. Inhibitor films 72 (if exist) or metal layers 88 may be exposed, depending on whether metal layers 88 are thicker than or thinner than dielectric hard mask 74, and whether inhibitor films 72 are removed or not. FIG. 27A illustrates the formation of IMD 84 and contact plugs 86.

Figure 26B:
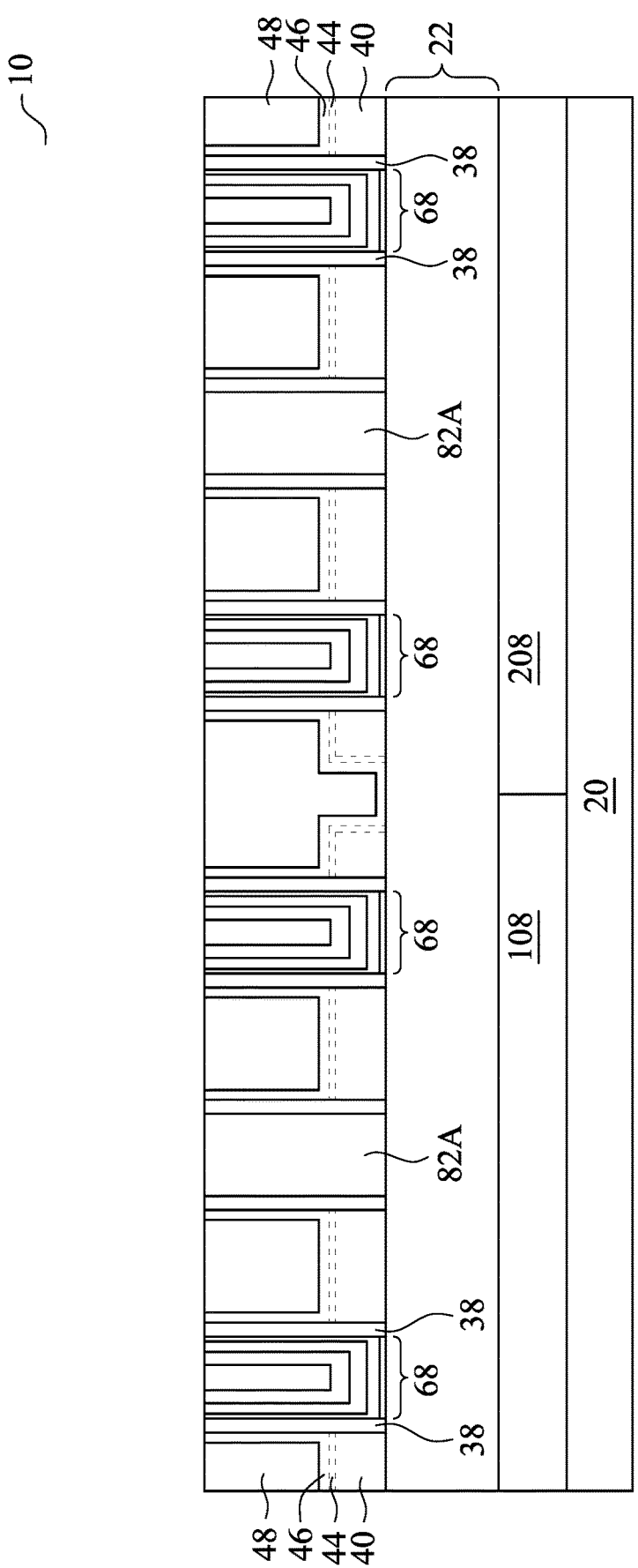
Figure 27B:
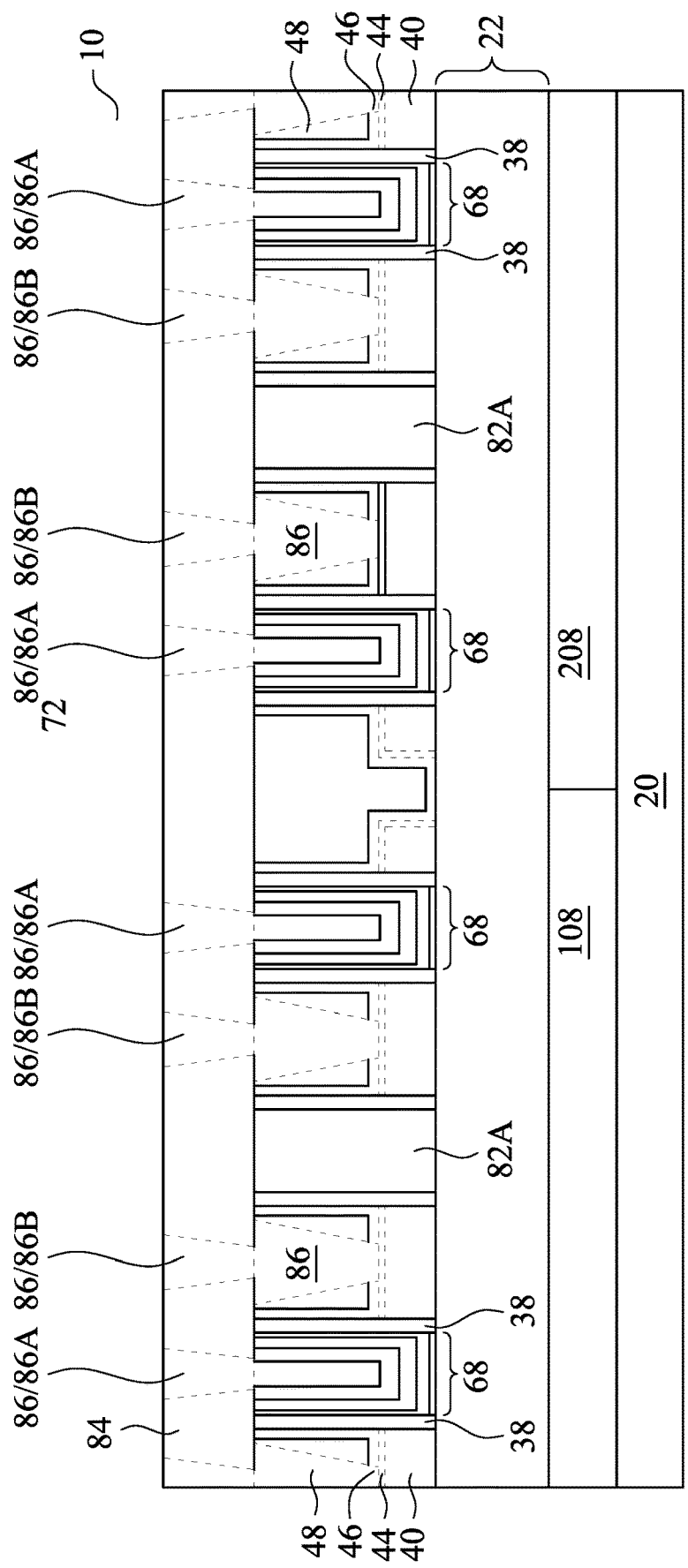
Figure 28:
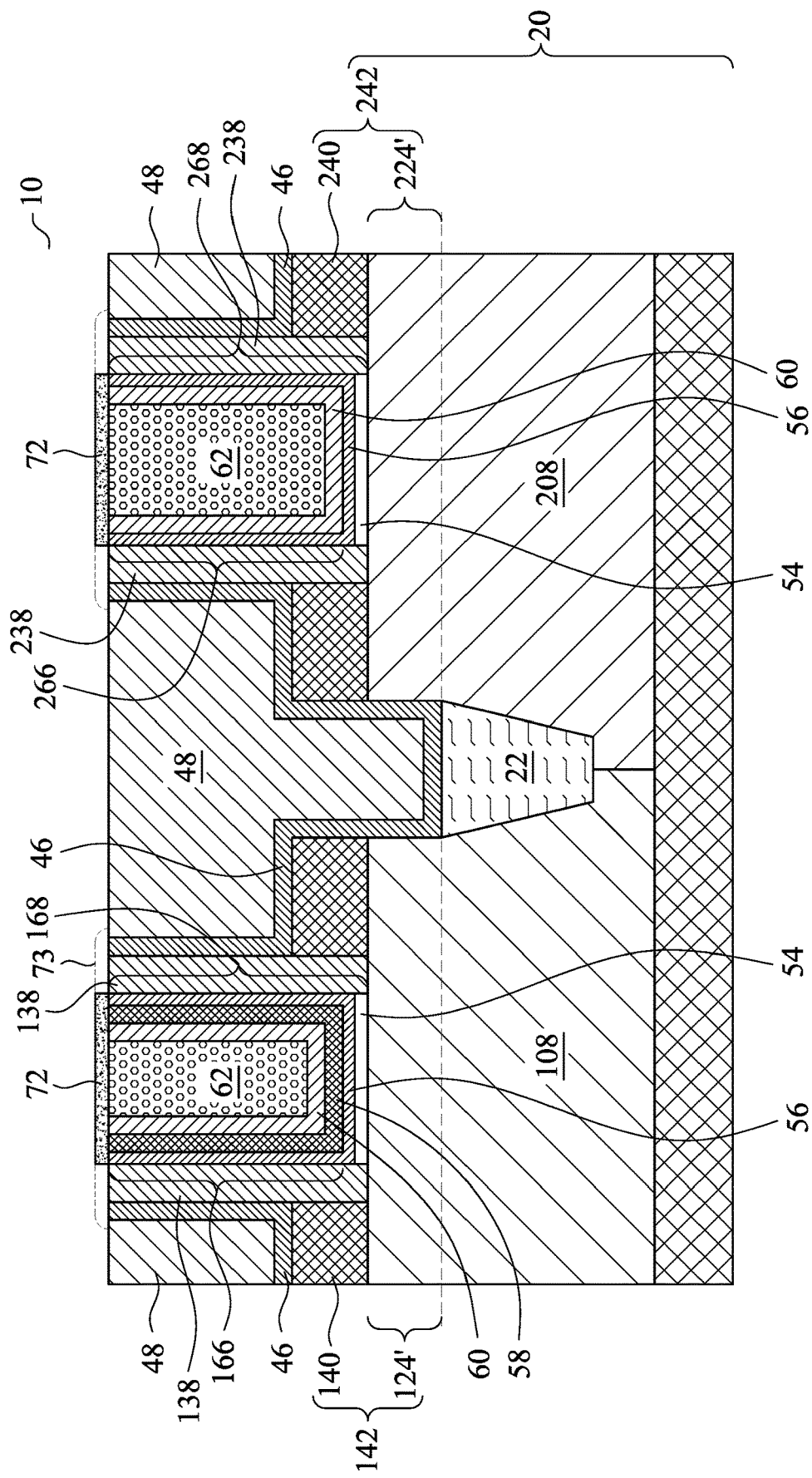
FIG. 28 through FIG. 35 illustrate the cross-sectional views and perspective views of intermediate stages in the formation of FinFETs in accordance with some embodiments.

FIG. 26B illustrates the planarization process in accordance with alternative embodiments. Dielectric hard mask 74 as shown in FIG. 25 is fully removed in the planarization process, and ILD 48 is exposed. Accordingly, no dielectric hard mask 74 is left. FIG. 27B illustrates the formation of IMD 84 and contact plugs 86.

FIGS. 28 through 35 illustrate the cross-sectional views of intermediate stages including the cut-metal-gate process in accordance with some embodiments of the present disclosure. These embodiments are similar to the previously discussed embodiments, except gate stacks are not recessed, and the inhibitor films are deposited directly on the metal gates. The initial steps of these embodiments are essentially the same as shown in FIGS. 1 through 8. Next, referring to FIG. 28, inhibitor films 72 are selectively deposited on gate electrodes 166 and 266. Inhibitor films 72 may, or may not, laterally extend on high-k dielectric layers 56, gate spacers 138 and 238 and CESL 46. Dashed lines 73 represent the extended portions of inhibitor films 72. Through the selective deposition, inhibitor films 72 are formed on gate electrodes 166 and 266 and high-k dielectric layers 56, possibly on gate spacers 138 and 238 and CESL 46, and not on ILD 48. The available materials and the formation methods of inhibitor films 72 may be similar to what are discussed referring to FIG. 10, and are not discussed herein.

Figure 29:
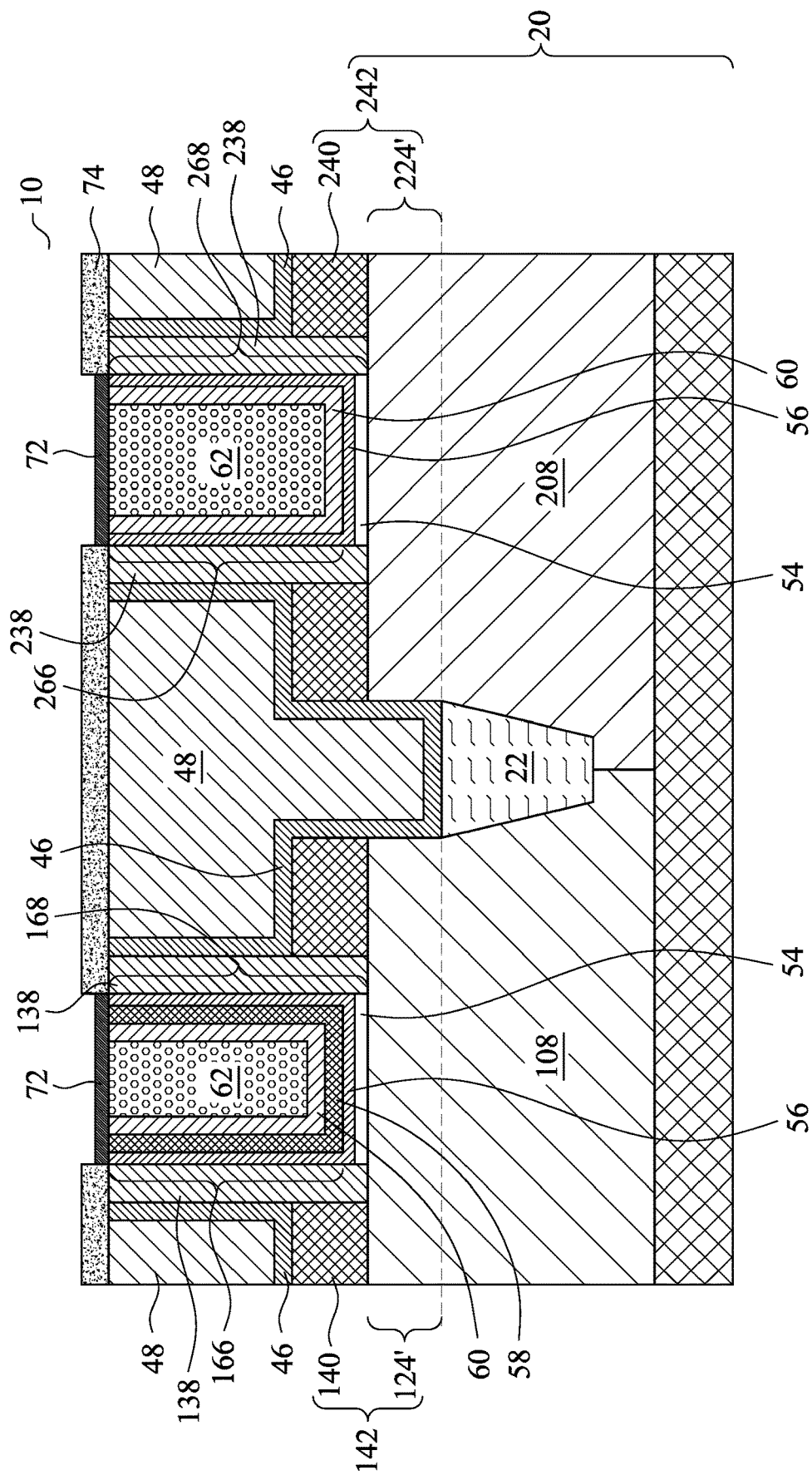

FIG. 29 illustrates the formation of dielectric hard mask 74, and the details have been discussed in the embodiments referring to FIG. 11. Inhibitor films 72 prevent dielectric hard mask 74 from growing thereon. Accordingly, dielectric hard mask 74 is formed on ILD 48, and may or may not be formed on high-k dielectric layers 56, CESL 46 and gate spacers 138 and 238.

Figure 30:
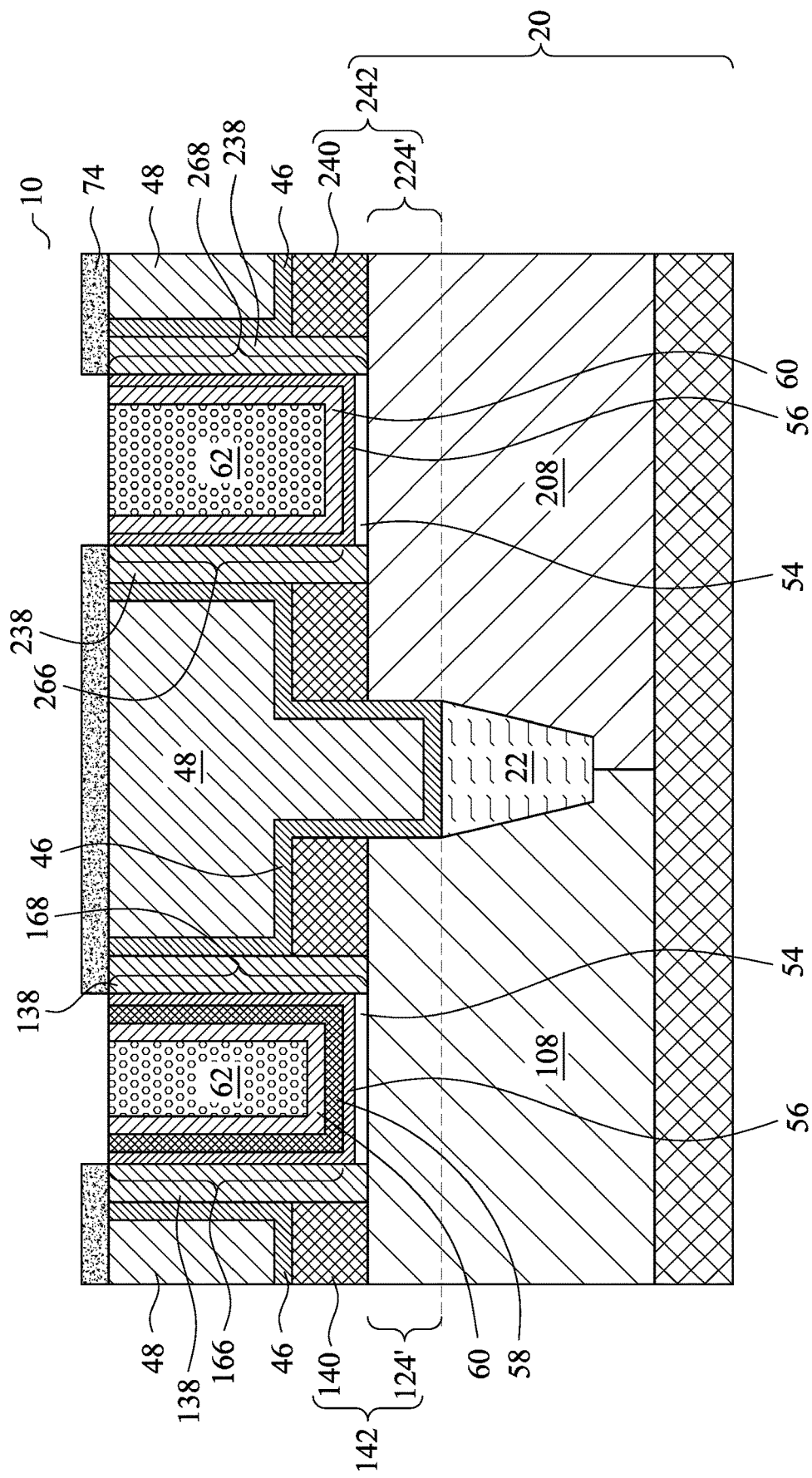
Figure 31:
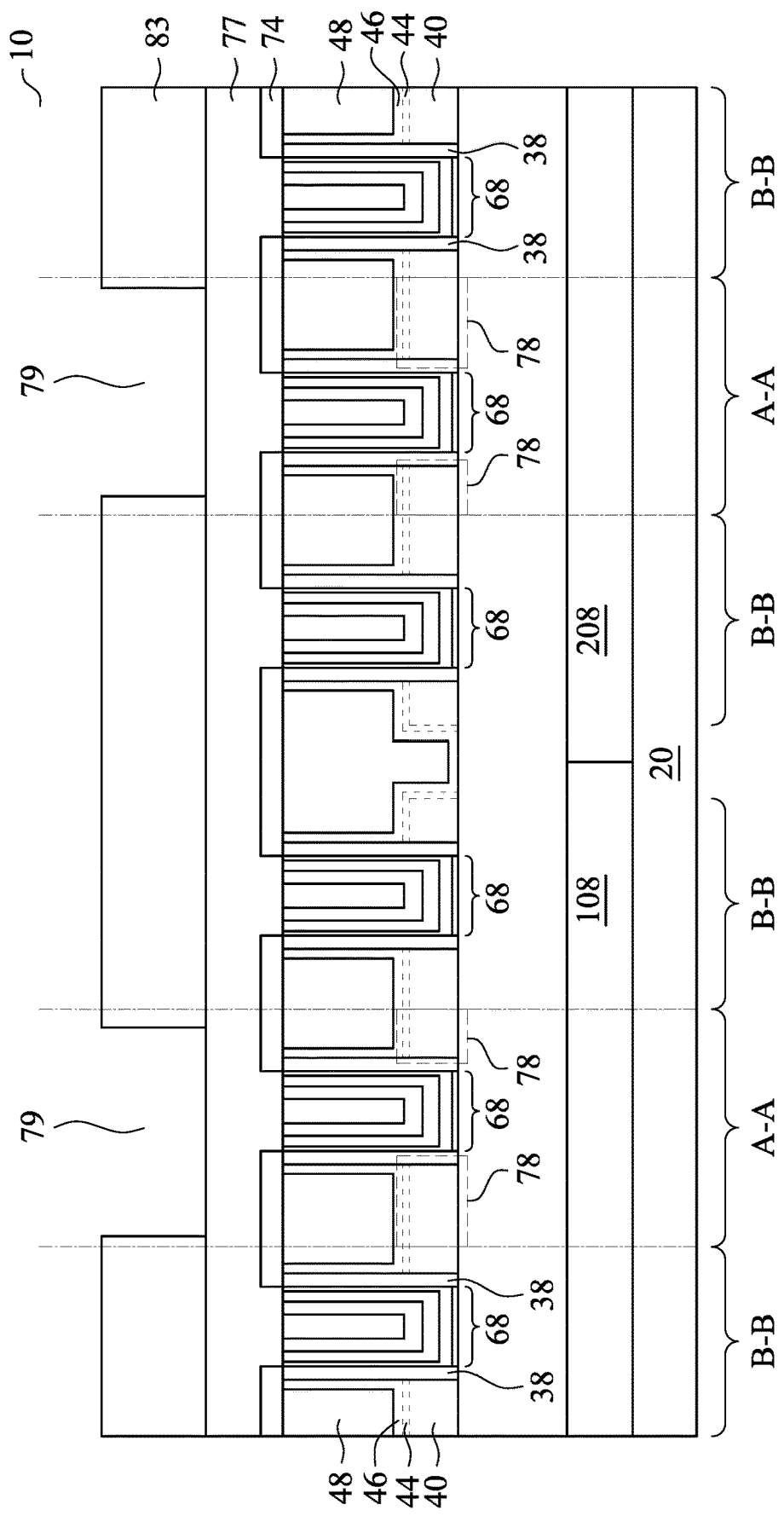

Inhibitor films 72 are removed in accordance with some embodiments of the present disclosure, and the resulting structure is shown in FIG. 30. In accordance with alternative embodiments, inhibitor films 72 are not removed, and the step shown in FIG. 30 is skipped. Next, as shown in FIG. 31, BARC 77 and the patterned photo resist 83 are formed. The details regarding regions 78 and the regions marked as A-A and B-B are similar to what are discussed referring to FIG. 14, and are not repeated herein. The portions of gate stacks 68 that are to be cut are exposed to openings 79 in photo resist 83.

Figure 32:
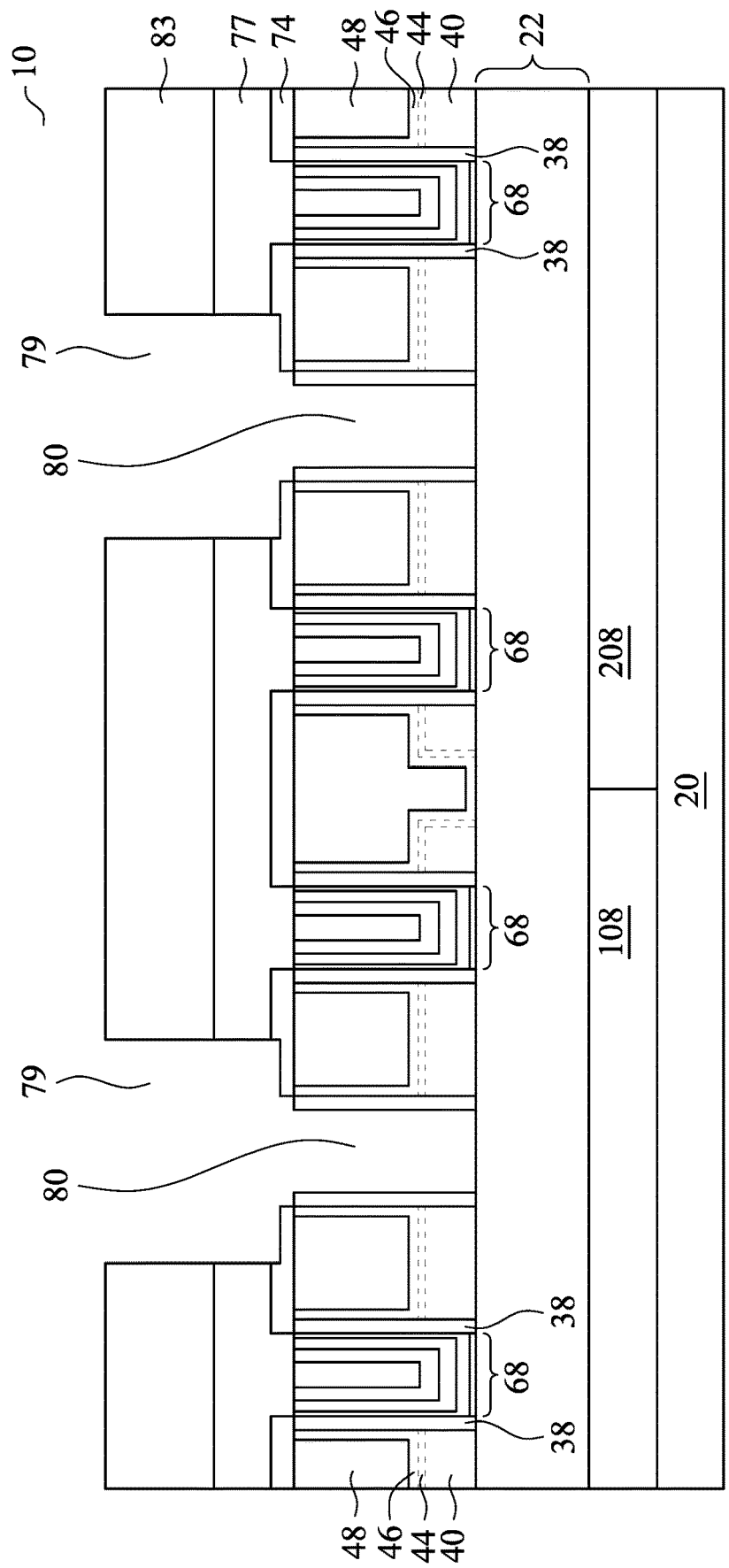
Figure 33:
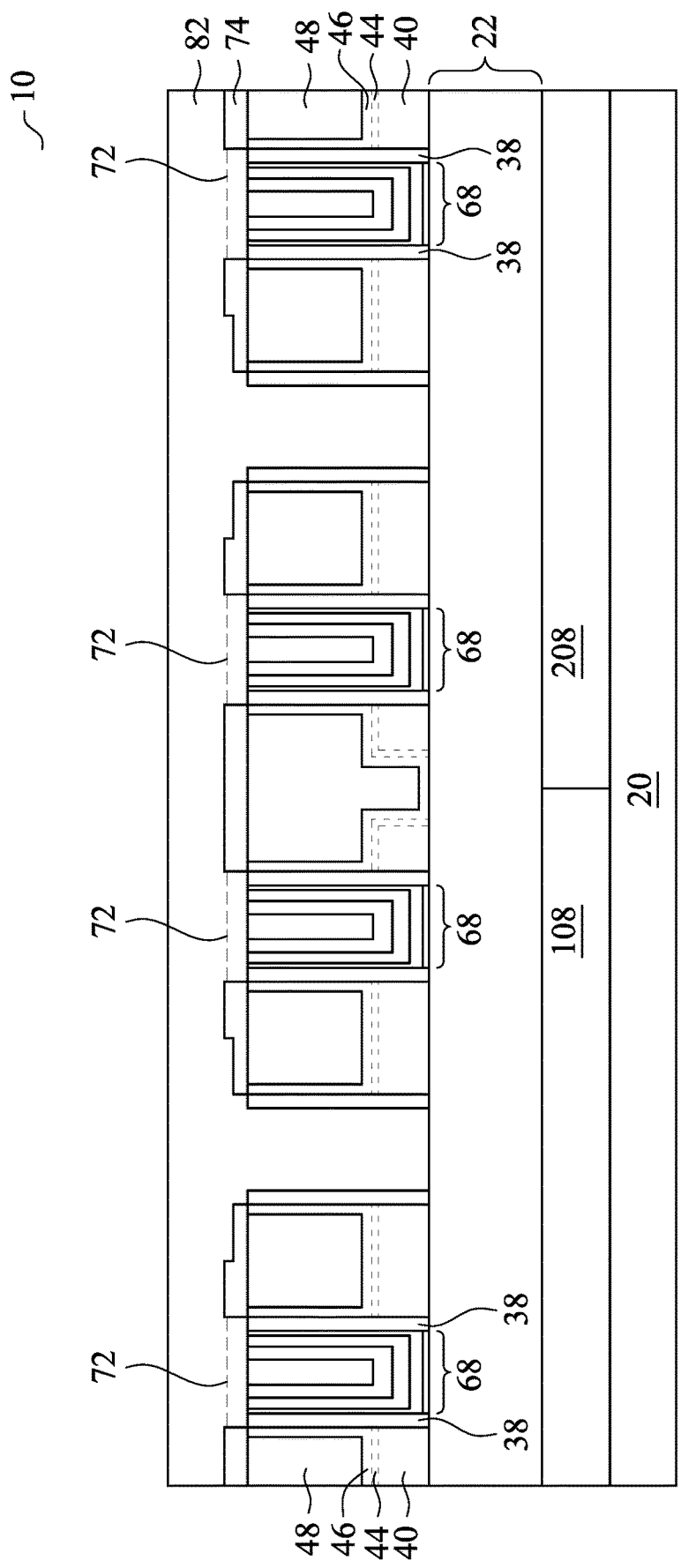

Next, the exposed portions of gate stacks 68 are etched, forming openings 80, as shown in FIG. 32. BARC 77 and the patterned photo resist 83 are then removed. FIG. 33 illustrates the filling of the openings with isolation layer 82. In accordance with some embodiments of the present disclosure, isolation layer 82 is in contact with gate stacks 68. In accordance with alternative embodiments in which inhibitor films 72 (as shown by dashed lines) are not removed, isolation layer 82 is in contact with inhibitor films 72.

Figure 34:
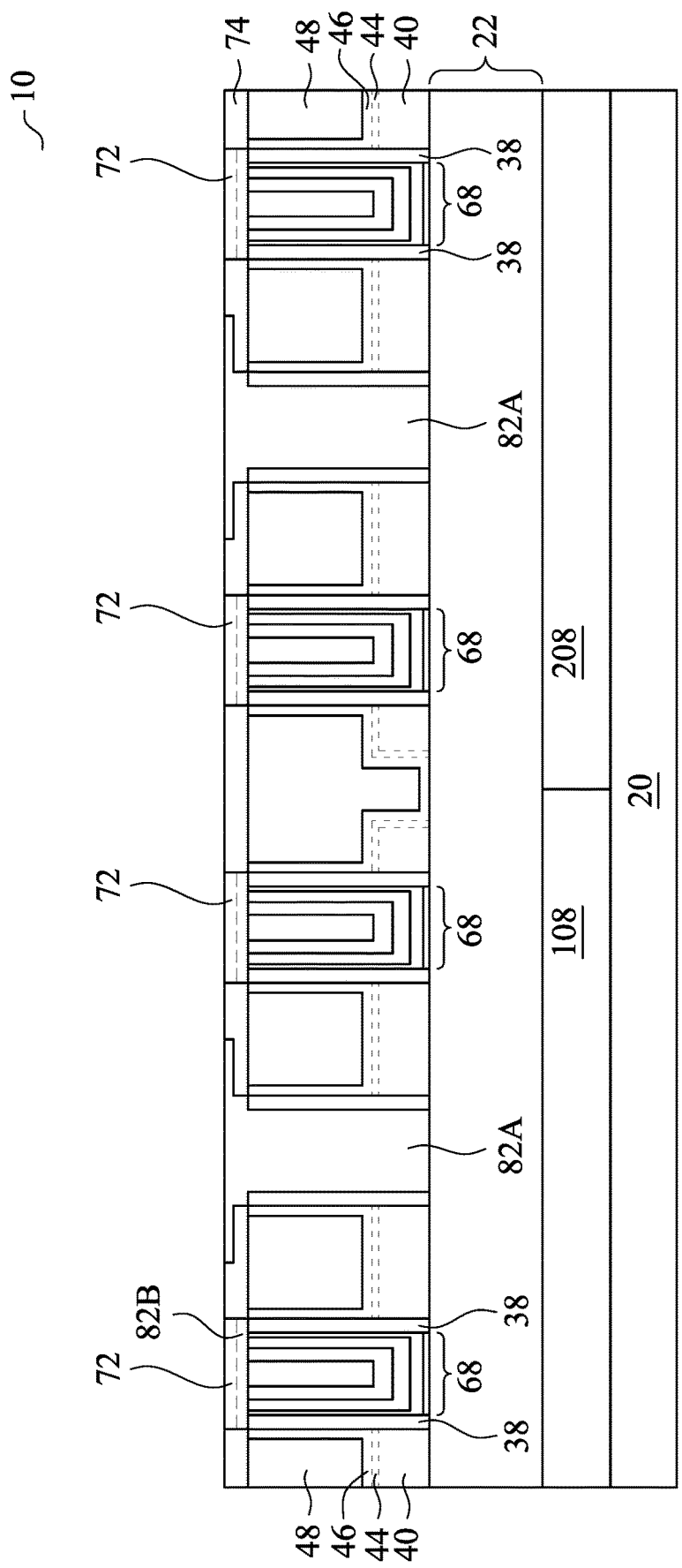

FIG. 34 illustrates the planarization of isolation layer 82, which stops on dielectric hard mask 74. Isolation regions 82A and gate hard masks 82B are thus formed. Inhibitor films 72 may be exposed, depending on whether inhibitor films 72 are removed or not, and whether inhibitor films 72 are thicker than or thinner than dielectric hard mask 74. FIG. 35 illustrates the formation of IMD 84 and contact plugs 86.

In accordance with alternative embodiments, the planarization process stops on gate stacks 68 and ILD 48. Dielectric hard mask 74 as shown in FIG. 33 is fully removed in the planarization process, and ILD 48 is exposed. The resulting structure is essentially the same as shown in FIG. 26B. FIG. 27B illustrates the formation of IMD 84 and contact plugs 86 in accordance with these embodiments.

FIGS. 36 through 43A and 43B illustrate the cross-sectional views of intermediate stages including the cut-metal-gate process in accordance with some embodiments of the present disclosure. These embodiments are similar to the previously discussed embodiments, except the gate stacks are recessed, and metal layers are formed in the recesses.

Figure 36:
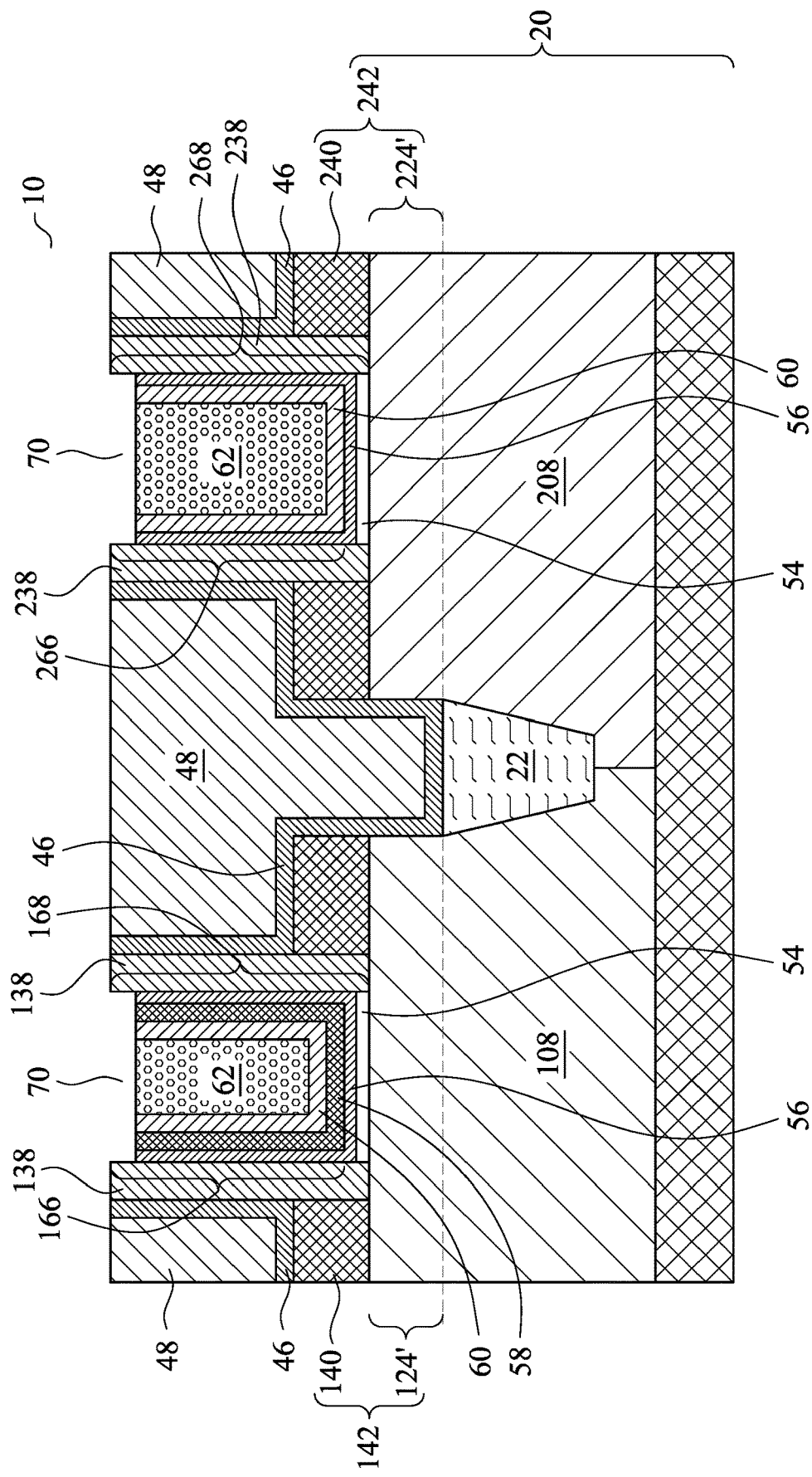
Figure 37:
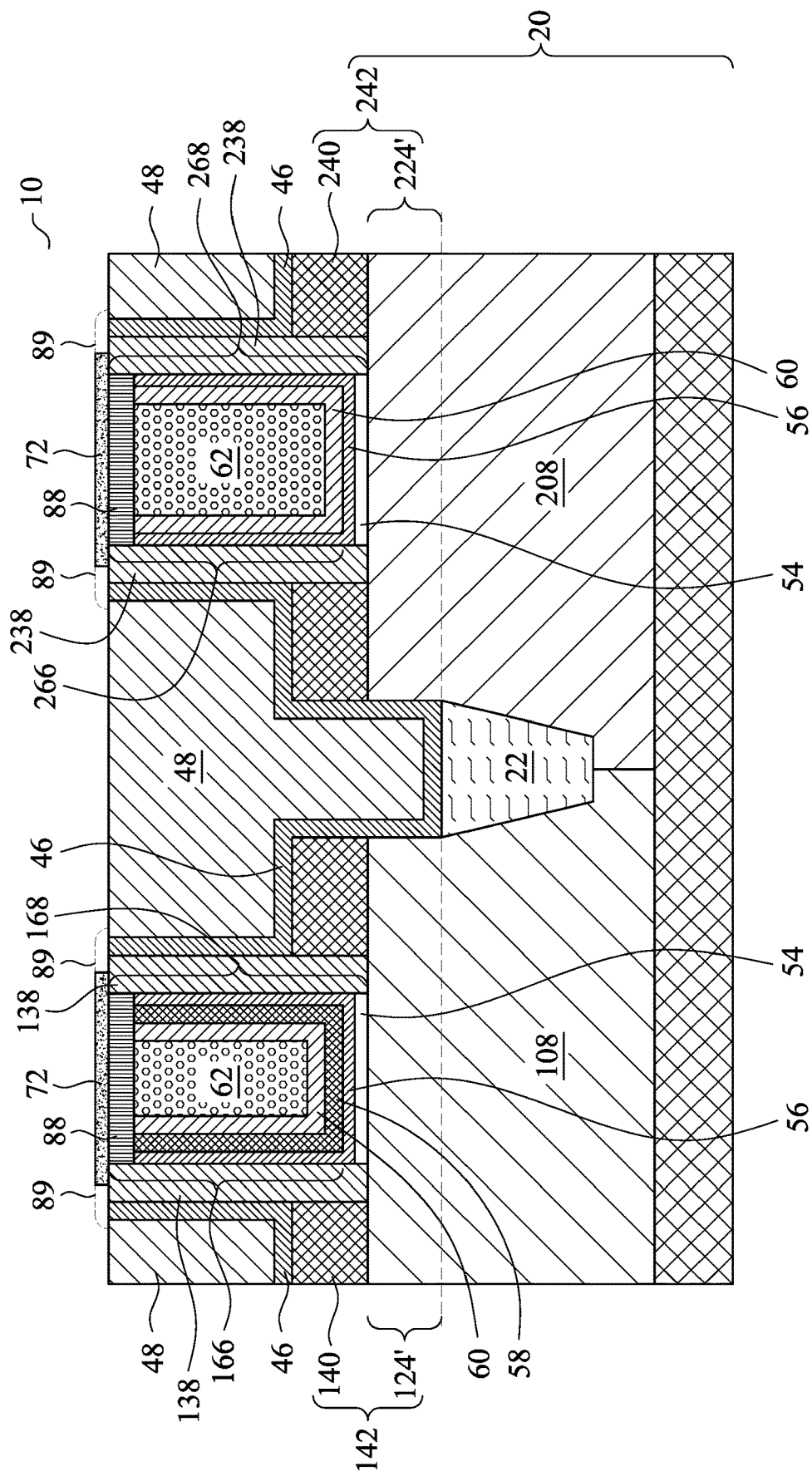

The initial steps of these embodiments are essentially the same as shown in FIGS. 1 through 8. Next, referring to FIG. 36, recesses 70 are formed by etching gate stacks 168 and 268. Referring to FIG. 37, metal layers 88 and inhibitor 72 are selectively deposited from recesses 70. Metal layers 88 may, or may not, laterally extend on gate spacers 138 and 238 and CESL 46. Through the selective deposition, metal layers 88 are formed on gate electrodes 166 and 266, possibly on high-k dielectric layers 56, gate spacers 138 and 238 and CESL 46, and not on ILD 48. The available materials and the formation methods of metal layers 88 and inhibitor 72 may be similar to what are discussed referring to FIGS. 19 and 20, and are not repeated herein. The thickness of metal layers 88 may be greater than, equal to, or smaller than, the depths of recesses 70 (FIG. 36).

Figure 38:
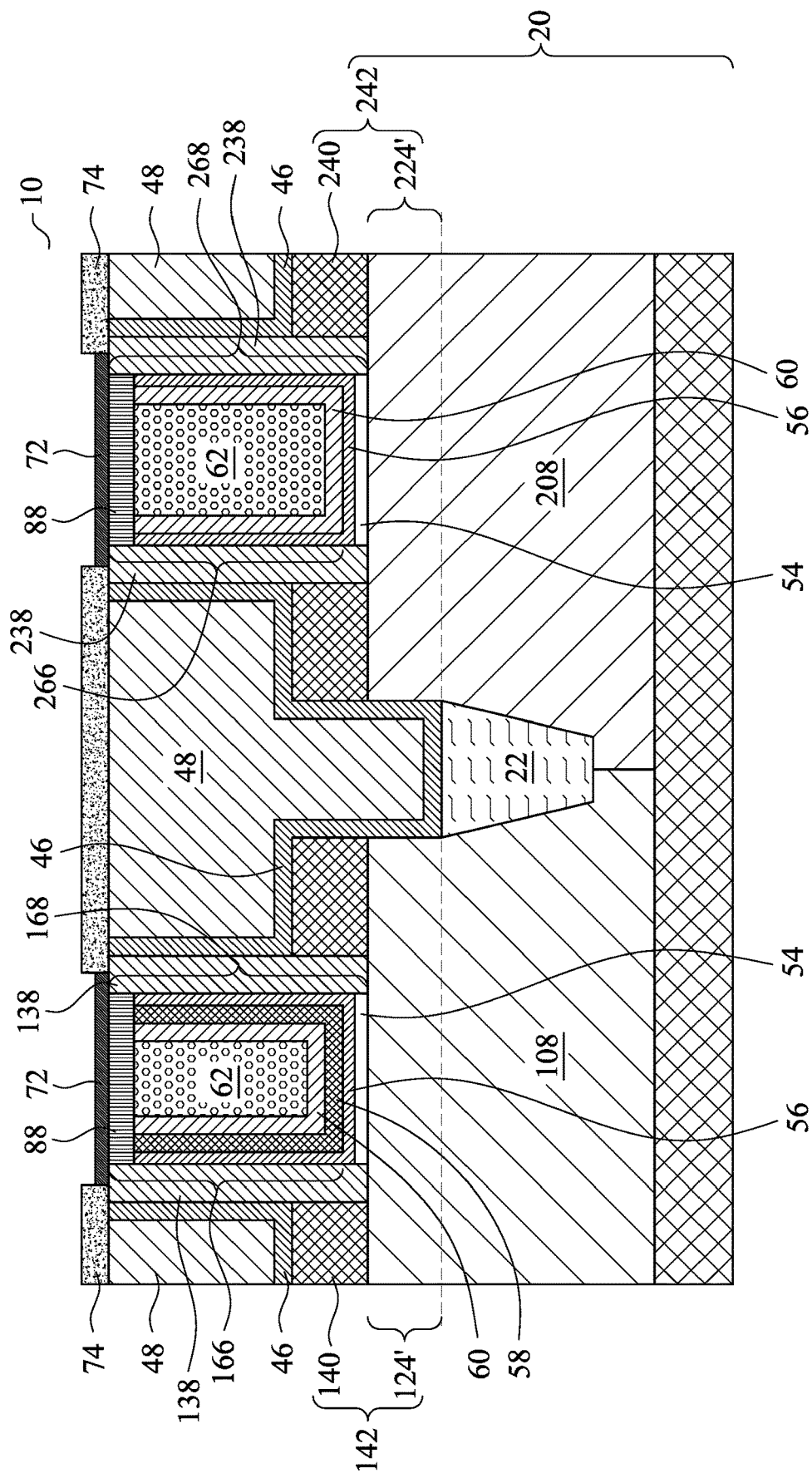

FIG. 38 illustrates the formation of dielectric hard mask 74, and the details have been discussed in the embodiments referring to FIG. 11. Inhibitor films 72 prevent dielectric hard mask 74 from growing thereon. Accordingly, dielectric hard mask 74 is formed on ILD 48, and may or may not extend on CESL 46 and gate spacers 138 and 238. After the formation of dielectric hard mask 74, inhibitor films 72 may be removed, or may be left without being removed.

Figure 39:
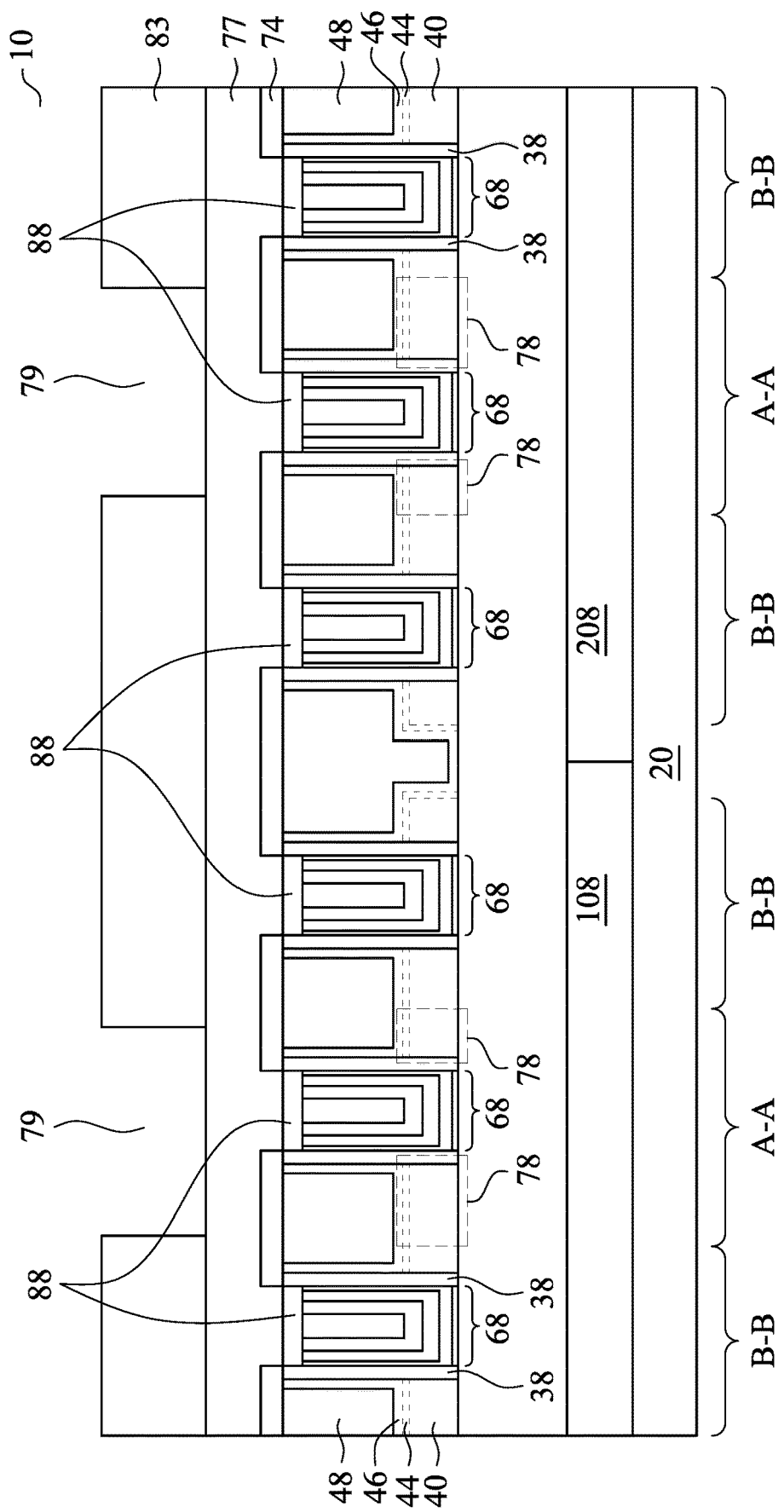

FIG. 39 illustrates the formation of BARC 77 and the patterned photo resist 83. The details regarding regions 78 and the regions marked as A-A and B-B are similar to what are discussed referring to FIG. 14, and are not repeated herein. The portions of gate stacks 68 that are to be cut are exposed to openings 79 in photo resist 83.

Figure 40:
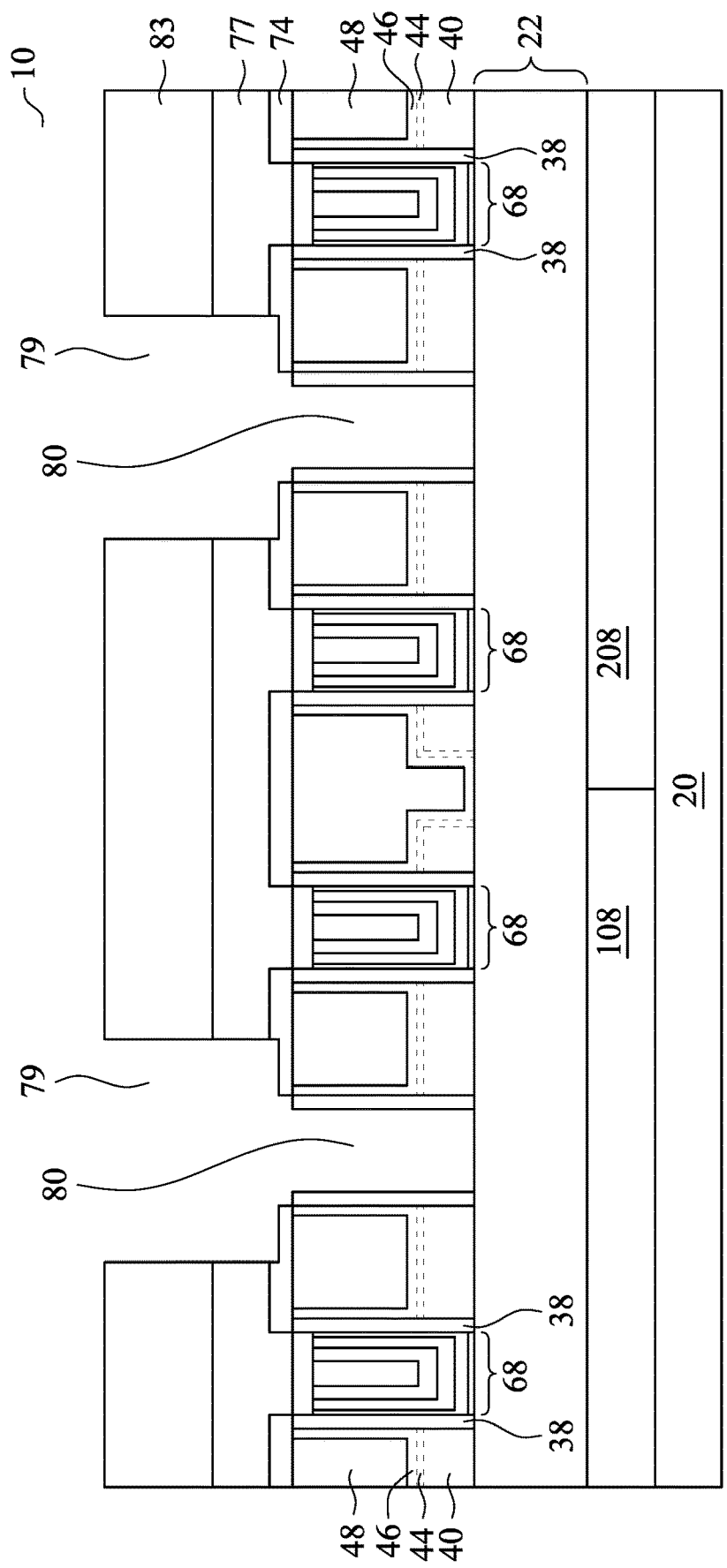
Figure 41:
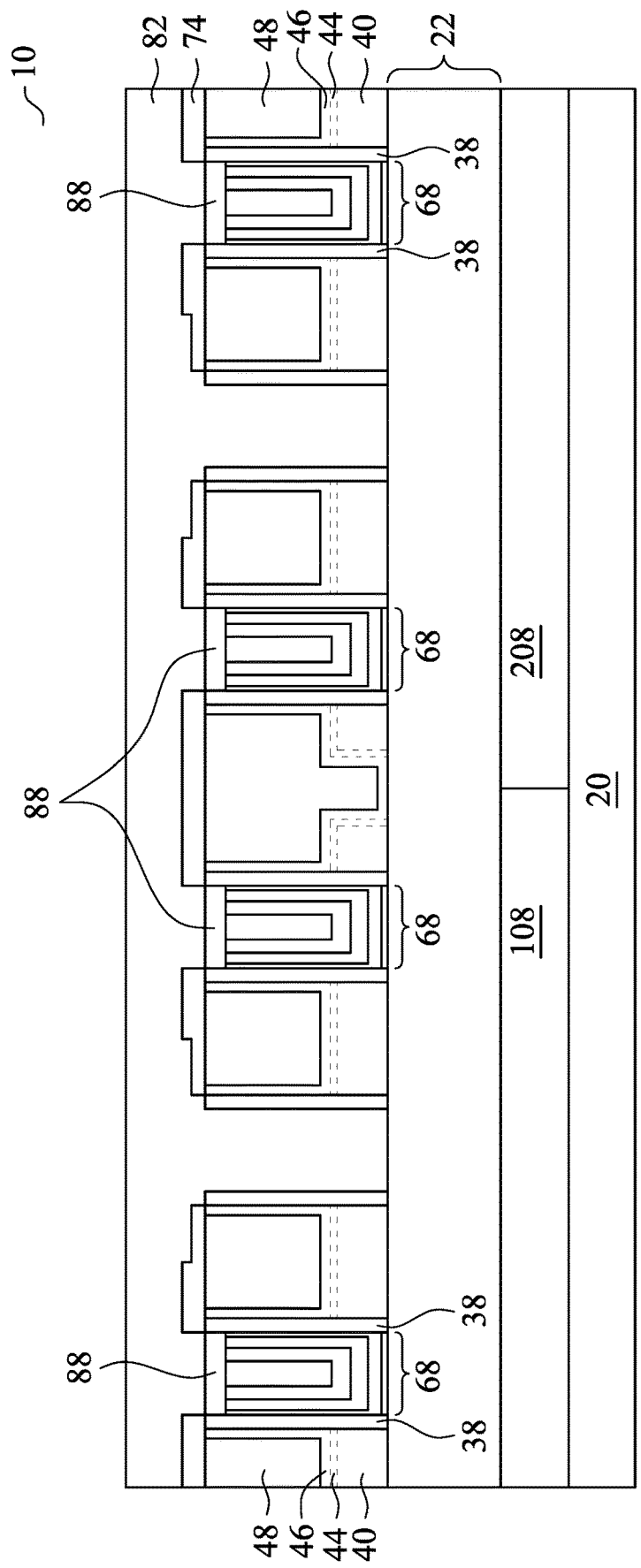

Next, the exposed portions of gate stacks 68 are etched, forming openings 80, as shown in FIG. 40. BARC 77 and the patterned photo resist 83 are then removed. FIG. 41 illustrates the filling of isolation layer 82. In accordance with some embodiments of the present disclosure, isolation layer 82 is in contact with metal layers 88 or inhibitor films 72, depending on whether inhibitor films 72 are removed or not.

Figure 42A:
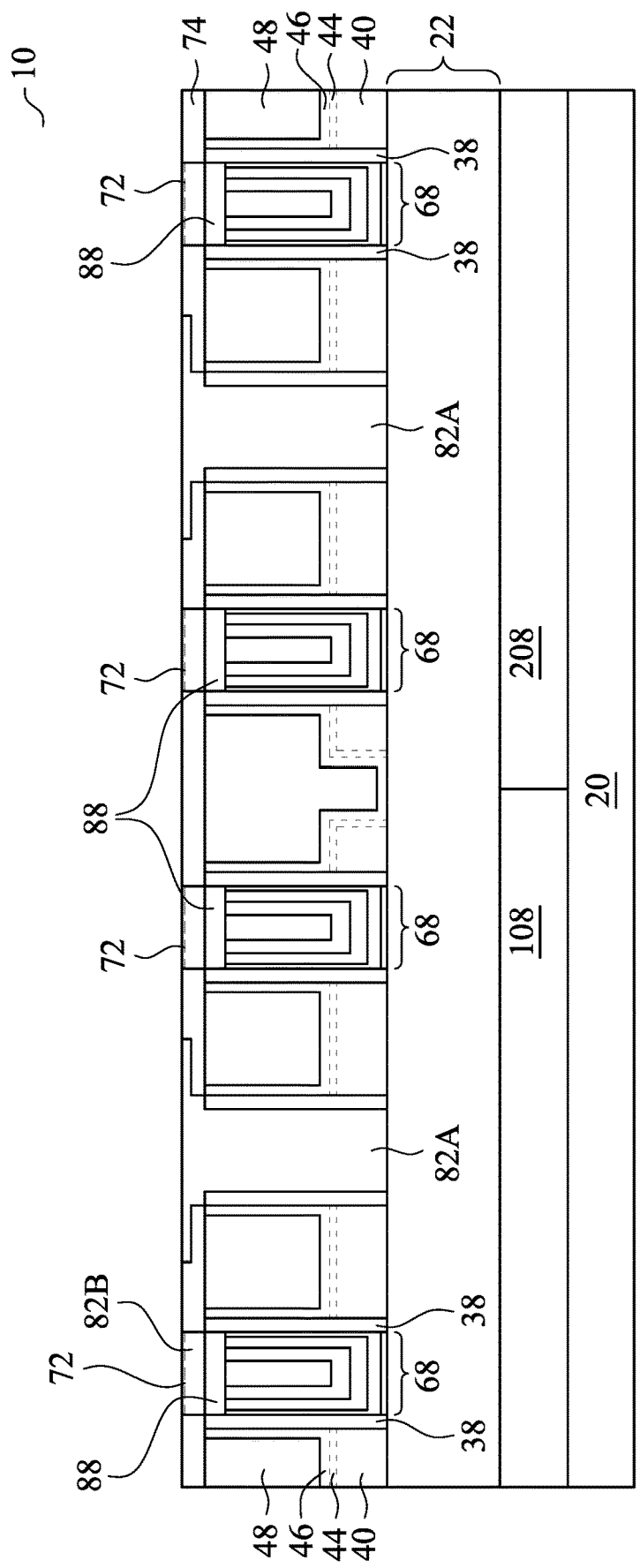

FIG. 42A illustrates the planarization of isolation layer 82, which stops on dielectric hard mask 74. Isolation regions 82A and gate hard masks 82B are thus formed. Gate hard masks 82B may contact inhibitor films 72 (if not removed) or metal layers 88. FIG. 43A illustrates the formation of IMD 84 and contact plugs 86. Contact plugs 86 penetrate through gate hard masks 82B to reach metal layers 88.

Figure 42B:
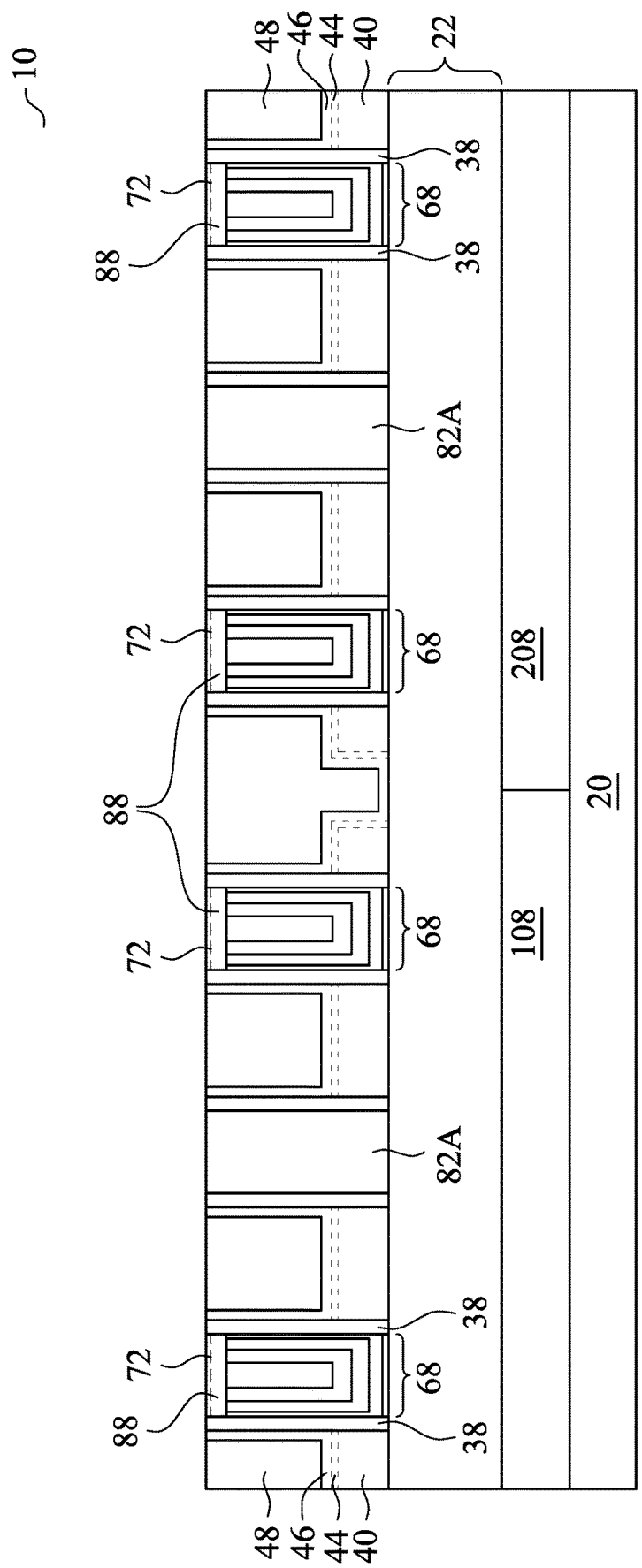
Figure 43B:
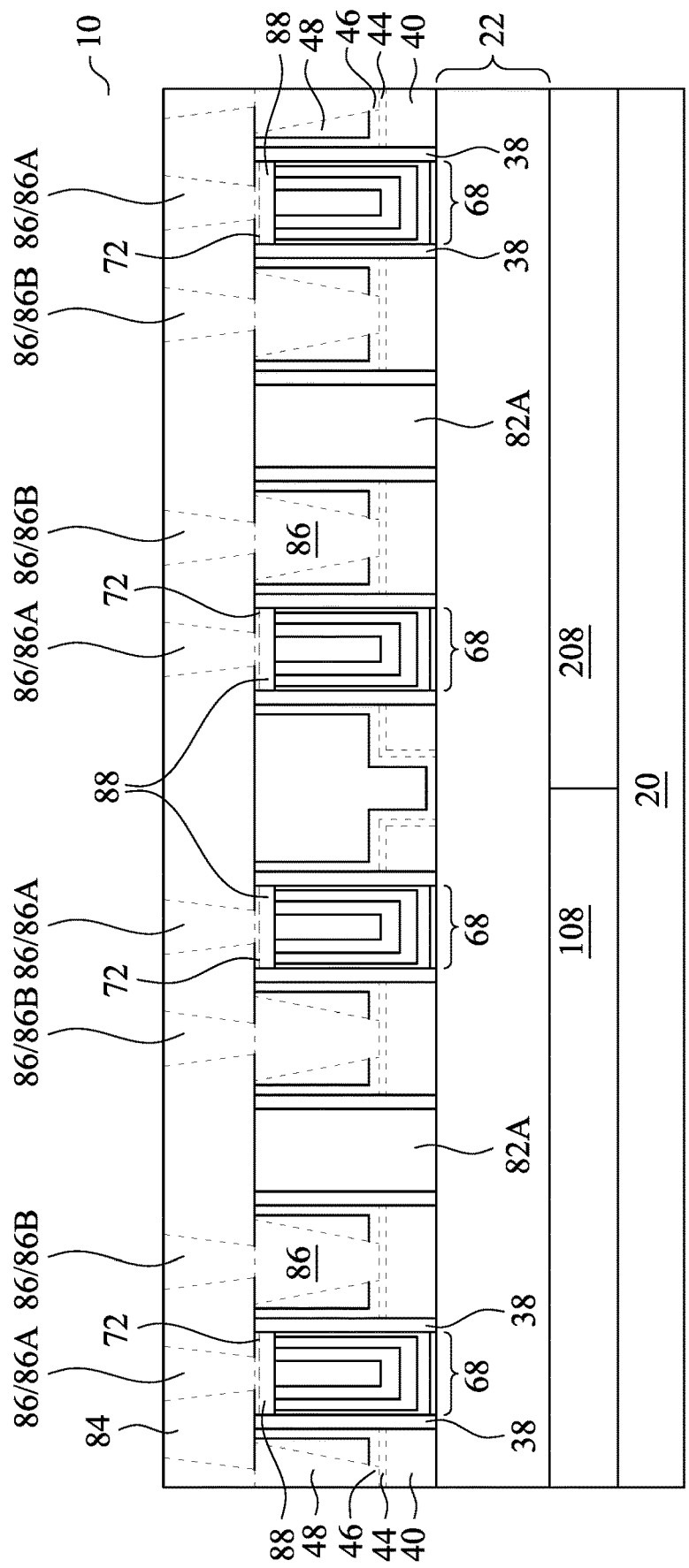

FIG. 42B illustrates the planarization process in accordance with alternative embodiments. Dielectric hard mask 74 as shown in FIG. 41 is fully removed in the planarization process, and ILD 48 is exposed. Accordingly, no dielectric hard mask 74 is left. Furthermore, metal layers 88 or inhibitor films 72 may be exposed. FIG. 43B illustrates the formation of IMD 84 and contact plugs 86.

The embodiments of the present disclosure have some advantageous features. By forming dielectric hard masks to protect ILD, the portions of ILD that otherwise would be exposed to the cut-metal-gate process are protected, and no adverse opening will be formed in the ILD. The dielectric hard masks are selectively formed by forming metal films and/or inhibitor films to prevent the dielectric hard masks from covering the metal gates. The manufacturing cost is thus reduced.

In accordance with some embodiments of the present disclosure, a method includes forming a dummy gate stack extending over a plurality of semiconductor fins; forming gate spacers, with the dummy gate stack being between the gate spacers; forming a contact etch stop layer and an inter-layer dielectric, with the dummy gate stack and the gate spacers being in the contact etch stop layer and the inter-layer dielectric; replacing the dummy gate stack with a replacement gate stack, wherein the replacement gate stack comprises a first portion and a second portion, and a third portion joining the first portion to the second portion; selectively forming a dielectric hard mask over and contacting the inter-layer dielectric, wherein the replacement gate stack is directly underlying a first opening in the dielectric hard mask; etching the third portion of the replacement gate stack to forming a second opening between the gate spacers, wherein the second opening separates the first portion of the replacement gate stack from the second portion of the replacement gate stack; and filling a dielectric material into the opening. In an embodiment, the method includes forming an inhibitor film on the replacement gate stack, wherein the dielectric hard mask is prevented from being formed on the inhibitor film. In an embodiment, the forming the inhibitor film is performed selectively, so that the inhibitor film is formed to overlap the replacement gate stack, and is not formed starting from the inter-layer dielectric. In an embodiment, the forming the inhibitor film comprises forming plasma polymerized fluorocarbon. In accordance with some embodiments, the method includes recessing the third portion of the replacement gate stack before forming the dielectric hard mask. In accordance with some embodiments, the method includes forming a metal layer over and contacting the replacement gate stack using a selective deposition method so that the metal layer is deposited on the replacement gate stack, and is not deposited starting from the inter-layer dielectric. In accordance with some embodiments, the method includes forming a patterned photo resist, wherein the third portion of the replacement gate stack is directly underlying an opening in the patterned photo resist, and the etching the third portion of the replacement gate stack is performed through the opening in the patterned photo resist.

In accordance with some embodiments of the present disclosure, a method includes forming a gate stack comprising a gate dielectric and a metal gate electrode over the gate dielectric; forming an inter-layer dielectric on opposite sides of the gate stack; planarizing the gate stack and the inter-layer dielectric; forming an inhibitor film on the gate stack, with at least a portion of the inter-layer dielectric exposed; selectively depositing a dielectric hard mask on the inter-layer dielectric, with the inhibitor film preventing the dielectric hard mask from being formed thereon; and etching to remove a portion of the gate stack, with the dielectric hard mask acting as a portion of a corresponding etching mask. In an embodiment, the method includes, before the portion of the gate stack is removed and after the dielectric hard mask is selectively deposited, removing the inhibitor film. In an embodiment, the method includes filling an isolation layer into an opening left by the removed portion of the gate stack, wherein the isolation layer comprises a portion overlapping and contacting the inhibitor film. In an embodiment, the forming the inhibitor film comprises forming plasma polymerized fluorocarbon. In an embodiment, the forming the plasma polymerized fluorocarbon comprises both fluorine and carbon, and is substantially from additional elements other than fluorine and carbon. In an embodiment, the plasma polymerized fluorocarbon has a carbon percentage between about 30 percent and about 80 percent. In an embodiment, the selectively depositing the dielectric hard mask comprises depositing a material selected from the group consisting essentially of $ZrO_2$, $HfO_2$, $Y_2O_3$, HfZrOx, $HfSiO_x$, zirconium silicate (ZrSiOx), yttrium silicates (YSiOx), HfZrSiOx, $Al_2O_3$, HfAlOx, ZrAlOx, $La_2O_3$, lanthanum silicate (LaSiOx), ZnO, $TiO_2$, and combinations thereof.

In accordance with some embodiments of the present disclosure, a device includes an inter-layer dielectric; a first gate stack and a second gate stack; an isolation region joining the first gate stack to the second gate stack, wherein the first gate stack, the second gate stack, and the isolation region in combination form a combined region; a gate spacer comprising portions on opposite sides of, and contacting edges of, the combined region; a dielectric hard mask comprising portions overlapping the inter-layer dielectric, with the dielectric hard mask being outside of the region directly over the first gate stack and the second gate stack; and a dielectric layer having a bottom surface contacting a top surface of the dielectric hard mask, a top surface of the first gate stack, and a top surface of the second gate stack. In an embodiment, the dielectric hard mask further comprises a portion overlapping the gate spacer. In an embodiment, the dielectric hard mask does not extend directly over the gate spacer. In an embodiment, the device further includes a gate hard mask between the portions of the gate spacer and overlapping the first gate stack, wherein the gate hard mask and the isolation region are formed of a same dielectric material. In an embodiment, the device further includes an inhibitor film overlapping the first gate stack and underlying the gate hard mask, wherein the inhibitor film comprises fluorocarbon. In an embodiment, a carbon percentage in the inhibitor film is in a range between about 30 percent and about 80 percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit device comprising:
   a bulk semiconductor substrate;
   a first semiconductor fin and a second semiconductor fin protruding higher than the bulk semiconductor substrate;
   a dielectric region between the first semiconductor fin and the second semiconductor fin, wherein the dielectric region comprises:
      a contact etch stop layer (CESL); and
      an inter-layer dielectric (ILD) over and contacting a bottom portion of the CESL, wherein the CESL and the ILD are formed of different materials, and wherein the CESL continuously extends from a first level lower than a bottom surface of the ILD to a top surface of the ILD;
   a first Fin Field-Effect Transistor (FinFET) comprising a first gate stack on sidewalls and a top surface of the first semiconductor fin, wherein the first FinFET comprises a first source/drain region contacting a first sidewall of the dielectric region;
   a second FinFET comprising a second gate stack on sidewalls and a top surface of the second semiconductor fin, wherein the second FinFET comprises a second source/drain region contacting a second sidewall of the dielectric region, and wherein the first sidewall and the second sidewall are opposing sidewalls of the dielectric region;
   a dielectric hard mask over and contacting the dielectric region, wherein a first edge of the dielectric hard mask is aligned to a respective second edge of the first gate stack;
   a gate hard mask over and contacting the first gate stack, wherein a third edge of the gate hard mask contacts the first edge of the dielectric hard mask to form a vertical interface; and
   a gate contact plug over and contacting the first gate stack, wherein the gate contact plug penetrates through the gate hard mask.

2. The integrated circuit device of claim 1, further comprising a shallow trench isolation region between the first FinFET and the second FinFET, wherein a first edge of the shallow trench isolation region is vertically aligned to a second edge of the first source/drain region, and a third edge of the shallow trench isolation region is vertically aligned to a fourth edge of the second source/drain region.

3. The integrated circuit device of claim 1, wherein the dielectric region comprises an upper portion higher than a bottom surface of the first source/drain region, and a lower portion lower than the upper portion, wherein edges of the lower portion are more slanted than corresponding overlying edges of the upper portion.

4. The integrated circuit device of claim 1, wherein both of the first FinFET and the second FinFET are p-type FinFETs.

5. The integrated circuit device of claim 1, further comprising a gate spacer on a sidewall of the first gate stack, wherein the dielectric hard mask further comprises a portion overlapping the gate spacer.

6. The integrated circuit device of claim 5, wherein the dielectric hard mask is in physical contact with the gate spacer.

7. The integrated circuit device of claim 1, wherein the dielectric region comprises a lower portion and an upper portion over and continuously joined with the lower portion, wherein the upper portion is wider than the lower portion.

8. The integrated circuit device of claim 1, further comprising a shallow trench isolation underlying and contacting the dielectric region.

9. The integrated circuit device of claim 1, wherein top surfaces of the gate hard mask and the dielectric hard mask are coplanar.

10. The integrated circuit device of claim 1, wherein the dielectric hard mask comprises four edges forming a rectangular shape, with the first edge being one of the four edges.

11. An integrated circuit device comprising:
a first semiconductor fin and a second semiconductor fin;
a first Fin Field-Effect Transistor (FinFET) comprising:
  a first gate stack on the first semiconductor fin;
  an inhibitor film overlapping the first gate stack, wherein the inhibitor film comprises fluorocarbon;
  a gate spacer contacting the first gate stack;
  a first source/drain region on a side of the first gate stack, wherein the first source/drain region comprises:
    a second sidewall contacting the gate spacer; and
    a third sidewall opposing to the second sidewall;
a dielectric region contacting the third sidewall of the first source/drain region; and
a second FinFET comprising a second gate stack on the second semiconductor fin, wherein the second FinFET comprises a second source/drain region, wherein the first source/drain region and the second source/drain region are in contact with opposite sidewalls of the dielectric region.

12. The integrated circuit device of claim 11, further comprises:
a contact etch stop layer (CESL); and
an Inter-Layer Dielectric (ILD) over the CESL, wherein the dielectric region comprises parts of the CESL and the ILD.

13. The integrated circuit device of claim 12, further comprising:
a dielectric hard mask overlapping the ILD; and
an isolation layer overlapping the first gate stack, wherein the isolation layer comprises a first portion lower than the dielectric hard mask, and a second portion in the dielectric hard mask.

14. The integrated circuit device of claim 13, wherein the dielectric hard mask contacts the ILD, and wherein an edge of the dielectric hard mask is aligned to a respective edge of the first gate stack.

15. The integrated circuit device of claim 11, wherein opposite edges of the inhibitor film are vertically aligned to respective edges of the first gate stack.

16. The integrated circuit device of claim 11, wherein the inhibitor film is in physical contact with the first gate stack.

17. An integrated circuit device comprising:
a semiconductor substrate;
a first semiconductor fin protruding higher than the semiconductor substrate;
a second semiconductor fin protruding higher than the semiconductor substrate;
a dielectric region between the first semiconductor fin and the second semiconductor fin;
a first gate stack on the first semiconductor fin, wherein the first gate stack comprises a first sidewall and a second sidewall parallel to each other, and a third sidewall and a fourth sidewall parallel to each other, wherein the first sidewall is perpendicular to the third sidewall;
a dielectric hard mask over and contacting the dielectric region, wherein the dielectric hard mask comprises edges vertically aligned to respective sidewalls among the first sidewall, the second sidewall, the third sidewall, and the fourth sidewall;
a second gate stack on the second semiconductor fin;
a first source/drain region on a side of the first gate stack, wherein the first source/drain region and the first gate stack are comprised in a first transistor; and
a second source/drain region on a side of the second gate stack, wherein the second source/drain region and the second gate stack are comprised in a second transistor.

18. The integrated circuit device of claim 17, further comprising a gate hard mask over and contacting the first gate stack, wherein additional edges of the gate hard mask are vertically aligned to respective sidewalls among the first sidewall, the second sidewall, the third sidewall, and the fourth sidewall.

19. The integrated circuit device of claim 17, wherein the dielectric region comprises a contact etch stop layer, and an inter-layer dielectric over a bottom portion of the contact etch stop layer, wherein the contact etch stop layer continuously extends to a level higher than a top surface of the first gate stack.

20. The integrated circuit device of claim 17, wherein a portion of the dielectric region comprises a shallow trench isolation region.

* * * * *